United States Patent [19]
Moher

[11] Patent Number: 6,161,209
[45] Date of Patent: Dec. 12, 2000

[54] JOINT DETECTOR FOR MULTIPLE CODED DIGITAL SIGNALS

[75] Inventor: Michael I. Moher, Stittsville, Canada

[73] Assignee: Her Majesty the Queen in right of Canada, as represented by the Minister of Industry through the Communications Research Centre, Ottawa, Canada

[21] Appl. No.: 08/827,533

[22] Filed: Mar. 28, 1997

[51] Int. Cl.[7] .......................... H03M 13/00; H03M 13/03
[52] U.S. Cl. .......................... 714/780; 714/746; 714/786; 714/795; 375/262; 375/341
[58] Field of Search .......................... 371/30, 43.1, 43.6, 371/43.7, 43.4; 375/262, 341; 714/746, 786, 794, 795, 792, 780

[56] References Cited

U.S. PATENT DOCUMENTS

| | | | |
|---|---|---|---|
| 5,323,418 | 6/1994 | Ayerst et al. | 375/348 |
| 5,446,747 | 8/1995 | Berrou | 371/45 |
| 5,506,861 | 4/1996 | Bottomley | 375/200 |
| 5,553,062 | 9/1996 | Schiling et al. | 370/479 |
| 5,659,573 | 8/1997 | Bruckert et al. | 375/200 |
| 5,757,767 | 5/1998 | Zehavi | 370/208 |
| 5,757,821 | 5/1998 | Jamal et al. | 371/30 |
| 5,761,237 | 6/1998 | Petersen et al. | 375/200 |

OTHER PUBLICATIONS

Linear Multiuser Detectors for Synchronous Code–Division Multiple–Access Channels Lupus and Verdu, IEEE Transactions on Information Theory, vol. 35 No. 1, Jan. 1989.

Near–Far Resistance of Multiuser Detectors in Asynchronous Channels Lupus and Verdu, IEEE vol. 38. No. 4, Apr. 1990.

Multistage Detection in Asynchronous Code–Division Multiple–Access Communications Varanasi and Aazhang, IEEE Transactions of Communications, Nol. 38, No. 4, Apr. 1990.

Minimum Probability of Error for Asynchronous Gaussian Multiple–Access Channels Verdu, IEEE Transactions Theory, vol. IT–32, No. 1, Jan. 1986.

A Comparison of Optimal and Sub–Optimal MAP Decoding Algorithms Operating in the Log Domain Robertson and Hoeber, IEEE 1995.

Very Low Rate Convulutional Codes for Maximum Theoretical Performance of Spread–Spectrum Multiple–Access Channels Viterbi, IEEE Journal on Selected Areas in Communications, vol. 8, No. 4, May 1990.

Multiuser ML Sequence Estimator for Convolutionally Coded Asynchronous DS–CDMA Systems Giallorenzi and Wilson, IEEE Transactions on Communications, vol. 44, No. 8, Aug. 1996.

Optimal Decoding of Linear Codes for Minimizing Symbol Error Rate Bahl, Cocke, Jelinek and Raviv, IEEE Transactions of Information Theory, Mar. 1974.

A Viterbi Algorithm with Soft Decision Outputs and its application Hagenauer and Hocher, IEEE 1989 pp. 1680–1686.

*Primary Examiner*—Emmanuel L. Moise
*Attorney, Agent, or Firm*—Freedman & Associates

[57] ABSTRACT

A method for the joint detection of multiple coded digital signals that share the same transmission medium in a manner that causes mutual interference. The method is comprised of two steps that are applied to preliminary estimates of each digital signal, one or more times. The first step is to obtain reliability estimates for each data element of each digital signal by combining the preliminary estimates, a statistical model for the interference, and any a priori information regarding the data elements. The second step is to revise these reliability estimates for each digital signal based on the forward error correction code used for that digital signal. When the steps are repeated, the revised reliability estimates from the second step are used as a priori information for the first step.

19 Claims, 61 Drawing Sheets

JOINT DETECTOR FOR MULTIPLE CODED DIGITAL SIGNALS

FIELD OF INVENTION

This invention relates to the joint detection of multiple digital signals that are forward error correction coded and share the same transmission medium in a manner that causes mutual interference. More specifically, the present invention relates to a novel method for detection that allows the permissible interference to be increased and bandwidth to be conserved.

BACKGROUND OF THE INVENTION

In order to maximize the number of signals that can share a transmission medium, the frequency spectrum is re-used in a variety of ways. The traditional approach is to physically isolate communications signals of the same frequency in order to reduce their mutual interference to acceptable levels. Less traditional approaches use spread spectrum techniques to average the effects of interference over a bandwidth significantly greater than the information bandwidth. In both of these cases, interference will exist to some extent and, in some cases, can significantly reduce the system capacity, i.e., the information/unit time/unit bandwidth.

To increase the capacity, joint detection schemes have been proposed that take into account the effect of the interference between the different signals and perform interference cancellation. Examples of such schemes are found in S.Verdú, "Minimum probability of error for asynchronous Gaussian multiple-access channels," *IEEE Trans. Inf. Th.*, vol. 32, No. 1, pp. 85–96, January 1986;

R.Lupas and S. Verdú, "Linear multiuser detectors for synchronous code-division multiple-access channels," *IEEE Trans. Inf. Th.*, vol. 35, No. 1, pp.123–136, January 1989;

R. Lupas and S. Verdú, "Near-far resistance of multiuser detectors in asynchronous channels," *IEEE Trans. Comm.*, vol. 38, No.4, pp.496–508, April 1990;

M. K. Varanasi and B. Aazhang, "Multistage detection in asynchronous code-division multiple access communications," *IEEE Trans. Comm.*, vol. 38, No.4, pp.509–519, April 1990;

D. L. Ayerst et al, U.S. Pat. No. : 5323418, 1994;

D. L. Schilling et al, U.S. Pat. No. : 5553062, 1996;

and include techniques such as applying linear transformations to the received samples to decorrelate the interference, and techniques such as estimating the strongest user first, subtracting it from the received signal and repeating it for the next strongest signal, etc. These techniques work well if the interference does not overwhelm the desired signal at any stage in the processing. Because of the latter constraint, these techniques have generally only been considered for spread spectrum signals. The aforementioned joint detection schemes do not take into account any forward error correction coding of the signals.

To achieve the theoretically optimum capacity when multiple signals share the same transmission medium requires the use of forward error correction coding as is described by T. M. Cover and J. A. Thomas, in *Elements of Information Theory*, New York: Wiley, 1991. Pedagogical techniques for achieving the theoretical capacity suggest applying a different code to each user at the transmitter and, at the receiver, estimating the digital signal with the largest signal to noise ratio (or the strongest code), subtracting its effect and then repeating for the next digital signal; very similar to the techniques which have been proposed for uncoded systems. These techniques require powerful codes that do not lead to a practical implementation. Such a technique, that is "almost practical", has been presented in the literature, for example by A. J. Viterbi, in a paper entitled "Very low rate convolutional codes for maximum theoretical performance of spread-spectrum multiple-access channels", *IEEE J. Sel. Areas Comm.*, vol. 8, no.4, pp.641–649, May 1990, but it has the drawback that it treats the digital signals asymmetrically and requires some co-ordination between transmitters. An alternative approach to joint detection of multiple coded digital signals that is known to be optimum in a maximum likelihood sense for certain types of forward error correction codes, is described by T. R. Giallorenzi and S. G. Wilson, in a paper entitled "Multiuser ML sequence estimator for convolutional coded asynchronous DS-CDMA systems," *IEEE Trans. Comm.*, vol. 44, No. 8, pp.997–1008, August 1996. This latter technique is a Viterbi-like algorithm that has a complexity, which is exponential in both the code memory and the number of digital signals, making it impractical for implementation. There are other approaches to the joint detection of multiple coded signals that are obvious to those practicing the art. These include approaches such as cascading a joint detector for multiple uncoded signals with standard decoding algorithm. These approaches however, are fundamentally limited by the performance of the joint detector for multiple uncoded signals.

Examples of schemes related to and for obtaining reliability estimates from the preliminary estimates are found in H. L. van Trees, *Detection, Estimation and Modulation Theory:Part I*, New York: Wiley, 1968.

Examples of schemes related to soft-output decoding are found in

L. R. Bahl et al, "Optimal decoding of linear codes for minimizing symbol error rate," *IEEE Trans. Inf. Th.*, vol.20, pp284–287, March 1974;

G. Battail, "Coding for the Gaussian channel: the promise of weighted output decoding," *Int. J. Sat. Comm.*, vol.7, pp.183–192, 1989;

J. Hagenauer and P. Hoeher, "A Viterbi algorithm with soft decision outputs and its applications," *Proc. IEEE Globecom*, pp.47.1.1–47.1.7, November 1989;

P. Robertson et al, "A comparison of optimal and suboptimal MAP decoding algorithms operating in the log domain," *Proc. ICC*, pp.1009–1013, Seattle, June 1995.

SUMMARY OF THE INVENTION

It is an object of this invention is to reduce the effects of the interference between a multiplicity of coded digital signals sharing the same transmission medium so as to permit greater interference and conserve bandwidth.

It is a further object to provide a method that does not require asymmetrical treatment of the digital signals.

It is a further object of the invention to provide a method that has a practical implementation.

The present invention provides an iterative method for reliably estimating multiple coded digital signals that share the same medium causing mutual interference. The digital signals, in general, come from different sources but they need not. The method is comprised of two steps that are applied to preliminary estimates of each digital signal, one or more times. There are various known methods of obtaining these preliminary estimates. In many cases, the best approach is to detect each digital signal as if it were the only digital signal present in the transmission medium. The performance of the present invention will depend upon the quality of these preliminary estimates. With regard to the approach taken to obtain these preliminary estimates, the present invention relies only on a statistical model of the interference between these preliminary estimates.

The first step of the method is to provide reliability estimates for each data element of each digital signal using the preliminary estimates, a statistical model for the interference, and any a priori information regarding the data elements. This interference model corresponds to the statistical distribution of the preliminary estimates assuming the transmitted data is known. The reliability estimate is defined as the conditional probability of the data elements given the interference model, the preliminary estimates, and the a priori information. On the first iteration there is often no a priori information and the reliability estimates are based on the preliminary estimate and the interference model. For binary data elements, the resulting reliability estimate is often expressed as the probability that the data element is a "0" or a "1". Properties of the forward error correction coding are not used in this step.

The second step of the method is to revise these reliability estimates for each digital signal based on the forward error correction code used for that digital signal. In the literature, decoders that revise the symbol reliabilities are often called soft-output decoders. The revised probability estimates are the conditional probabilities of the data elements given the reliabilities of all the data elements for that digital signal, and the relationships between them, as defined by the forward error correction code. In this step, the digital signals are independently decoded. This results in a significant computational saving over joint decoding.

The subsequent iterations use the revised reliability estimates for each data element of each digital signal obtained from the second step as a priori information for the first step. This improves the performance of the latter, which in turn can be used to improve the performance of the second step. On the last iteration, the decoders of the second step are configured to produce reliability estimates or hard decisions corresponding to the information elements of those digital signals of interest. The information elements may or may not be explicitly contained in the data elements of each digital signal, but they may be always be estimated through the knowledge of the forward error correction code.

In accordance with the invention, a method is provided of detecting a plurality of digital signals that are forward error correction encoded and mutually interfere. The method comprises the steps of:

a) obtaining preliminary estimates of the plurality of digital signals;

b) calculating a reliability estimate for each data element of each digital signal from preliminary estimates of those data elements, a statistical model of the interference, and a priori information, if any, concerning those data elements;

c) calculating a revised reliability estimate for each data element based on the reliability estimates from the first step and the properties of the forward error correction code for the corresponding digital signal; and d) repeating the previous two steps, one or more times, using the revised reliability estimates provided by step (c) as a priori information for step (b).

In accordance to another aspect of the invention, a system is provided of detecting a plurality of digital signals that are forward error correction encoded and mutually interfere, given preliminary estimates of those signals, comprising: means for calculating a reliability estimate for each data element of each digital signal in dependence upon the preliminary estimates of those data elements, a statistical model of the interference, and a priori information, if any, concerning those data elements; and, for calculating a revised reliability estimate for each data element based on the reliability estimates calculated and the properties of the forward error correction code for the corresponding digital signal.

The present invention can be applied to digital signals in any shared transmission medium, or in distinct transmission media where there is crosstalk between the media.

BRIEF DESCRIPTION OF THE DRAWINGS

Exemplary embodiments of the invention will now be described in conjunction with the drawings, in which.

DETAILED DESCRIPTION

Figure 1:
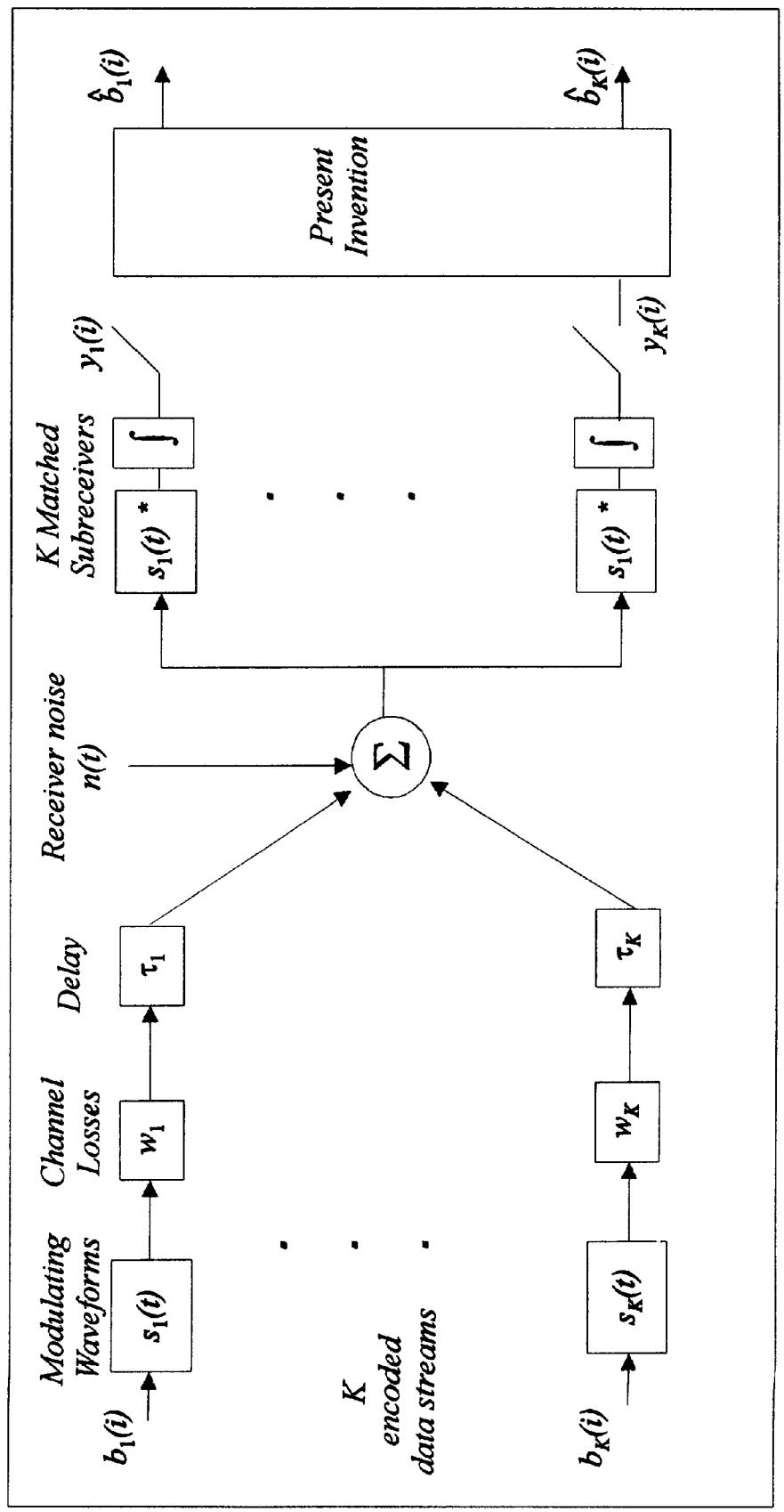
FIG. 1 is schematic block diagram of a communication system to which the present invention can be applied.

The present invention is a method of processing the received signal samples obtained when multiple coded signals share the same transmission medium. An example of a communications system to which this invention can be applied is illustrated in FIG. 1. In this example, each of the K independent data sequences $\{b_k(i): k=1 \ldots K, i=1, \ldots\}$ are modulated with a signaling waveform to produce a digital signal. These signaling waveforms may include filtering, frequency translations, spreading codes, etc. The signaling waveforms need not he unique. These signals then enter the transmission medium and may suffer corresponding delays and attenuation, and be degraded by noise. In this example, the communications receiver has K parallel subreceivers, one for each digital signal. These subreceivers provide preliminary estimates of the data elements of each digital signal. These preliminary estimates are often called soft decisions in the technical literature. In many cases, the best subreceiver is one that is matched to the signaling waveform for the corresponding digital signal, ignoring the presence of the other digital signals. This matching refers not only to the transmitted signaling waveform but also any delay, frequency translation, or phase rotation that may have been incidentally applied to the signal after transmission. The present invention also applies to non-optimum subreceivers. The output of these matched detectors is then sampled, once per data element period, to produce a soft decision for each data element in the corresponding digital signal.

Figure 2:
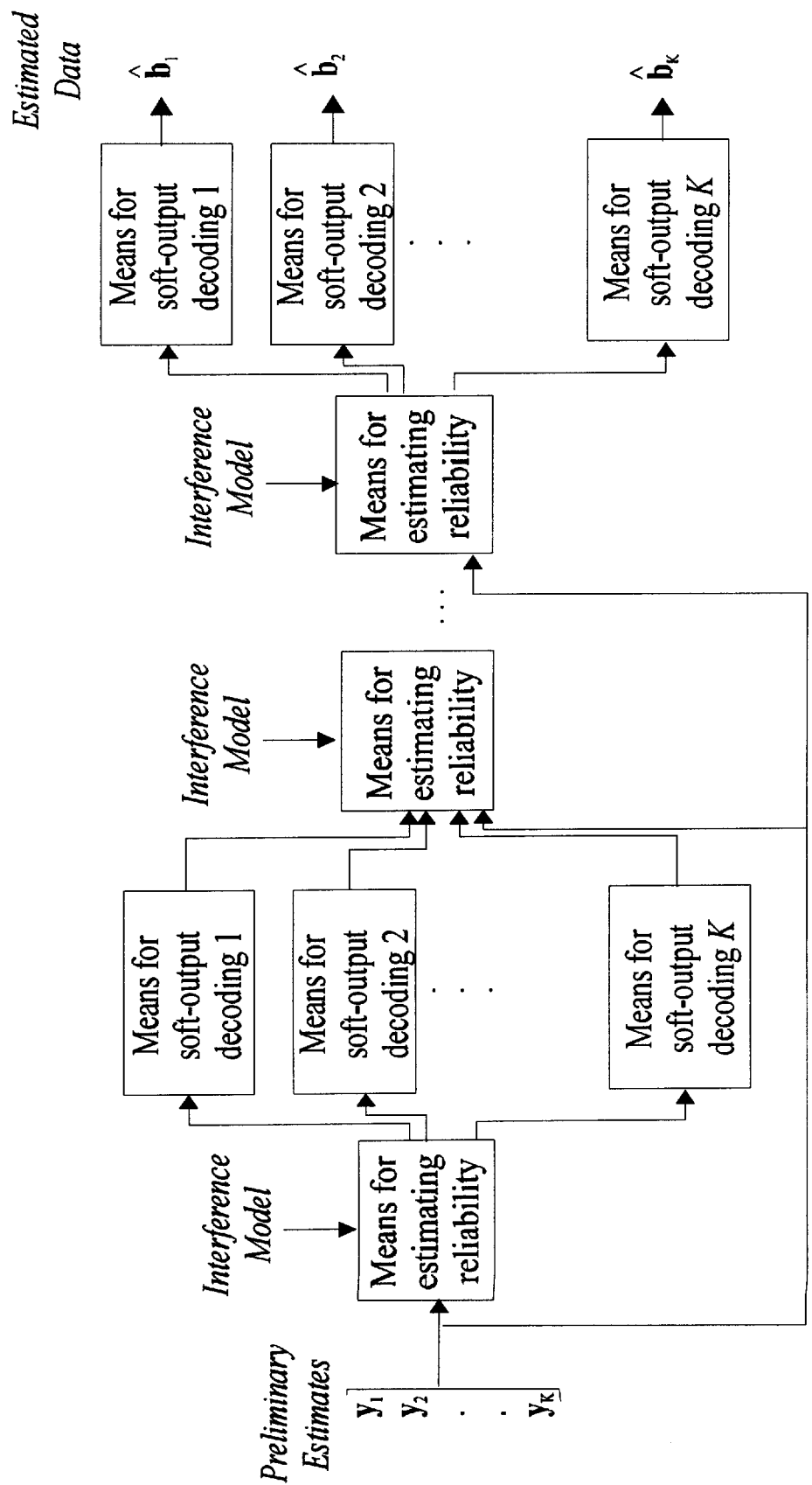
FIG. 2 is a schematic block diagram of an iterative joint detector for multiple decoded signals.

The present invention is a method of processing the preliminary estimates provided by these K subreceivers to reduce the effects of interference. An exemplary arrangement for the processing performed in the present invention is shown in FIG. 2. In the simplest embodiment for this invention, the digital signals have the same signaling rate and are synchronous. Let b(i) be the vector of K symbols, one from each digital signal, with a common symbol time i, and let y(i) be the corresponding vector of K preliminary estimates from the K subreceivers. The statistical model for the interference, in this case, is the conditional distribution of y(i) given the transmitted data b(i). If the noise is Gaussian then, in this case, the conditional distribution of y(i) given b(i) is multivariate Gaussian for the symbol time i and independent from one symbol time to the next.

The first step of the invention requires a means for estimating reliability of the data elements of each of the digital signals. The conventional approach is to use Bayes' rule for conditional probability, one then computes the reliability estimate (conditional probability) of each data element of each digital signal that is based only on the vector of preliminary estimates y(i), the statistical model for the interference, and the a priori information regarding those data elements. Mathematically, joint reliability estimates for the K digital signals is given by $$\Pr[b(i) | y(i)] = \frac{p[y(i) | b(i)]\Pr[b(i)]}{p[y(i)]} \quad (1)$$

Figure 3:
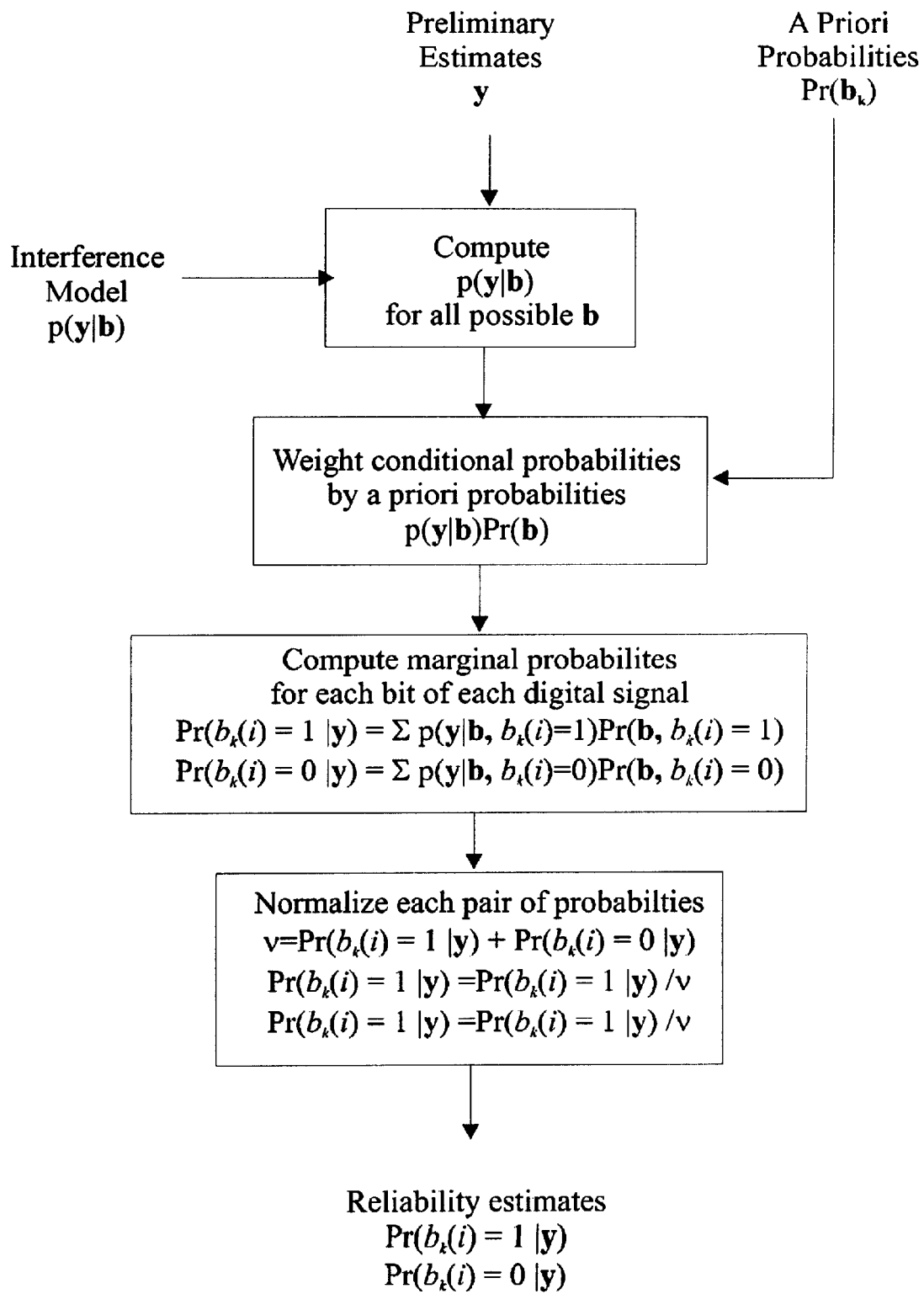
FIG. 3 is flow chart of the steps required for obtaining reliability estimates.

The reliability estimates for the individual digital signals are given by the corresponding marginal distributions. This constitutes the first step. Exemplary steps for determining these reliability estimators are shown in FIG. 3.

In the second step of the method, each digital signal is considered independent of the others. As shown in FIG. 2, this can be implemented as K parallel decoders. For each digital signal, the reliability estimates provided by the first step are revised based on the known relationships between data elements. These known relationships are due to the forward error correction encoding. When the data sequences are finite, a preferred means for soft-output decoding is described by L. R. Bahl, J. Cocke, F. Jelinek, and J. Raviv, in a paper entitled "Optimal decoding of linear codes for minimizing symbol error rate," IEEE Trans. Inf. Th., vol. 20, pp.284–287, March 1974.

In subsequent iterations, the revised reliability estimates provided by the second step are used as a priori probabilities in the first step. In the preferred embodiment, the revised reliability estimates are treated as independent of one another; and in the preferred embodiment, not all of the revised reliability estimates provided by the second step first stage are used in each first step calculation. In particular, the first step reliability estimates for a particular digital signal only use the a priori information for those digital signals other than the one of interest.

Figure 4:
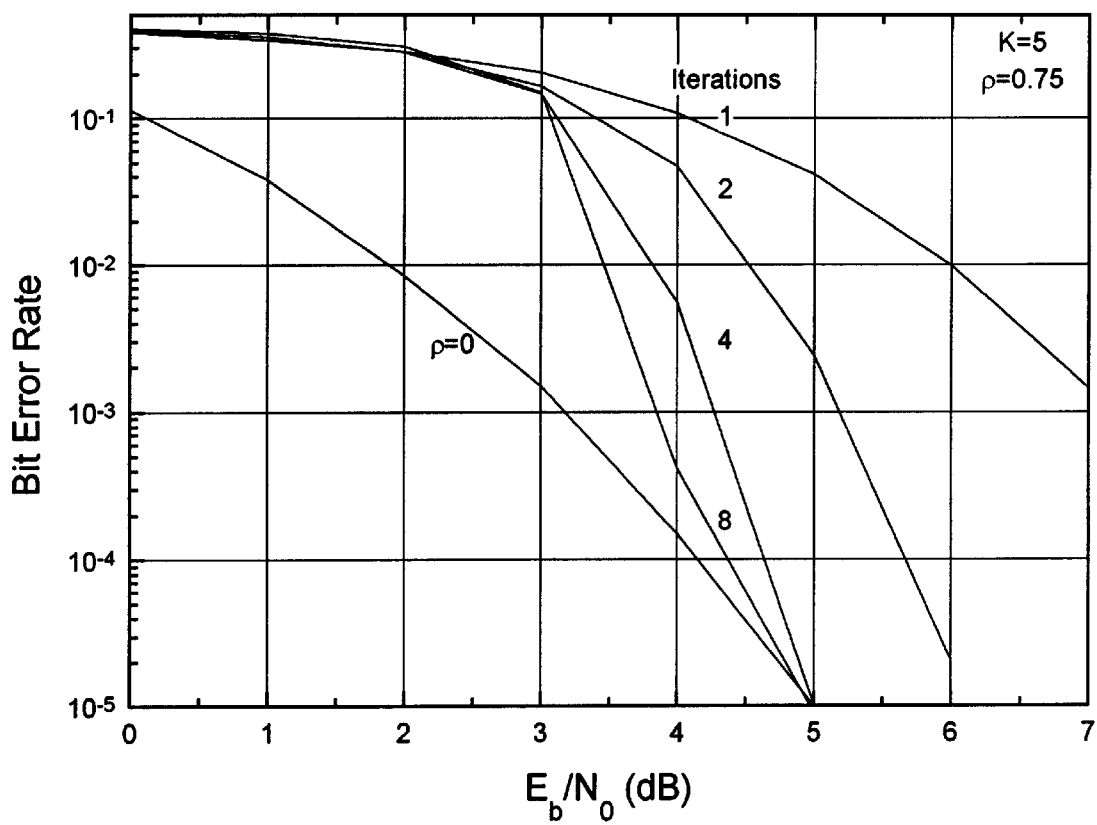
FIG. 4 is a graph illustrating performance of present invention in a synchronous Gaussian channel for the case of five digital signals with a pairwise correlation of 0.75.

An example of the bit error rate performance obtained with this method for the case of a synchronous Gaussian channel with five independent pseudo-randomly interleaved digital signals, when the cross-correlation between each pair of the signaling waveforms (a measure of the interference) is 0.75, is shown in FIG. 4 for 1, 2, 4, and 8 iterations. Also shown in FIG. 4 is the performance obtained when there is no interference between the users ($\rho=0$).

Investigations have shown that performance improves if each of the K digital signals is pseudo-randomly interleaved relative to one another at the transmitter after forward error correction encoding. In the description of the present invention, the interleaving is considered part of the forward error correction code. However, the approach can be applied with any type of interleaving, or even with no interleaving.

The present invention does not require that the digital signals are synchronous. However, it is recommended that the interference model for the preliminary estimates include the effects of any asynchronism. The complexity of the present invention depends in part on the complexity of this interference model. There is the possibility of reducing the complexity by appropriate design of the K subreceivers. If the digital signals are not only asynchronous but also have different signaling rates then to optimize performance may require oversampling of the received signal, and constructing a corresponding interference model. Oversampling is defined as sampling at a rate higher than the transmission rate of the data elements.

The present invention does not require that all data sequences use the same forward error correction code. The use of different error correction codes will only affect the second step of the method. If the digital signals are asynchronous or the data sequences have different lengths then the direct implementation of the soft decoding method of L. R. Bahl et al, may not be appropriate. Alternatively, in this case and others where the sequence length is an issue, the soft decoding techniques can be applied to a series of overlapping blocks where the block size is less than the sequence length. In addition to L. R. Bahl et al. there are alternative soft decoding techniques as presented by J. Hagenaur and P. Hoeher, in a paper entitled "A Viterbi algorithm with soft-decision outputs and its applications", Proc. IEEE Globecoin'89, pp.47.1.1–47.1.7, November, 1989. [and by P. Robertson et al, in a paper entitled "A comparison of optimal and sub-optimal MAP decoding algorithms operating in the log domain," Proc. ICC'95, pp.1009–1013, June 1995, that can also be used in the second step of the method.

The digital signals are not required to have the same modulation format. There are no particular issues associated with different modulation formats except to note that in the exemplary communications shown in FIG. 1, the sampling will correspond to sampling both the in phase and quadrature components of a digital signal with some modulation formats. With a binary modulation format, only the reliability of the data element "1" or a "0", but not both, needs to be stored; while with a M-ary modulation formats, at least M-1 or M reliability values should be stored corresponding to the M possible values for each data element.

The invention also applies when the digital signals have the same, different, or even time-varying power levels. The latter may be due to different propagation losses, fading and multi-path. For the best performance the available knowledge concerning the power levels and time-variations, whether it be deterministic or statistical, should be included in the interference model.

Complexity may often be an issue in either the first or the second step of the method. Sometimes, in the first step, simplifications are made to the interference model to reduce this complexity. These simplifications often result from a consideration of a subset of the available data in the model. For example, for each digital signal, the interference model may only consider the interference from the two strongest interferers and ignore the effects of the other signals. Similarly, in addition to the block processing approach mentioned above, in the second step simplifications can often be made to the decoding technique to reduce the complexity. These simplifications often result from considering only a subset of the available data. For example, some simplified decoding techniques only consider the most probable sequences (paths) at each step and ignore the less probable ones. In practice, there is usually a tradeoff between complexity and performance.

The parallel implementation shown in FIG. 2 is one implementation of this invention; however, the invention can also be implemented serially. In particular, one need not decode all K signals in the second step. It is only necessary to decode a subset of the digital signals, containing at least one signal, in the second step before repeating the first step. This approach may be appropriate when a subset of the signals has significantly greater power, and it is desirable to characterize their effect accurately first. Such an approach affects the convergence time of the algorithm.

Figure 8:
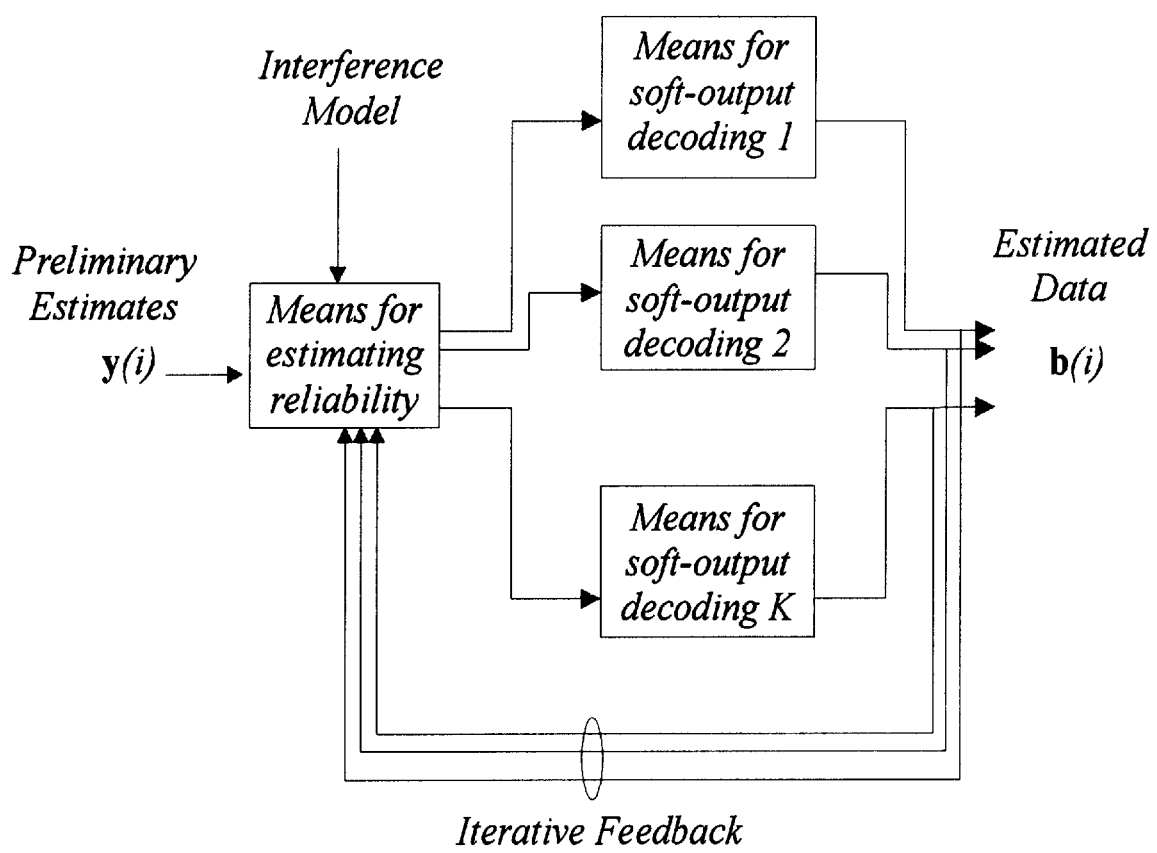
FIG. 8 is a block diagram illustrating a feedback arrangement for implementing each iteration of the method.

Referring now to FIG. 8, the invention does not need to be implemented with distinct hardware or software for each iteration of the method as may be suggested by FIG. 2.

One can also use the same hardware or software in a feedback arrangement, as is more obviously suggested by FIG. 8, for implementing each iteration of the method, wherein the revised reliability estimates are fed back to the initial means for estimating reliability, and the two steps of the algorithm are repeated. This feedback implementation can also be applied to all embodiments of the method. In practice, the approach illustrated in FIG. 8 may require some buffering of the incoming preliminary estimates.

Figure 5:
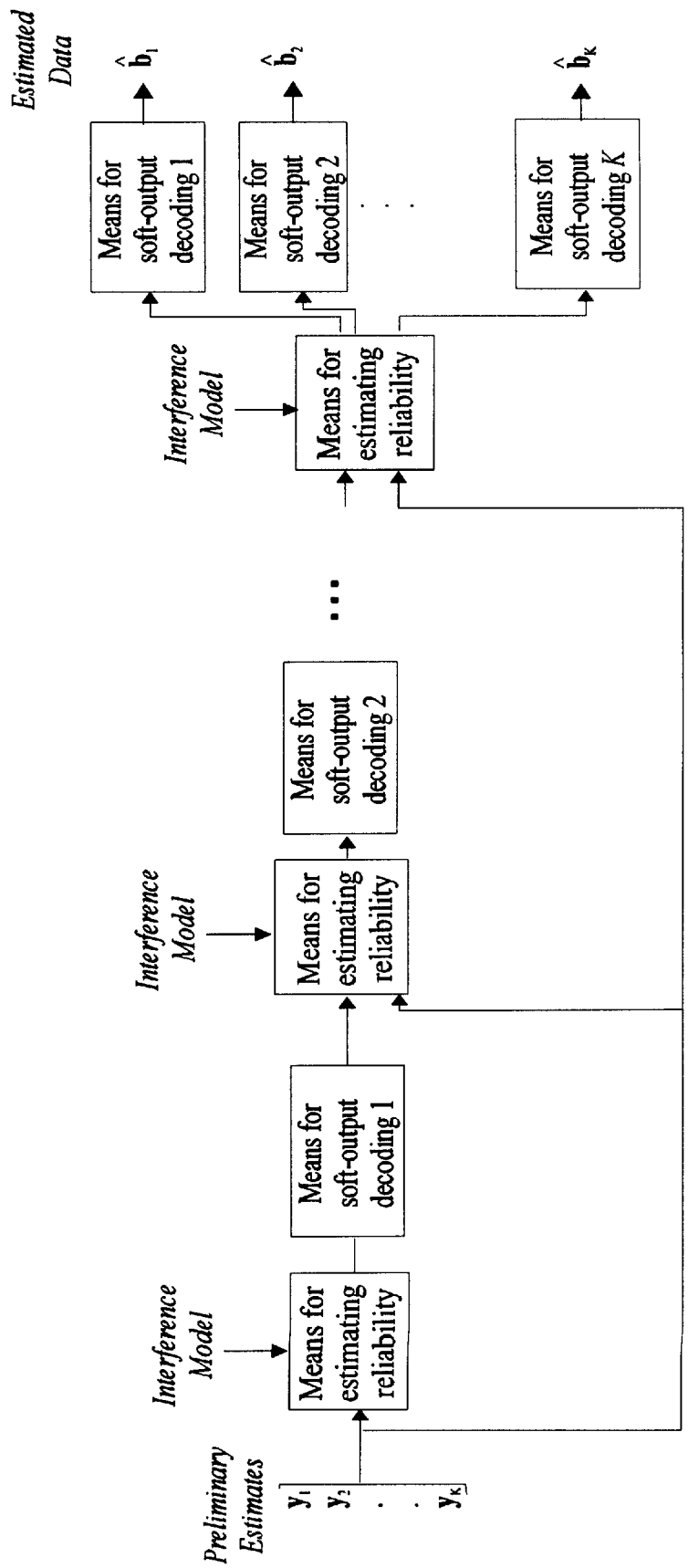
FIG. 5 is a block diagram illustrating a serial implementation of this invention.
Figure 6:
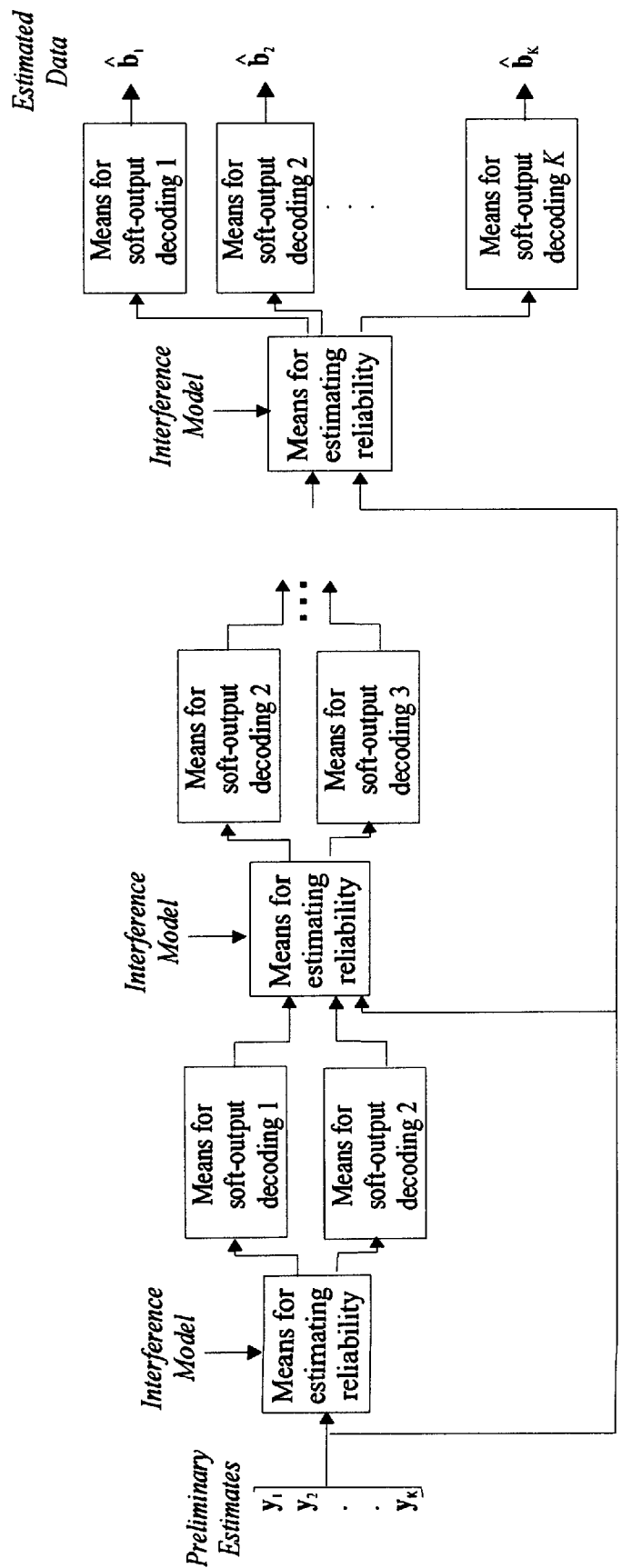
FIG. 6 is a block diagram illustrating an alternative serial implementation to that shown in FIG. 5.

In FIG. 5, a serial implementation is shown that decodes only one signal at the second step, selecting a different one of the K digital signals for each second step. According to the invention, any number from one to all of the K digital signals is decoded on execution of the second step. The signals need not be decoded in any particular order, nor do all signals have to be decoded an equal number of times. An alternative serial implementation is shown in FIG. 6. In this case, two decodings are performed with each second step but the decoded digital signals are not distinct on subsequent decodings. In FIGS. 2, 5, and 6, the phrase "Means for soft-output decoding k" indicates a means for soft-output decoding of digital signal k.

Note that any existing interference cancellation method for uncoded signals can be applied, prior to this invention, to provide the preliminary estimates. The only requirement is that the interference model applies to the preliminary estimates after the initial interference cancellation, if any, is done.

The invention is also applicable when there are multiple preliminary estimates of the signal such as may occur when one has a number of distinct receivers. This is known in the literature as diversity reception. There are a number of ways to use the multiple preliminary estimates according to the invention. The simplest approach is using a means of combining the multiple estimates into a single estimate prior to this invention. This is illustrated in FIG. 6.

Figure 7:
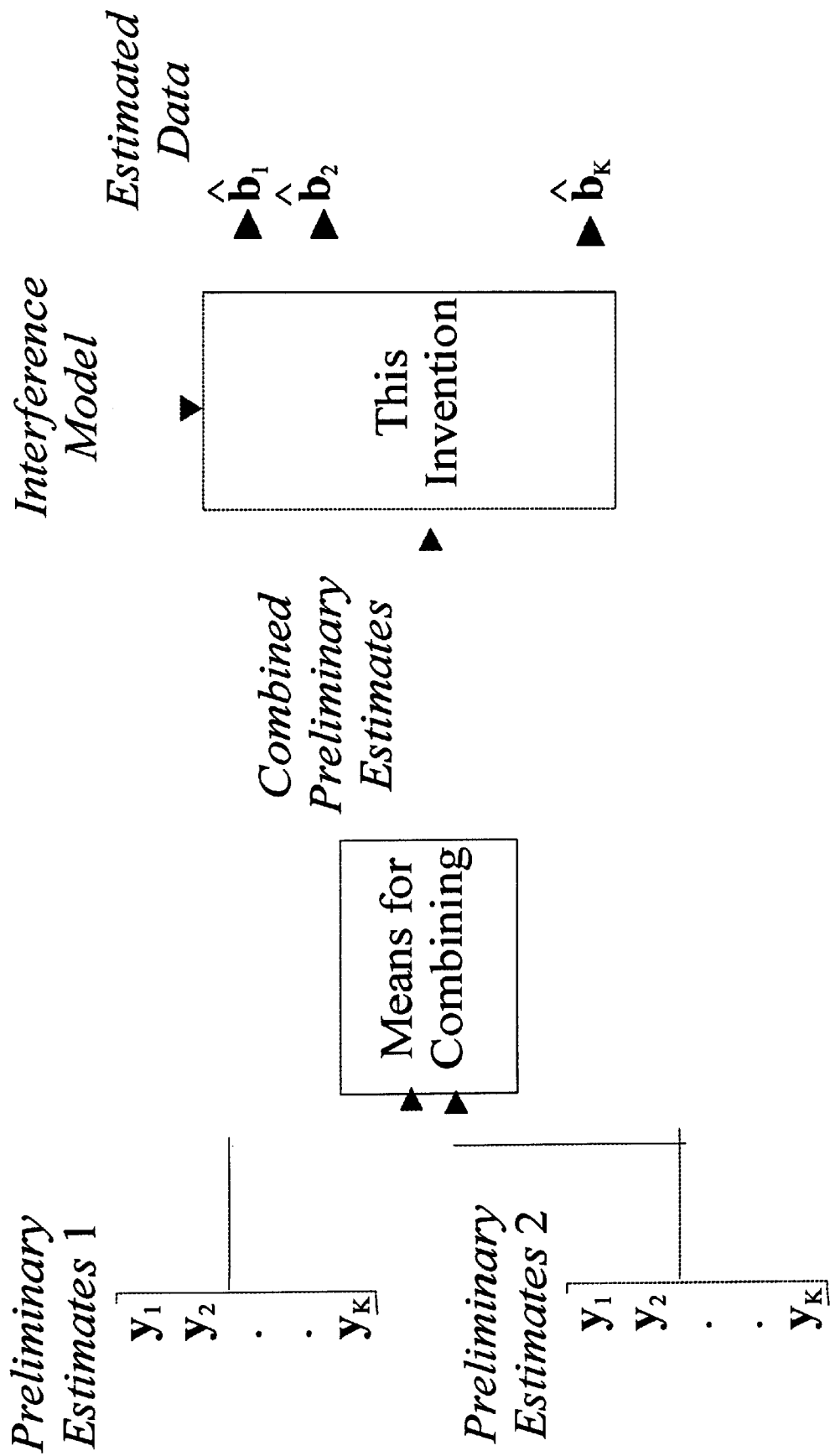
FIG. 7 is a block diagram illustrating the use of multiple preliminary estimates, in accordance with this invention.

There are many methods in the literature for combining a plurality of estimates of the same signal or set of signals. Examples of such combining schemes can be found in W. C. Jakes (ed.), Microwave Mobile Communications, (1974) reprinted by New York: IEEE Press, 1993 .As shown in FIG. 7, the method remains unchanged in this application. An alternative to the approach shown in FIG. 7 is to include the multiple preliminary estimates in the interference model. In this case, the method remains the same although the means for calculating the reliability estimates may change.

An exemplary embodiment is presented below in detail. This is merely an example and is not intended to limit the scope of the above-described invention. In the embodiment described below, the following abbreviations, when used, have the associated meanings:

| | |
|---|---|
| $(.)^H$ | Hermitian transpose |
| $(.)^T$ | transpose |
| $\lceil \alpha \rceil$ | smallest integer equal to or larger than a |
| $\lfloor \alpha \rfloor$ | largest integer less than or equal to a |
| $\binom{m}{n}$ | number of combinations of n objects taken m at a time |
| $|.|$ | absolute value of a scalar, determinant of a matrix, or cardinality of a set |
| $\|a\|$ | $L^1$ norm of a positive vector: $\|\alpha\| = \Sigma\alpha(m)$ |
| $\alpha m(t)$ | forward state probability for state m at time t |
| $\beta m(t)$ | backward state probability for state m at time t |
| $\gamma$ | signal to noise ratio |
| $\gamma m,m'(t)$ | probability of transition from state m to m' at time t |
| $\Gamma(t)$ | the matrix of $\gamma_{m,m'}(t)$ |
| $\lambda m(t)$ | the state probability for state m at time t |
| $\Lambda(x)$ | sum of intrinsic and extrinsic information for x |
| $\Lambda(x)$ | extrinsic information for x |
| $\rho$ | cross-correlation between user modulating waveforms |
| $\psi$ | crosstalk between users |
| $\sigma^2$ | noise variance |
| $\zeta$ | noisy parity bits |
| $A_C(X,Z)$ | weight enumerating function for the code $]C]$ with systematic bits X and parity bits Z |
| b | the codeword bits b$\in]B]$; K-dimensional codeword bits b$\in]B]^K$ |
| $]B]$ | space of binary N-tuples : $\{-1,+1\}^N$ |
| $]S](.)$ | theoretical channel capacity |
| $d_{free}$ | minimum distance of a forward error correction code |
| $D_g$ | diversity gain |
| $E[X]$ | expected value of random variable x |
| $E_b/N_O$ | energy per information bit to noise density ratio |
| $E_s/N_O$ | energy per channel bit to noise density ratio |
| H | cross-correlation matrix for multiple users |
| $H(x)$ | entropy of the random variable x |
| $H[p,q]$ | cross-entropy of the two probability distributions p and q |
| $]I](X;Y)$ | the mutual information between random variables X and Y |
| $I_C(X)$ | indicator function for the variable x in the set C |
| J | the number of information bits in a codeword |
| $L(x)$ | log-likelihood ratio for the binary random variable x |
| K | number of simultaneous users of a multiple access channel |
| M | number of states in a trellis; number of constraint subsets |
| N | the number of channel bits in a codeword |

-continued

| | |
|---|---|
| $P_e$ | probability of bit error |
| Pr[X] | probability distribution function for the random variable x |
| p[X] | probability density function for the random variable x |
| Q(X) | Gaussian error function: $Q(x) = \frac{1}{2}\,\text{erfc}(\sqrt{x})$ |
| $\rfloor R \rfloor$ | the real numbers |
| s(t) | state of a trellis at time |
| S(b,t) | multiuser waveform at time t for K-user channel sequence b |
| T | the number of symbols in a codeword; the symbol period |
| u | noisy systematic bits in received codeword |
| v | the transmitted codeword - symbol representation |
| $\rfloor V \rfloor$ | the symbol alphabet |
| w | the noisy received codeword - symbol representation |
| W | diagonal matrix of multiuser channel gains |
| x | the systematic bits of a codeword |
| $x_{[1,N]}$ | the sequence $\{x(1), x(2),...,x(N)\}$ |
| y | the noisy received codeword - bit representation |
| z | the parity bits of a systematic codeword |
| $\rfloor Z \rfloor$ | the integers |
| AWGN | additive white Gaussian noise |
| BCJR | Bahl, Cocke, Jelinek, and Raviv |
| BER | bit error rate |
| BSC | binary symmetric channel |
| CDMA | code division multiple access |
| FDMA | frequency division multiple access |
| FEC | forward error correction |
| HD | hard decision |
| LSB | least significant bit |
| MAP | maximum a posteriori |
| MCE | minimum cross-entropy |
| MLSE | maximum likelihood sequence estimation |
| MUD | multiuser detection |
| SNR | signal to noise ratio |
| SPC | single parity check |
| WEF | weight enumerating function |

Figure 9:
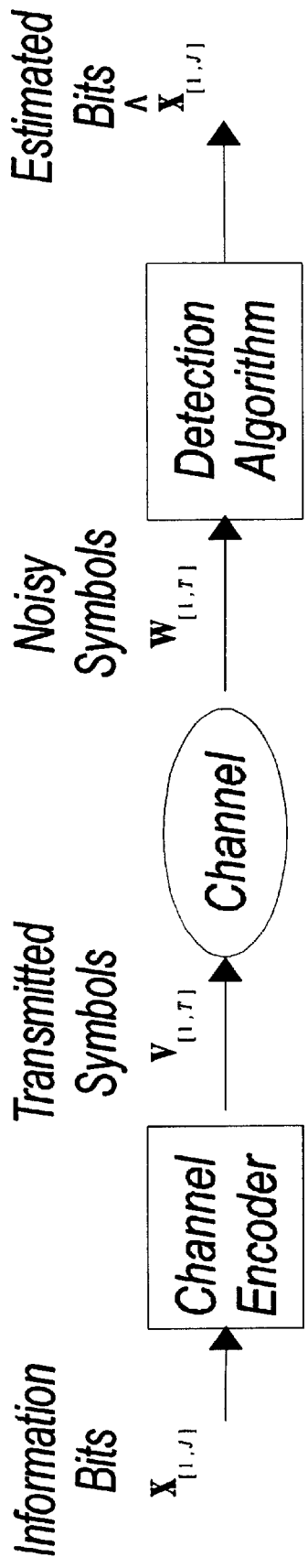
FIG. 9 is a simplified diagram of a system where $x=x_{[1,J]}$ is the information (data) to be transmitted and $\hat{x}$ are the corresponding data estimates.

A trellis structure is a requirement of both the BCJR and the Viterbi algorithm still providing a rich collection of codes upon which to draw. A simplified system, such as that shown in FIG. 9 where $x=x_{[1,J]}$ is the information (data) to be transmitted and $\hat{x}$ are the corresponding data estimates, is described. The transmitted codeword is represented by $b=b_{[1,N]}$. For simplicity bipolar transmission will be assumed, that is $b \in B = \{-1,+1\}^N$. The transmitted bits will be grouped together into T symbols, $v_{[1,T]}$. This grouping arises naturally from the code structure. For example, with a rate ½ code, T is N/2. The noisy received bits will be denoted by $y=y_{[1,N]}$ and the corresponding received symbols by $w_{[1,T]}$. The detection algorithm provides an estimate $\hat{x}$ of the data based on the sequence y (or w) and knowledge of the FEC code. Initially, the channel is assumed to be the additive white Gaussian noise channel.

Figure 10:
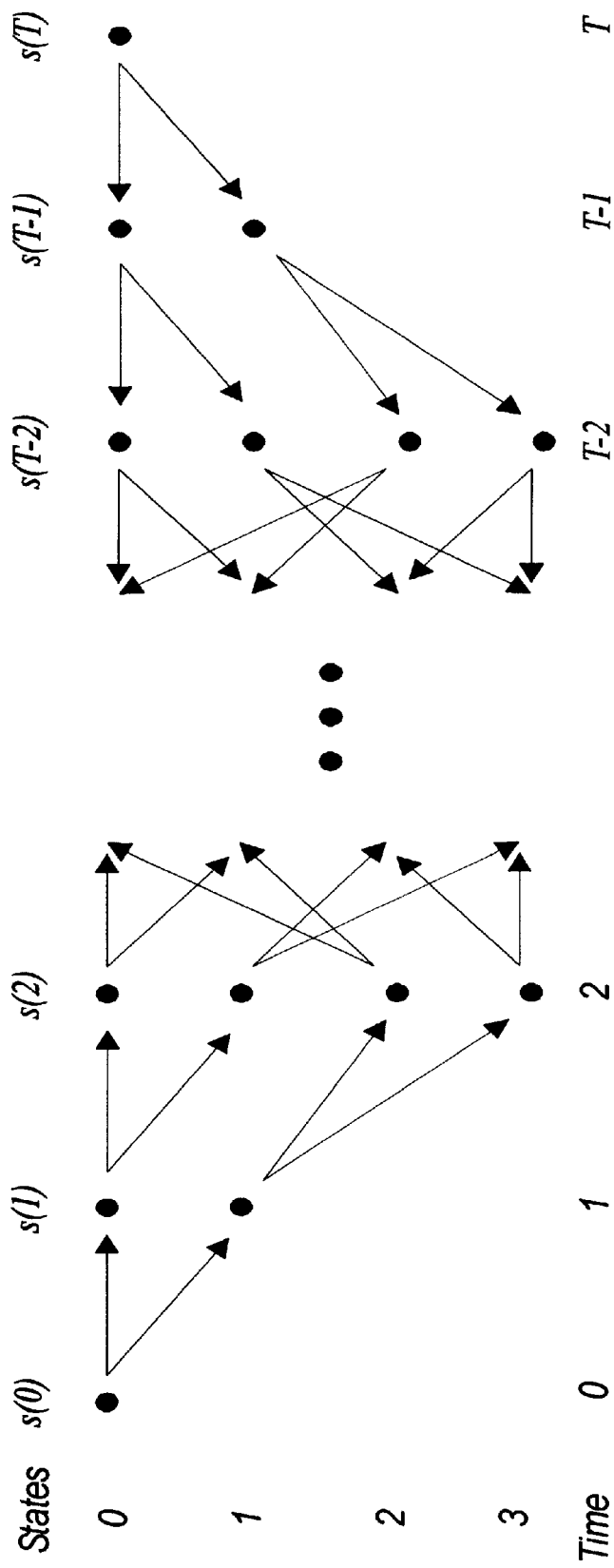
FIG. 10 is a diagram of a trellis structure for four-states.

The channel encoder is assumed to have a trellis structure such as that illustrated in FIG. 10 for four-states. It is assumed that the trellis starts and ends in the zero state, and that the appropriate null bits are added to the information stream to insure proper termination of the trellis. In general, it is assumed that the block lengths are long enough to make the effect of truncation on the code properties negligible.

The number of trellis transitions, T, corresponding to the N codebits is a function of the encoding strategy. Its relationship to the index of the channel bits or the information bits will depend upon the code rate and how the trellis is truncated. Each channel symbol, v(t), corresponds to a state transition from s(t–1) to s(t). For example with a rate ⅔ binary convolutional code, each channel symbol will have three bits and each pair of information bits will correspond to a state transition until one reaches the termination stage. In the termination stage, "0" information bits are appended to the input and the corresponding channel symbols are generated until the trellis returns to the all-zero state.

With MLSE, the objective is to determine that x which maximizes the conditional probability Pr[x|y]. For the case of a memoryless AWGN channel, this conditional probability is a product of independent Gaussian distributions, and this maximization algorithm can be solved by the Viterbi algorithm [Pro89]. The Viterbi algorithm is a maximum-likelihood decoder which minimizes the probability of codeword or sequence error. It does not, necessarily, minimize the probability of symbol or bit error.

With MAP detection the objective is to estimate a symbol based on the conditional probability Pr[x(j)|y]. This minimizes the probability of bit error and these probabilities are determinable by means of the BCJR algorithm as outlined in L. R. Bahl, J. Cocke, F. Jelinek, and J. Raviv, "Optimal decoding of linear codes for minimizing symbol error rate," IEEE Trans. Inf. Th., vol. 20, pp.284–287, March 1974 herein incorporated by reference.

The BCJR algorithm is an optimal decoder which minimizes the symbol error probability for linear codes transmitted over a discrete memoryless channel (DMC). The BCJR algorithm can provide the probabilities: Pr[x(j)|y], Pr[b(n)|y], and Pr[v(t)|y] for the information bits, channel bits, and channel symbols, respectively; and minimizes the corresponding probability of error when one makes a decision based on these probabilities. The algorithm includes a backward and forward recursion unlike the Viterbi algorithm, which only contains a forward recursion. Below, a modified but equivalent version of this algorithm is presented. The modifications are two-fold; the first changes the quantities to which the recursion are applied to make them more amenable to analysis and also make them symmetric in the backward and forward direction; the second extends the results to cover the memoryless Gaussian channel.

The fundamental assumption of the BCJR algorithm is that the channel encoding can be modeled as a Markov process. Equivalently, the code can be represented as a trellis, such as illustrated in FIG. 10, where the next state depends only on the current state and the new input bit. The states of the trellis are indexed by the integer in m. m=0,1, . . . ,M–1. The state of the trellis at time t is denoted by s(t), and the output symbol due to the transition from s(t–1) to s(t) is denoted by v(t). A state sequence from time t to t' is denoted by $s_{t,t'}$, and the corresponding output sequence is $v_{[t,t']}$.

Although the ultimate goal is to estimate the probability that a given symbol or information bit was transmitted, it is simpler to first derive the a posteriori probabilities of the states and transitions of the trellis based on the observations y or w. From these results, most other probabilities of interest can be obtained by performing summations over selected subsets of states and/or transitions.

Denote the M-vector of state probabilities at time t based on the set of observations by $$\lambda(t)=Pr[s(t)|w]; \lambda(t) \in R^M \qquad (2)$$

where $$\lambda_m(t)=Pr[s(t)=m|w]. \qquad (3)$$

Then, for a linear rate 1/n convolutional code without feedback, the probability that a "1" was the information bit is (assuming the transmitted information bit is the LSB of the state)

$$\Pr[x(j) = 1 \mid w] = \sum_{s:LSB(s)=1} \lambda_s(t(j)) \qquad (4)$$

where t(j) is the channel time index corresponding to input bit index j, and LSB(s) is the least significant bit of the state s. For a recursive code, the right hand side of (4) is replaced by a summation over the set of transitions that correspond to a "1" at the input.

Define the forward estimator of state probabilities as the M-vector $$\alpha(t) = \Pr[s(t) \mid w_{[1,t]}] \alpha(t) \in \mathbb{R}^M \qquad (5)$$

and, similarly define the backward estimator of state probabilities, as $$\beta(t) = \Pr[s(t) \mid w_{[1,T]}] \beta(t) \in \mathbb{R}^M \qquad (6)$$

These are the estimates of the state probabilities at time t based on the past and future observations, respectively. The important result related to these quantities is the following separability theorem. First, however, define the vector product $c=a.b$ as $c(m)=a(m)b(m)$ for all m, and define the $L^1$ norm for probability vectors as $$\|a\| = \sum_m a(m) \qquad (7)$$

Theorem 1.1 (Separability Theorem). The state probabilities at time t are related to the forward and backward estimators by $$\lambda(t) = \frac{\alpha(t) \cdot \beta(t)}{\|\alpha(t) \cdot \beta(t)\|}. \qquad (8)$$

One aspect of this theorem is, for a Markov process, the state distribution at time t given the past, is independent of the state distribution at time t given the future. Also, there is a simple way of combining the forward and backward estimates to obtain a complete estimate. It is just the normalized product of the state distributions based on the past and the future. Thus, if there are simple algorithms for obtaining the forward and backward estimates, this would be a solution to the MAP detection problem.

In fact, representing the state transition probability at time t by $$\gamma_{m',m}(t) = \Pr[s(t)=m, w(t) \mid s(t-1)=m'] \qquad (9)$$

and denoting the matrix of these probabilities as $$\Gamma(t) = [\gamma_{m',m}(t)] \Gamma(t) \mathbb{R}^{M \times M} \qquad (10)$$

the following recursion theorem for calculating the forward and backward state estimates results.

Theorem 1.2 (Recursion Theorem). The forward and backward estimates can be determined recursively as follows.

$$\alpha(t)^T = \frac{\alpha(t)^T \Gamma(t)}{\|\alpha(t)^T \Gamma(t)\|} \qquad (11)$$

and $$\beta(t) = \frac{\Gamma(t+1)\beta(t+1)}{\|\Gamma(t+1)\beta(t+1)\|}. \qquad (12)$$

Together these two theorems define the BCJR algorithm for MAP detection of a Markov source transmitted over a discrete memoryless channel. In particular, the steps are i) $\alpha(0)$ and $\beta(T)$ are initialized according to the trellis structure. For a trellis beginning and ending in the all zeros state, one has $\alpha_0(0)=1$, $\alpha_m(0)$ for all $m \neq 0$, and similarly for $\beta(T)$.

ii) As y(t) is received, the decoder computes $\Gamma(t)$, and then $\alpha(t)$ using (11). The obtained values of $\alpha(t)$ are stored for all t and m.

iii) after the complete sequence $y_{[1,T]}$ has been received, the decoder recursively computes $\beta(t)$ using (12). When the $\beta(t)$ have been computed they can be multiplied by the appropriate $\alpha(t)$ to obtain $\lambda(t)$ using (8).

The BCJR algorithm is a double recursion, one recursion in the forward direction and one in the reverse. Consequently, it has at least twice the complexity of the Viterbi algorithm in its most general form. It also has larger storage requirements as the results of the forward recursion must be stored to be used with the reverse recursion. Hard decisions are derived from the algorithm on the basis of whether the probability a bit is a "1" is greater than 0.5 but the algorithm's main feature is its soft-output capability.

Figure 11:
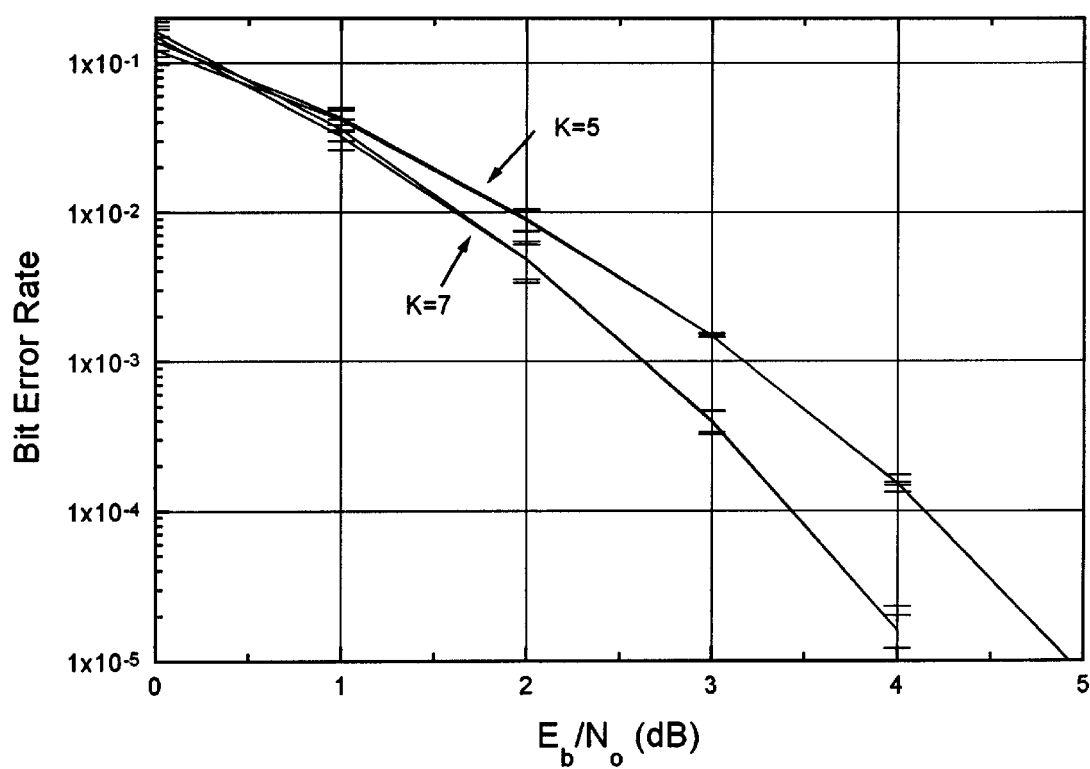
FIG. 11 represents a comparison between bit error rate performance of two algorithms, BCJR and MLSE, in additive white Gaussian noise for two convolutional codes.

In FIG. 11. the bit error rate performance of the two algorithms, BCJR and MLSE, in additive white Gaussian noise for two convolutional codes are compared. The two codes had constraint lengths of 5 and 7. respectively. The codes were evaluated over blocks of 400 information bits. The performance of the two codes are identical at high SNR. At low SNR, although it is not clear in the illustration, the BCJR approach has a marginal performance advantage. The BCJR is expected to be better because it is guaranteed to provide the minimum BER performance of all techniques. The MLSE approach on the other hand provides a minimum probability of codeword error.

Figure 12:
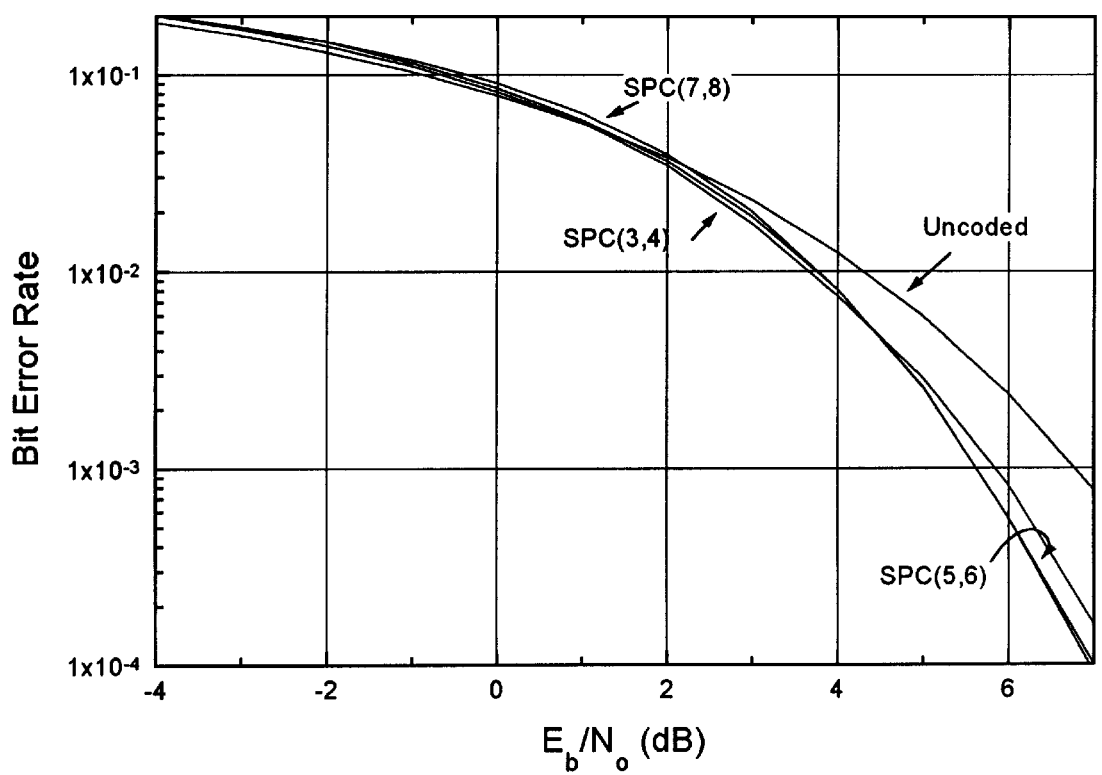
FIG. 12 is a diagram comparing the BER performance of SPC component codes and uncoded performance in additive white Gaussian noise.

Single parity check (SPC) codes are among the simplest codes possible. For an information word of J=N−1 bits, a single parity checksum bit is added to form a (N,N−1) code. These codes prove to be interesting component codes for iterative decoding techniques. In FIG. 12, the BER performance of SPC component codes are compared to uncoded performance in additive white Gaussian noise.

Figure 13:
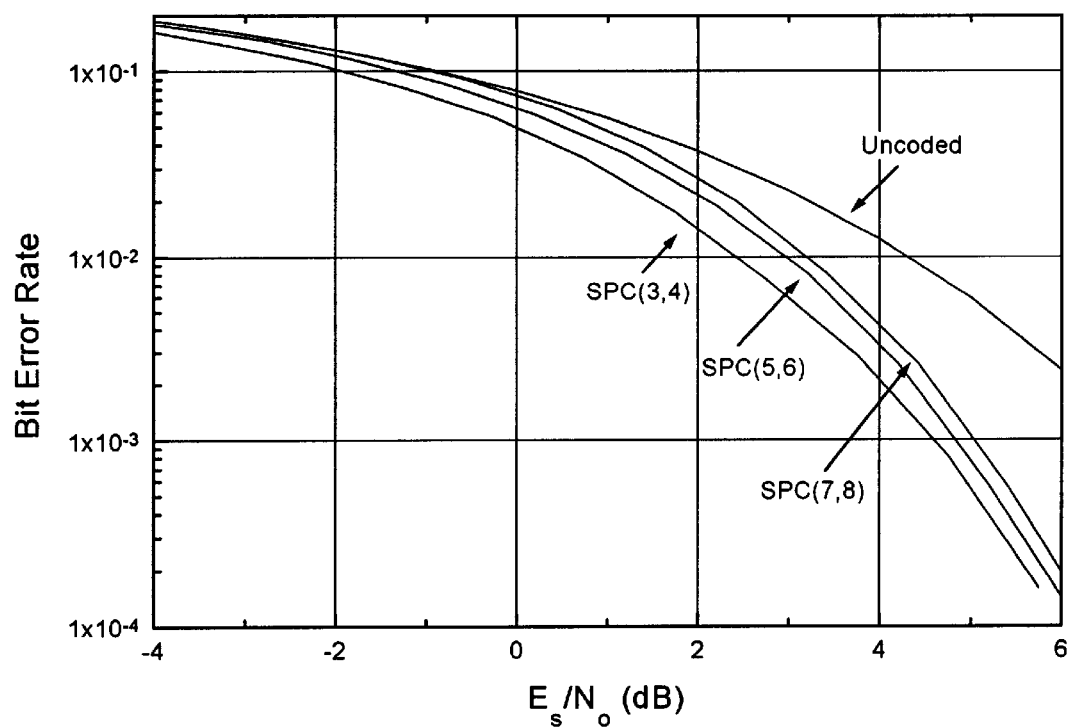
FIG. 13 is an informative to plot the same results as a function of the energy per channel bit to noise density ratio, $E_s/N_0$, that is uncompensated for the code rate.

These codes perform slightly better than uncoded, as the SNR increases. The performance is shown in FIG. 12 as a function of the energy per information bit $E_b$. It is informative to plot the same results as a function of the energy per channel bit to noise density ratio, $E_s/N_0$, that is uncompensated for the code rate. This is shown in FIG. 13. In this case, a monotonic improvement in BER performance with decreasing code rate at all $E_s/N_0$ ratios is evident. This is illustrative of the MAP detection property of minimum symbol error rate.

All of these codes are systematic. That is, some of the channel bits correspond to information bits. It is the property of MAP detection that, on average, it always improves upon the estimate of the bit provided by the channel. Thus explaining, the monotonic behaviour seen in FIG. 13.

Figure 14:
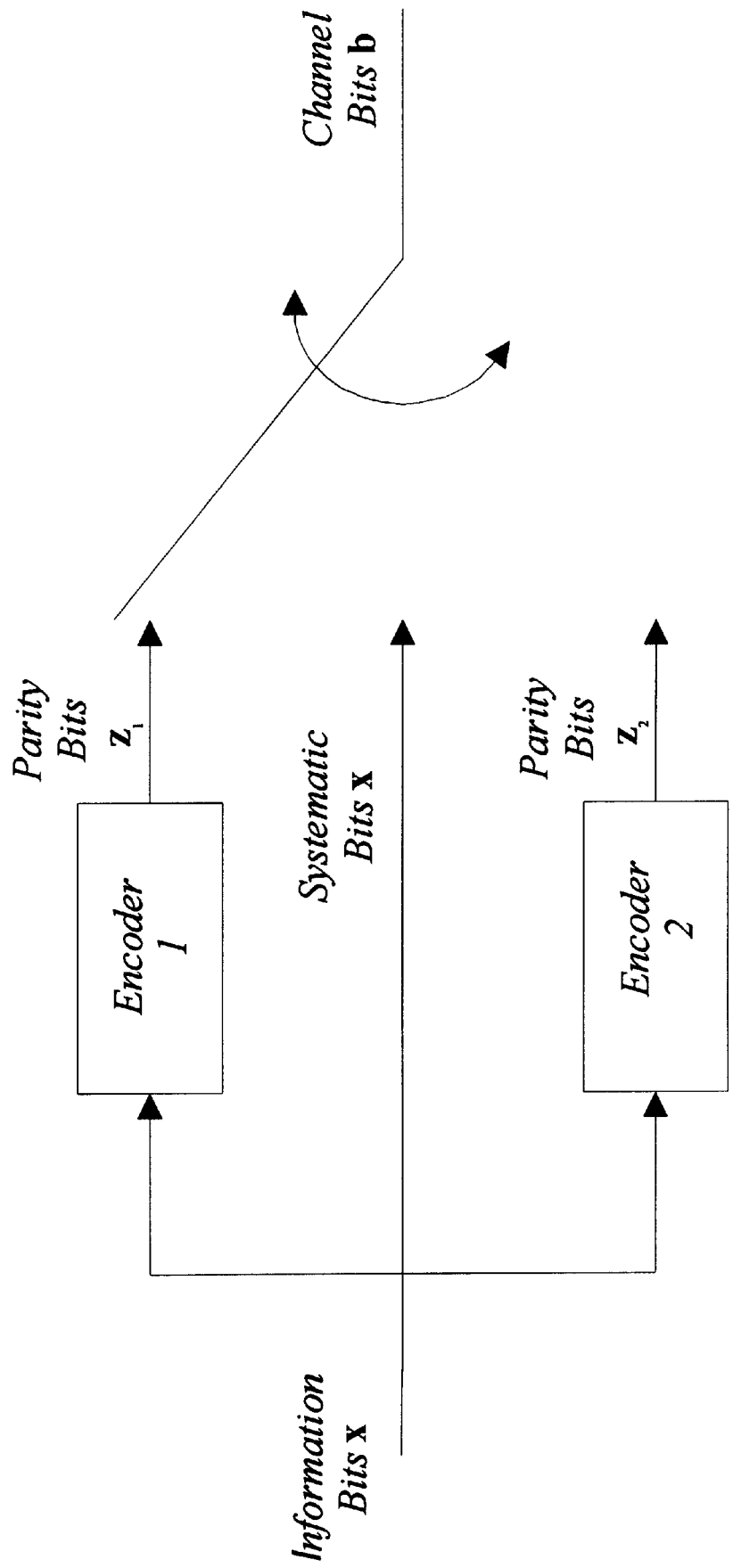
FIG. 14 is an illustration of parallel concatenated coding.

Parallel concatenated coding implies that same information is encoded by two different encoding schemes as illustrated in FIG. 14. In a sense all systematic parity check codes fit this definition, because they could be written as a set a parallel single parity check equations, although generally more powerful component codes are considered.

Figure 15:
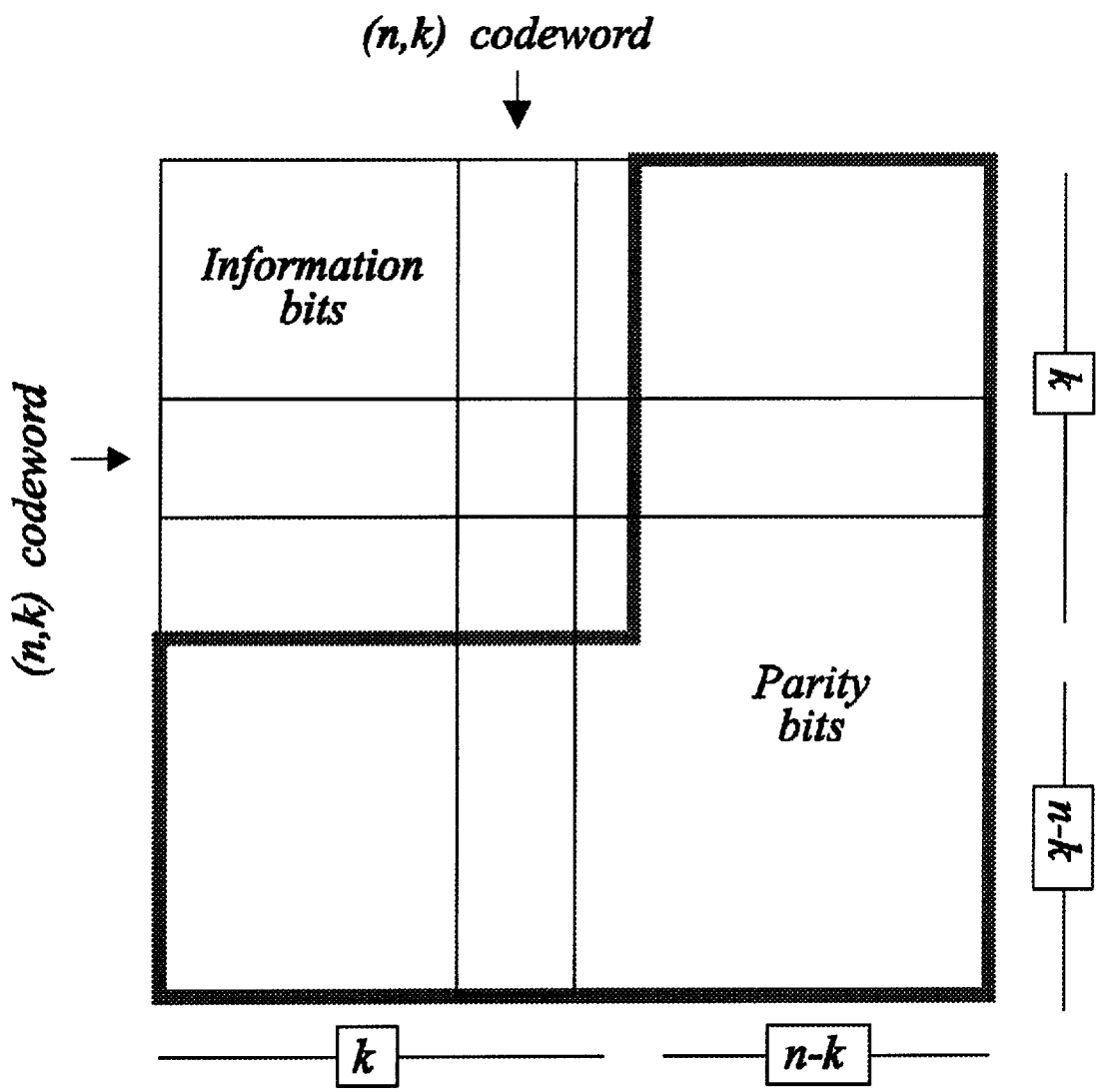
FIG. 15 shows a typical two-dimensional product code.

A typical two-dimensional product code is illustrated in FIG. 15. In this product code, the bits are arranged in a k×k square and encoded horizontally using an (n,k) code. The same bits are then encoded vertically using the same (n,k) code. In the example shown in FIG. 15, the vertical encoding also encodes the parity bits of the horizontal encoding although this is not necessarily the case. Prior art implementations involve each dimension being decoded in tu. the check digits are used to correct single errors and then discarded.

While this code does not achieve the Shannon capacity limit, it is one of the first examples of a realizable code of non-zero capacity with an arbitrarily small error rate. It was observed that the rectangular structure of the product code was important to maintain independence of the symbols in the different decoding stages. It is the average error-correction capability that makes transmission at a nonzero rate possible. The relevance of this observation will become important when we discuss the behaviour and performance of Turbo codes. This approach does not achieve capacity for two reasons. First, there is a loss inherent in using hard decisions when decoding. Second, there is the fact that the information in the parity bits for a particular stage is only used for that stage and then discarded.

Therefore, a soft-input, soft-output decoding technique called weighted output decoding was proposed applied to D-dimensional product codes. The development of the soft-output Viterbi algorithm (SOVA), and the rediscovery of the BCJR algorithm further improved soft output decoding. While still concentrating on systematic parallel codes using simple component codes, the next key development was the idea of iterating the decoding process using soft-output algorithms. Lodge et al showed that by using the BCJR algorithm on each of the component codes in a multi-dimensional product code, and repeating the decoding process several times, some of the losses associated with the component-wise decoding were recouped.

Figure 16:
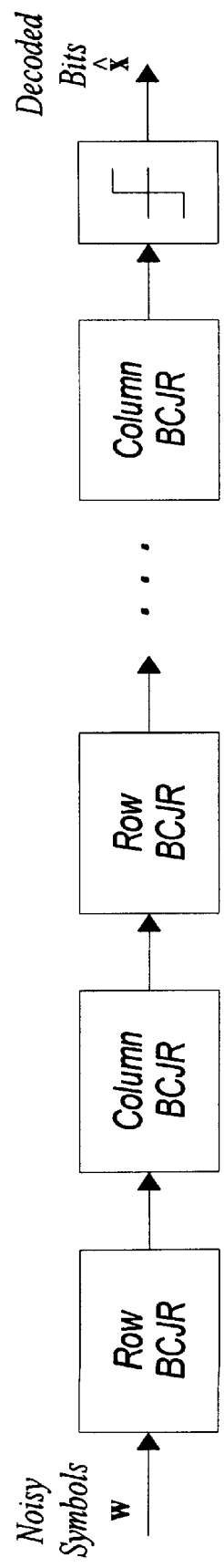
FIG. 16 is a block diagram of an approach applied to a two-dimensional product code shown in FIG. 15 where each row and each column of this code is a codeword in the (n,k) component block code.

A block diagram of this approach is shown in FIG. 16 for the two-dimensional product code shown in FIG. 15 where each row and each column of this code is a codeword in the (n,k) component block code. This is an $(n^2, k^2)$ product code. If the component code has a minimum distance d, then the two-dimensional product code has a minimum distance $d^2$.

The algorithm applies the BCJR algorithm to the soft decisions received for each row to produce the a posteriori probabilities for each channel bit. These output probabilities are used as an input to the column decoding, again using the BCJR algorithm. This process is then repeated with further row and column decodings. It is the transmitted symbol probabilities that are the important quantities for subsequent decodings. At the last stage the BCJR algorithm is modified to produce the a posteriori probabilities of the information bits. In the case where the code is systematic, no modification is necessary.

Figure 17:
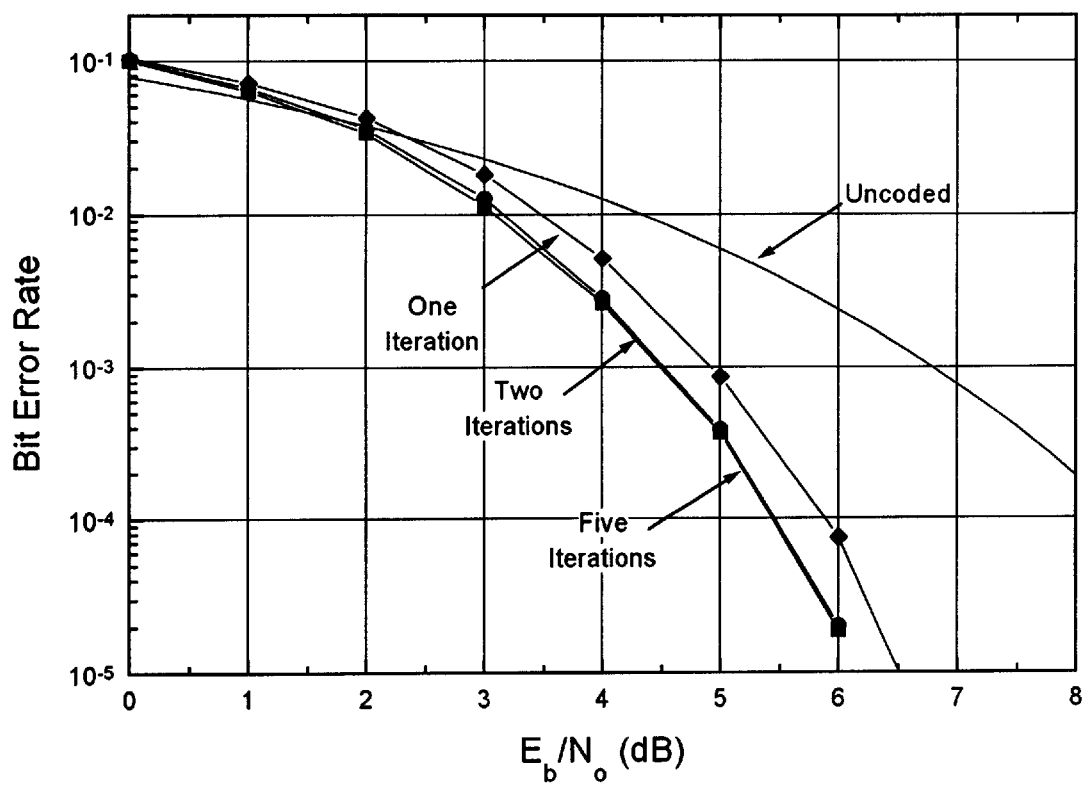
FIG. 17 is a diagram of performance of an iterative decoding strategy.

With this approach, remarkable performance is possible out of some very simple codes. For example, consider the two dimensional product code where each of the component codes is a single parity check (8,7) code. The overall code rate for this combination is approximately ¾. The performance of this code using this iterative decoding strategy is illustrated in FIG. 17 for one, two and five iterations. One iteration corresponds to one row plus one column BCJR decoding.

Compared to uncoded performance this simple rate ¾ code provides 2 dB or more performance gain for BERs less than $10^{-3}$ with a single iteration. A second iteration results in a further gain of about 0.25 dB. The improvement with subsequent iterations is marginal. For single parity check codes, there is a simple two-state trellis for each component code and thus the decoding algorithm has very low complexity.

Figure 18:
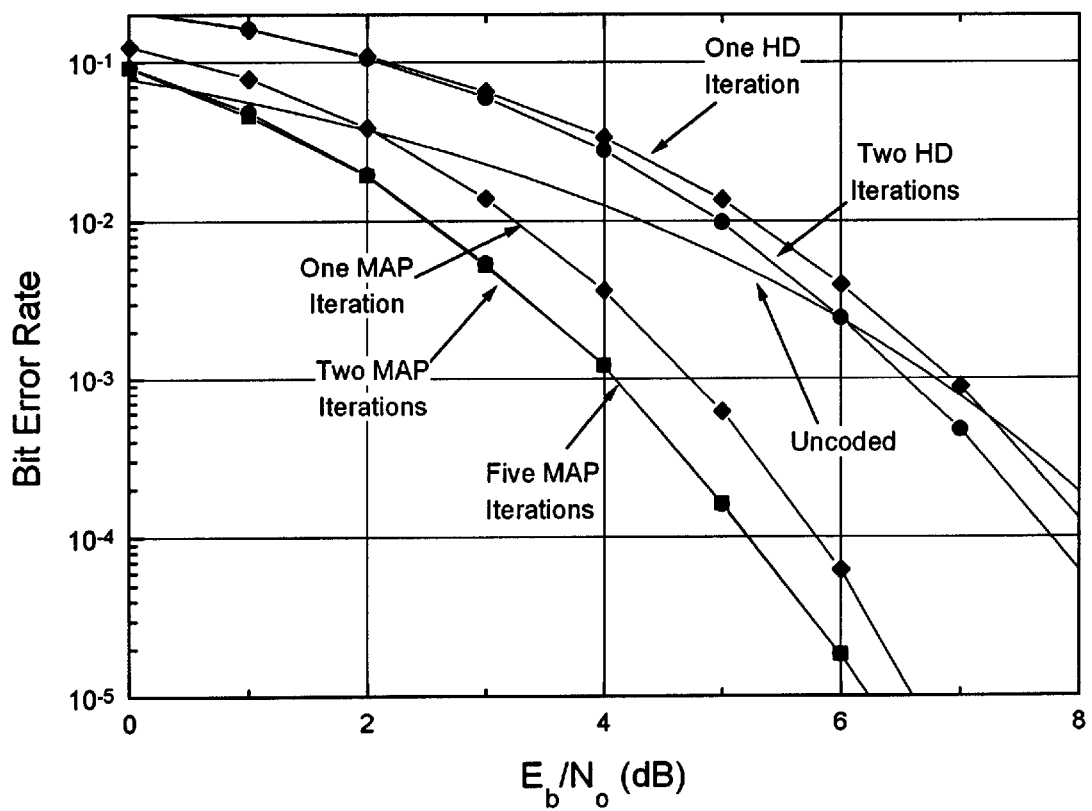
FIG. 18 is a diagram illustrating performance using various decoding strategies.

As a second example, consider the two-dimensional product code constructed from the (7,4) Hamming code. This code has a rate of 0.326 and an asymptotic coding gain of 4.67 dB. Shown in FIG. 18 is the performance with various decoding strategies. All results are for an AWGN channel. The upper curve in this figure is for a decoder that makes hard decisions, decodes each row, and then uses the output of the row decoder to decode each column.

In FIG. 18, one iteration of the MAP algorithm provides greater than 2 dB improvement over uncoded performance at a BER of $10^{-3}$. The gain increases with increasing $E_b/N_0$. In this case a second iteration results in a further 2.5 dB improvement in performance. As with the single parity check codes, the improvement with subsequent iterations was marginal. This was found to be a general rule, i.e for two-dimensional product codes, two iterations achieved most of the gain.

Also shown in FIG. 18 is the performance with hard decision decoding of the product code. It is interesting to note that one iteration of the hard decision approach is almost exactly 2 dB worse than one iteration of the soft decision approach over the full range shown. With the hard decision approach, further iterations result in only a marginal improvement as shown.

The next significant development in this area was Turbo codes. These rely heavily on the approaches above but also made three insightful improvements. These three improvements are i) the use of recursive convolutional codes as component codes, ii) the use of random interleavers, and iii) the separation of intrinsic and extrinsic information in the decoder.

Figure 19:
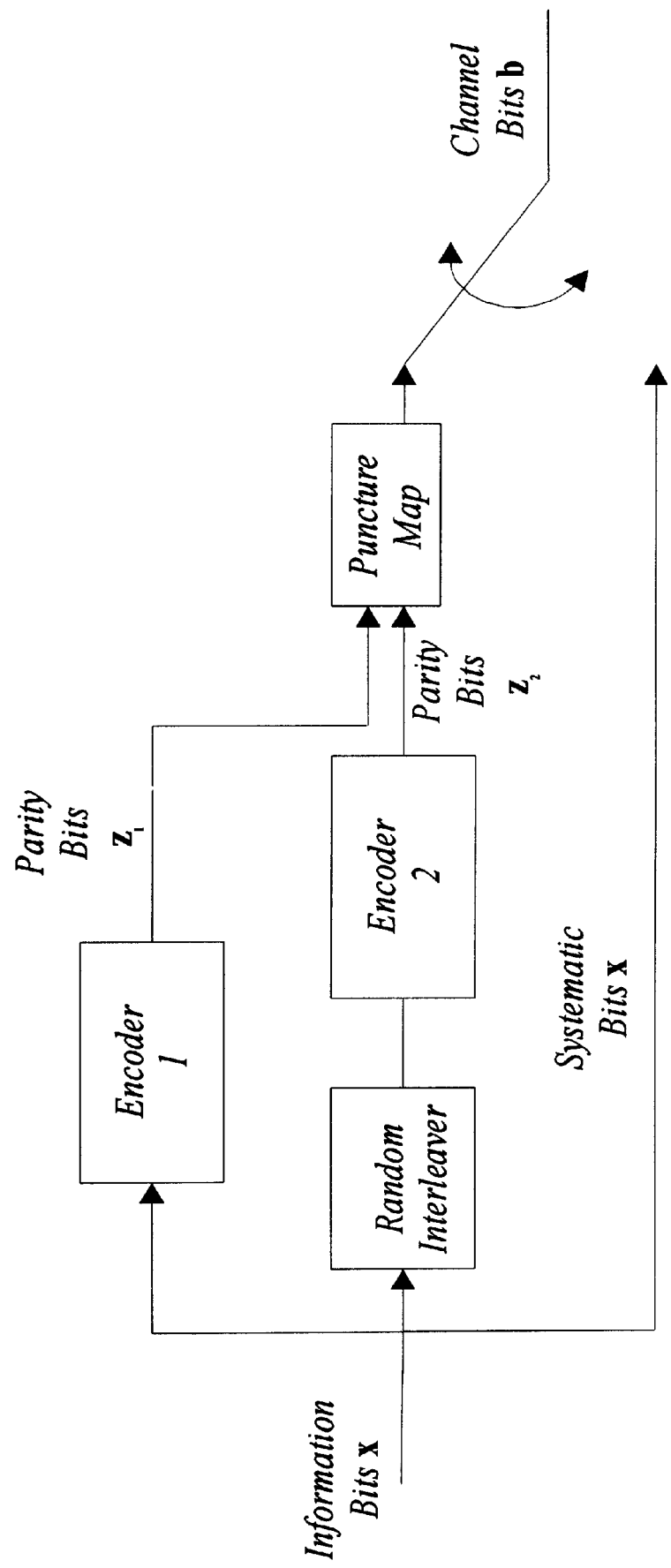
FIG. 19 illustrates that Turbo coding is a parallel coding scheme.

Turbo coding is a parallel coding scheme as illustrated in FIG. 19. Similar to FIG. 14, the information is systematically encoded by two encoders. However, unlike the ordered interleaving used with the product codes, the information bits are re-ordered using a pseudo-random interleaver with Turbo codes. Typically the same code is used for both encoders, although this is not necessarily the case. The information bits and the parity bits generated by each of the encoders are then transmitted over the channel. In the original Turbo encoding scheme, the parity bits are punctured in a repeating pattern to increase the code rate. Again, this is not necessary.

Figure 20:
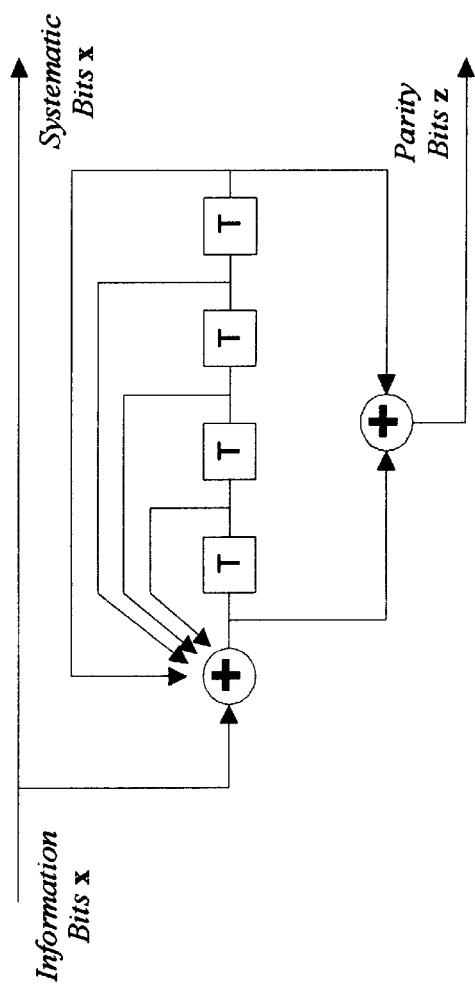
FIG. 20 is an illustration of the original Turbo component code.

The component codes that are recommended for Turbo encoding are the short constraint length, systematic, recursive convolutional codes. The original Turbo component code is illustrated in FIG. 20. This is a simple 16-state code. The feedback nature of these component codes means that a single bit error corresponds to an infinite sequence of channel errors.

Although the component codes are convolutional, Turbo codes are inherently block codes with the block size being determined by the size of the interleaver. The block nature also raises a practical problem of how to correctly terminate the trellises of both encoders. This problem is avoided for evaluation purposes by using an all-zeros sequence.

Figure 21:
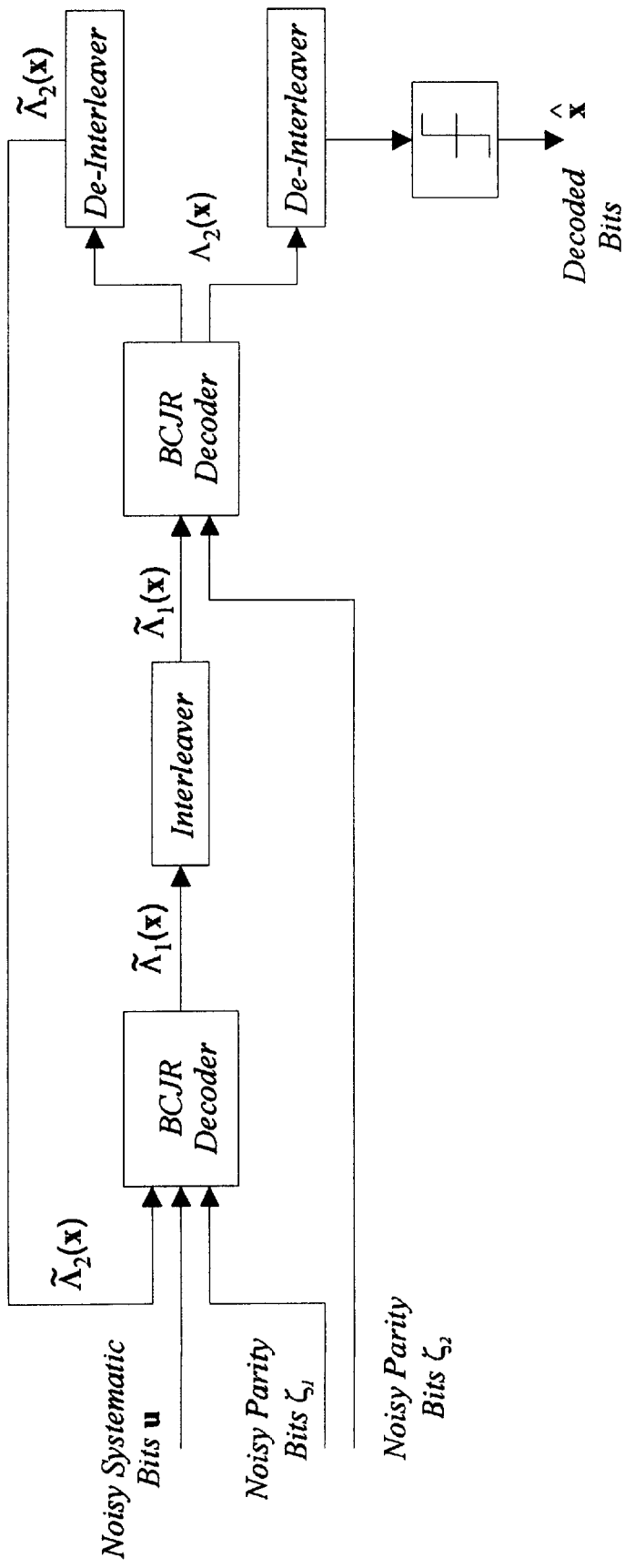
FIG. 21 is a block diagram of a Turbo Code decoder structure.

In addition to this novel adaptation of the parallel coding structure, the decoding strategy applied to Turbo codes is also innovative. It is from the structure of the decoding algorithm that the scheme draws its name from an analogy to the turbo engine principle. A block diagram of the decoder structure is shown in FIG. 21. It is illustrated as a single iterated stage but also could be implemented as a number of serial stages.

In FIG. 21, the inputs to the first decoding stage are the channel samples (u, $\zeta_1$) corresponding respectively to the systematic bits x, and the channel samples corresponding the parity bits of the first encoder $z_1$, and the extrinsic information about the systematic bits that was determined from previous decoder stages $\Lambda_2(x)$. We will later define extrinsic information but it is suffice to say that, on the first decoding, the extrinsic information is zero. If puncturing is applied at the transmitter then the parity bits must be stuffed with zeros in the appropriate positions.

The first decoding stage uses the BCJR algorithm to produce a refined (soft) estimate of the systematic bits, $\Pr[x(j)|(u, \zeta_1, \Lambda_2, (x)]$. However, for the implementation it is more convenient to express this soft estimate as the equivalent log-likelihood ratio $$\Lambda_1(x(j)) = \log \frac{\Pr[x(j) = 1 | u, \zeta_1, \tilde{\Lambda}_2(x)]}{\Pr[x(j) = 0 | u, \zeta_1, \tilde{\Lambda}_2(x)]} \quad (13)$$

In practice, this calculation is much simpler than equation (13) would suggest. On the first iteration this refined estimate is re-ordered to compensate for the pseudo-random interleaving at the transmitter and combined with the second set of parity samples from the channel as the input to the second decoding stage.

The second decoding stage uses the BCJR algorithm to produce a further refined estimate of the systematic bits $\Pr[x(j)|\Lambda_1(x), \zeta_2]$, using the second set of parity bits. This second estimate is expressed as the log-likelihood, $\Lambda_2(x(j))$. This estimate can be hard-detected to provide bit estimates at this point. Alternatively, the output of the second stage can be used to provide extrinsic information to the first stage. In either case, the samples must be re-ordered to compensate for the random interleaving.

The decoding schemes discussed above rely on the implicit assumption that the bit probabilities remain independent from one iteration to another. This turns out to be true at the end of the first decoding, for approaches such as applying the BCJR algorithm to a product code. On subsequent decoding iterations, the bit estimates are correlated but the BCJR algorithm is applied as if they were independent.

To increase the independence of the inputs from one processing stage to the next, the Turbo algorithm makes use of the concepts of intrinsic and extrinsic information. Intrinsic information refers to the information inherent in a sample prior to a decoding. Extrinsic information refers to the incremental information obtained through decoding. To maintain as much independence as possible from one iteration to the next only extrinsic information is fed from one stage to the next.

Mathematically, the symbol probability obtained at the output of the BCJR algorithm is the combination of these two quantities. However, for a simple systematic code, the closed form solution to the MAP decoding problem in a memoryless channel gives $$\Pr[x(j) = 1 | y] = \frac{\sum_{\substack{b \in C \\ x(j)=1}} \prod_k \Pr[b(k) | y(k)]}{\sum_{b \in C} \prod_k \Pr[b(k) | y(k)]} \quad (14)$$

-continued
$$= \Pr[x(j) = 1 | y(j)] \times \frac{\sum_{\substack{b \in C \\ x(j)=1}} \prod_{k \neq j} \Pr[b(k) | y(k)]}{\sum_{b \in C} \prod_k \Pr[b(k) | y(k)]}$$

where b, y are the transmitted and received bit sequences, respectively, and C is the set of all codewords. Equation (14) shows that they can be separated easily. The first factor in the product on the second line of (14) represents the intrinsic information of the soft channel values at the input to the decoder, and the second term is the extrinsic information which is generated by the decoding. It is more convenient to express this relationship in terms of log-likelihood ratios because then the product becomes a sum and the denominator term cancels. In particular, the extrinsic information at the output of the second stage is $$\tilde{\Lambda}_2(x) = \Lambda_2(x) - \Lambda_1(x) \quad (15)$$

That is, it is the difference of the input and output log-likelihood ratios for the systematic bits—on the first pass, $\tilde{\Lambda}_1(x) = \Lambda_1(x)$. Similarly at the output of the first stage, the extrinsic information provided to the second stage is given by $$\tilde{\Lambda}_1(x) = \Lambda_1(x) - \Lambda_2(x) \quad (16)$$

In the TIurbo decoder, the processing performed in the BCJR algorithm is unchanged from the basic algorithm. The differences occur only in the processing which is performed the inputs to and outputs from the BCJR algorithm. A hard decision can be obtained at any time with the operation $$\hat{x}(j) = \text{sign}(\Lambda_2(x(j))). \quad (17)$$

Figure 22:
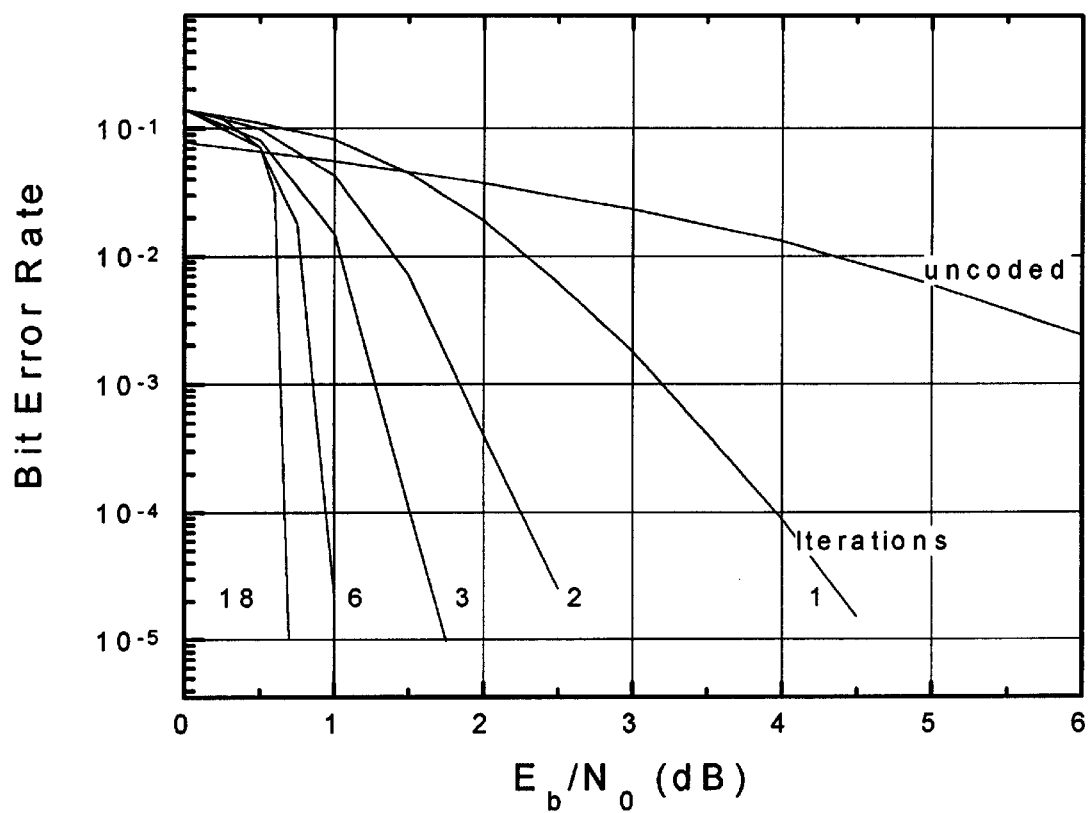
FIG. 22 is a diagram illustrating performance of Turbo Codes.

The impressive aspect of Turbo codes is their performance. In FIG. 22, an example of their performance is presented. These results correspond to the encoding strategy described above and for an interleaver size of 64K bits. Performance is shown as a function of the number of iterations.

It is clear that performance with a small number of iterations is not particularly impressive but as the number of iterations is increased performance continually improves. With 18 iterations, the code achieves a BER of $10^{-5}$ at an $E_b/N_0$ of only 0.7 dB. This is only 0.7 dB away from the Shannon limit for this code rate. What is not apparent from FIG. 22 is that, asymptotically, the performance curves have a much shallower slope. which is determined by the minimum distance of the code. Performance of Turbo codes at low $E_b/N_0$ is a function of the interleaver size. With smaller interleavers performance degrades. However, even with an interleaver size of 300 bits, a BER of $10^{-4}$ can be obtained at an $E_b/N_0$ of 2.3 dB.

Because of their amazing performance, Turbo codes have attracted a considerable amount of interest. What appears to be the most complete analysis of their behaviour is described in S. Benedetto and G. Montorsi, "Unveiling Turbo Codes: Some results on parallel concatenated coding schemes," IEEE Trans. Inf. Th., vol. 42. No.2, pp.409–428, March 1996 herein incorporated by reference. This analysis is based on determining the equivalent transfer function of the overall code, and then using standard transfer function techniques to bound performance assuming maximum likelihood detection.

For Turbo codes, the interleaver size effectively defines the block size even if convolutional codes are used. Due to the structure of the code which transmits systematic bits and the parity bits from two parallel encoders, the analysis focuses on the bivariate weight enumerating function AC(X, Z) for the component codes which explicitly shows the weights associated with the information bits, x, and the parity bits, $z=_{(z1,[l},K],_{z2,[l,}K])$. In particular, $$A^C(X, Z) = \sum_{w,j} A_{w,j} X^w Z^j \qquad (18)$$

where X and Z are indeterminants, and $A_w$, j is the number of codewords generated by an input information word of Hamming weight w whose parity check bits have Hamming weight j. For a component code, this bivariate weight enumerating function (WEF) can be determined with standard transfer function techniques.

When a conditional weight enumerating function $^{Aw}C1(Z)$ of each of the component codes is defined as the distribution of the Hamming weights of the paty check bits for any input word of Hamming weight w, then a relationship between the conditional WEF and the bivariate WEF function is $$A^{C1}(X, Z) = \sum_{w} X^w A_w^{C1}(Z). \qquad (19)$$

Analysis of the parallel code structure for a specific interleaver is too complex in general. Consequently, the concept of a uniform interleaver is introduced. A uniform interleaver of length J is a probabilistic device that maps a given input word of weight w into all distinct $$\binom{J}{w}$$

permutations of it with equal probability $$1 \Big/ \binom{J}{w}.$$

Each term of the conditional WEF $A_w^{C1}(Z)$ corresponds to a specific error event where the systematic bits have weight w. For each such event, the second encoder will produce a parity stream of a specified weight. From the definition of the uniform interleaver, this second parity stream is not fixed for a given weight it, error event but rather has a distribution described by $$A_w^{C2}(Z) \Big/ \binom{J}{w}$$

and this is independent of the parity stream of the first encoder. Consequently, the combined parity stream has a conditional WEF given by $$A_w^C(Z) = \frac{A_w^{C1}(Z) A_w^{C2}(Z)}{\binom{J}{w}}. \qquad (20)$$

The WEF for the overall parallel code is then given by $$A^C(X, Z) = \sum_w X^w A_w^C(Z). \qquad (21)$$

The performance with maximum likelihood detection is then bounded using standard transfer function techniques. For instance the union bound on the probability of bit error over an AWGN channel is given by $$P_e \leq \frac{X}{J} \frac{\partial A^C(X, Z)}{\partial X} \Big|_{X=Z=e^{-R_c E_b/N_o}} \qquad (22)$$

$$= \sum_{w=1}^{J} \left(\frac{w}{J}\right) X^w A_w^C(Z) \Big|_{X=Z=e^{-R_c E_b/N_o}}$$

From this analysis the following is known. Let an error event have weight $\delta = w+j$ where w is the number of information bit errors andj is the number of parity bit errors. Let $w_{min}$ be the minimum w of any finite weight error event. Let $\eta_{min}$ be the number of error events starting at a particular bit with $w_{min}$ information errors and lowest weight $$\delta_{min} = \min_j \{w_{min} + j\}. \qquad (23)$$

Note that $\delta_{min}$ does not necessarily equal the free distance of the code. The number of possible information error events of weight $w_{min}$ in an interleaver of length J is $$\binom{J}{w_{min}}.$$

So over a block of length J, there are $\eta_{min} J$ events of distance $\delta_{min}$. The fraction of $w_{min}$ events which are the minimum distance $\delta_{min}$ is $$\frac{\eta_{min} J}{\binom{J}{w_{min}}} \approx \eta_{min} w_{min}! J^{1-w_{min}}. \qquad (24)$$

Equation (24) shows that the interleaver gain on the error coefficient is proportional to $J^{1-w_{min}}$. For a recursive convolutional code with a fixed block lenigtlh and terminated trellis $w_{min} \geq 2$. For non-recursive convolutional codes and block codes $w_{min}=1$. Consequently only for recursive convolutional codes, is there an interleaver gain on the error coefficient. Note that other events with $w<w_{min}$ may have distances $\delta<\delta_{min}$ but will have a significantly greater attenuation, $J^{1-w}$, of the error coefficient. Thus, the critical design parameters for Turbo codes are not the minimum distance but rather $\delta_{min}$ and $w_{min}$.

There are two major aspects to recent developments in coding theory. The first was the development of iterative decoding techniques based on soft-output algorithms such as the BCJR algorithm. The second was the development of new coding techniques using parallel recursive convolutional codes with a random interleaver. The latter closely approximates random codino performance yet has a simple structure which permits practical decoding, i.e., via the iterative algorithms. It is the combination of these two developments that resulted in the quantum step in performance which occurred with the introduction of Turbo codes.

For a finite alphabet X, with symbol probabilities p[x] for x(X, the entropy of the random variable x is given by $$H(x) = -\sum_{x \in X} p[x] \log p[x] \quad (25)$$

The various physical interpretations of this quantity are well known and are summarized as follows: the entropy characterizes the unpredictability of the outcome of randomly selecting a symbol from X.

While entropy concerns only a single distribution, cross-entropy is a measure of the difference between two probability distributions. Traditionally, it has had greater importance in statistical applications than in communications. For two distributions p and q of an alphabet X, the cross-entropy is defined as $$H[p, q] = \sum_{x \in X} p[x] \log \frac{p[x]}{q[x]} \quad (26)$$

The cross-entropy of two distributions is zero only if the two distributions are identical. Otherwise the cross-entropy is positive. The cross-entropy of two distributions is not symmetric, that is, $$H[p,q] \neq H[q,p]. \quad (27)$$

Furthermore, cross-entropy does not satisfy the triangle equality in general. That is, $$H[p,q] \leq H[p,r] + H[r,q] \quad (28)$$

is not always true. Consequently, cross-entropy is not a true metric in the mathematical sense, and its usefulness depends upon the application.

There are statistical inference schemes associated with the concepts of entropy and cross-entropy. The first scheme to gain prominence was Jayne's Principle of Maximum Entropy. Jayne promoted this as a method of statistical inference in physics, and showed how some fundamental distributions such as the Boltzmann and Fermi distributions could be derived from this principle. Previously, this inference scheme had been used in statistical applications, and since then its use has spread to countless fields including spectral estimation.

When inferring the distribution p[x] of a random variable x, the Principle of Maximum Entropy selects that distribution which has the maximum entropy subject to the known constraints on the random variable x. The constraints referred to are typically constraints on the range and the moments of x. For example, when a random variable has a range $(-\infty, +\infty)$, a mean of zero, and a variance of one, the maximum entropy distribution is the normal distribution.

Implicit in the principle of maximum entropy is the assumption that there is no a priori information about the random variable other than the constraints. The Principle of Minimum Cross-entropy is a generalization of the maximum entropy principle, which permits the inclusion of a priori information. When inferring the distribution p(x) of a random variable x with an a priori distribution q[x], the Principle of Minimum Cross-entropy selects that distribution p[x] which has the minimum cross-entropy H[p,q] subject to the known constraints on the random variable x.

Mathematically, the principle of cross-entropy minimization is, given an a priori distribution q[x], determine the "closest" distribution in the cross-entropy sense p[x], which satisfies the given constraints on its moments. That is, find p[x] such that $$H[p, q] = \min_{s} H[s, q] \quad (29)$$

subject to $$\sum_{x \in X} p[x] = 1 \quad (30)$$

which is a normalization constraint and $$E_p[f_i(x)] = 0 \quad i=1, \ldots, F \quad (31)$$

where $E_p$ is the expectation over the distribution p, and $f_i$ are functions in x that represent the equality constraints on the moments of x.

The minimum cross-entropy (MCF) distribution p[x] is found by the product of the a priori distribution and an exponential function of the constraints $$p[x] = q[x] \exp\left[-\mu_o - \sum_{k=1}^{F} \mu_k f_k(x)\right] \quad (32)$$

where the $\{\mu_k\}$ are Lagrange multipliers with $\mu_o$ determined by (30) and the remaining $\mu_k$ determined from (31). That is, from $$\sum_{X} f_i(x) q[x] \exp\left[-\mu_o - \sum_{k=1}^{F} \mu_k f_k(x)\right] = 0 \quad (33)$$

$$i = 1, \ldots, F$$

This is, in general, a set of F non-linear equations for the parameters $\mu_k$. The practical application of the principle of cross-entropy minimization to any problem of significant size is a computer exercise in determining the solution of this set of non-linear equations.

Under the following four axioms i) uniqueness; ii) invariance under a change of coordinate system; iii) invariance regardless of whether independent systems are considered separately or together; and iv) invariance regardless of whether independent subsets are treated conditionally or in terms of the full system density, cross-entropy is the only consistent inference scheme; all other inference schemes will lead to contradictions.

The principle of cross-entropy minimization is a very general statistical inference method. To apply cross-entropy to a decoding problem, determination of a priori distribution and constraints for a problem is necessary.

Given space $\mathcal{B}$ of dimension N where $\mathcal{B}$ is the set of all bipolar N-tuples $$b = \{(b(1), b(2), \ldots, b(N)) : b(n) \in \{-1, +1\}\}, \quad (34)$$

a binary block code $\mathcal{C}$ of length N and rate J/N is a subset of $\mathcal{B}$. Such a code will have $2^J$ codewords, and for many applications the number of codewords is too many to list or otherwise explicitly identify. Let $y \in z, 4^N$ be the corresponding noisy received bits. Assuming a memoryless channel the (i priori distribution associated with the transmitted bit b(n), derived from the corresponding noisy channel sample, is q[b(n)]=Pr[b(n) |y(n)]. The corresponding at priori N-tuple probability is given by $$q[b] = \prod_{n=1}^{N} q[b(n)] \qquad (35)$$

That is, the apriori distribution q[b] is determined from the soft-decision output of the channel.

For the decoding problem the moment constraints of (31) correspond to the parity check equations of the code. For example, if the (N,J) code is a linear binary code, there will be F=2 N−J independent parity check equations. A typical parity check equation is expressed as $$f_i(b)=b(2)b(3)b(5)+1=0. \qquad (36)$$

For this type of constraint, $f_i(b)=0$ when the code bits satisfy the constraint and $f_i(b)=2$ when they do not. Since the constraint is non-negative, (36) is equivalent to the expected value constraint, $E[f_i(b)]=0$.

Theorem 2.1 (Cross-entropy decoding). Given the a priori distribution q[b] as determined from the channel values, and the parity check equations $\{E[f_i(b)]=0, i=1, \ldots, F\}$, the a posteriori distribution is given by $$p[b]=q[b]\exp(-\mu_0)I_1(b)I_2(b)\ldots I_F(b) \qquad (37)$$

where $I_i(b)$ is the indicator function for all vectors b which satisfy constraint $f_i$. The parameter $\mu_0$ is a normalization constant.

For constraints of the form (36), equation (33) can be solved by inspection when one notes that $f_i(b)$, q[b], and exp(.) are all non-negative. That is, for any b such that $f_i(b)>0$, one must have $\mu_i=\infty$ for (4–10) to hold. However, with $\mu_i=\infty$, $$\exp[-\mu_i f_i(b)] = \begin{cases} 0 & \text{if } f_i(b) \neq 0 \\ 1 & \text{if } f_i(b) = 0 \end{cases} = I_i(b) \qquad (38)$$

and (37) follows immediately.

For the code C, the constraints $\{f_i(b): i=1, \ldots, F\}$ determine the code. In particular, the indicator function for a codeword is $$I_C(b)=I_1(b)I_2(b)\ldots I_F(b) \qquad (39)$$

since a codeword must satisfy all of the parity constraints simultaneously. Consequently combining (37) and (39) the aposteriori distribution can also be expressed as $$p[b] = \frac{q[b]I_C[b]}{\sum q[b]I_C[b]} \qquad (40)$$

where the required normalization has been performed. For the decoding problem, (40) is a closed form expression for the minimum cross-entropy distribution.

The a priori distribution q[b] is, in general, non-zero for all b∈B. However, the a posteriori distribution is only non-zero when b is a codeword. In particular, equation (40) represents the a posteriori probability distribution of the codewords. It is the a priori probability of each codeword, scaled by the sum of the probabilities of all permissible codewords. Maximum a posteriori decoding is simply choosing that codeword for which p[b] is largest where p[b] is given by (40).

To determine if MAP decoding results in fundamental losses, when M represents the processing performed by the minimum cross-entropy decoder is $$I(b;y) > I(b;M(y)) \qquad (41)$$

where I(b; y) is the mutual information between b and y. We have the following fundamental result.

Theorem 2.2 (Lossless Decoding). Minimum cross-entropy decoding is lossless. That is, $$I(x;y)=I(b;M(y)). \qquad (42)$$

Proof: The mutual information is defined as $$I(b;y)=H(b)-H(b|y) \qquad (43)$$

where H(b) is the entropy associated with b and the conditional entropy of b given y is $$H(b|y)=E[-\log p(b|y)] \qquad (44)$$

It is this conditional entropy which must be shown to be unchanged after processing. For a particular realization, the vector y represents the N soft values obtained from the channel. Let the codewords be represented by $C=\{X_1, X_2, \ldots X_{2^J}\}$. Minimum cross-entropy decoding produces $2^J$ soft values representing the codeword probabilities $p[X_i|y]$. The conditional entropy after decoding is $$H(b|M(y)) = E[-\log p(b|p(X_1|y), p(X_2|y), \ldots, p(X_{2^k}|y))] \qquad (45)$$
$$= E[-\log p(b|y)]$$
$$= H(b|y)$$

When a subset of the constraints is used when one performing the minimum cross-entropy decoding, the following theorem results.

Theorem 2.3 (Lossless Partial Decoding). Minimum cross-entropy decoding with only a subset of the constraints is lossless. That is, $$I(b;y)=I(b;M_1(y)). \qquad (46)$$

Proof: Let $I_{C_1}(b)=I_1(b)I_2(b)\ldots I_{F_1}(b)$ and let $I_{C_2}(b)=I_{F_1+1}(b)\ldots I_F(b)$. Then, the output of the decoding $M_1(y)$ will produce $2^{K_1}$ soft values $p_{C_1}[b]$ corresponding to the $2^{K_1}$ words satisfying the constraints $C_1$. Given these values, one can compute the corresponding values for complete decoding as follows $$p[b] = \frac{p_{C_1}[b]I_{C_2}[b]}{\sum_{b \in C_2} p_{C_1}[b]I_{C_2}[b]} \qquad (47)$$

and consequently, there is no loss of information with the partial decoding.

The above theorem has particular application to decoding in stages as it minimizes losses between stages.

A cross-entropy minimization process provides the probabilities for each codeword, from which is selected one with the greatest probability. Direct application of cross-entropy techniques to the decoding problem is not practical due to the complexity in calculating the probabilities for all $2^J$ codewords.

The BCJR algorithm provides an interesting approximation to minimum cross-entropy decoding. The BCJR algorithm determines the a posteriori symbol (or bit) probabilities not the a posteriori codeword probabilities. This is equivalent to calculating the marginal distributions for each bit given the codeword probabilities. This marginal distribution can be expressed as $$p[b(n)=1] = \frac{\sum_{b;b(n)=1} q[b]I_c(b)}{\sum_b q[b]I_c(b)} \quad (48)$$

This a posteriori symbol probability is the soft output value of the BCJR algorithm for each bit. If one restricts the problem to systematic codes, this provides a direct estimate of the transmitted bits and their associated reliability. A hard decision based on (48) is the maximum a posteriori symbol estimate, and provides the lowest probability of symbol error among all decoders.

The two theorems discussed above are extensible to the output of the BCJR algorithm. That is, if R(Y) represents the processing of the channel values by the BCJR algorithm to estimate the symbol probability then Theorem 2.4. For a given symbol the BCJR algorithm is lossless. That is, $$I(b(n);y)=I(b(n);R(y)). \quad (49)$$

Theorem 2.5. For a given symbol, the BCJR algorithm with only a subset of the onstraints is lossless. That is, $$I(b(n);y)=I(b(n);R_i(y)). \quad (50)$$

These lossless properties only apply to a given symbol. When applied at the codeword level, in general $$I(b;y)>I(b;R(y)) \quad (51)$$

that is, there is a loss of information with the BCJR algorithm. The only case when this is not true is when the b(n), knowing y are independent, that is, $$p[b|y] = \prod_{n=1}^{N} p[b(n)|y] \quad (52)$$

To minimize this loss of information, the codes used with the iterative decoding strategies below are designed to make the b(n) as independent as possible.

A drawback of the MCE decoding algorithm is its complexity. In particular, its complexity grows exponentially with the block size. This complexity issue is addressed in two ways: i) by using an iterative algorithm that only applies a subset of the constraints at a time, and ii) using the BCJR algorithm as an approximation to MCE decoding.

To understand the iterative approach conceptually, a geometric interpretation proves insightful. Let the F constraints (parity check equations) be partitioned into MW, not necessarily disjoint, subsets labeled $C_i$, i=1, . . . , M. The abbreviation $C_i$ is used to denote the three related concepts of i) a constraint subset, ii) those probability distribution functions which satisfy this constraint subset, and iii) those codewords that satisfy this constraint subset. A first geometric observation is that these constraint subsets are convex. Any two distributions, $\phi_1[b]$ and $\phi_2[b]$, which satisfy the constraint $E[f_i(b)]=0$. Let $\phi[b]=\delta\phi_1[b]+(1-\delta)\phi_2[b]$ result in $$E_\phi[f_i(b)] = \sum_X \phi[b]f_i(b) \quad (53)$$

$$= \delta\sum_b \phi_1[b]f_i(b) + (1-\delta)\sum_X \phi_2[b]f_i(b)$$

$$= 0$$

and thus the set of distributions, $C_i$, is convex.

The following iterative MCE algorithm is proposed.
i) set $p_0[b]=q[b]$, the a priori distribution.
ii) determine $p_{k+1}[b]$ as the MCE distribution corresponding to the a priori distribution $p_k[b]$ and the constraint set $C_v$, where v=k mod M+1.
iii) repeat step ii) until convergence occurs.

Figure 23:
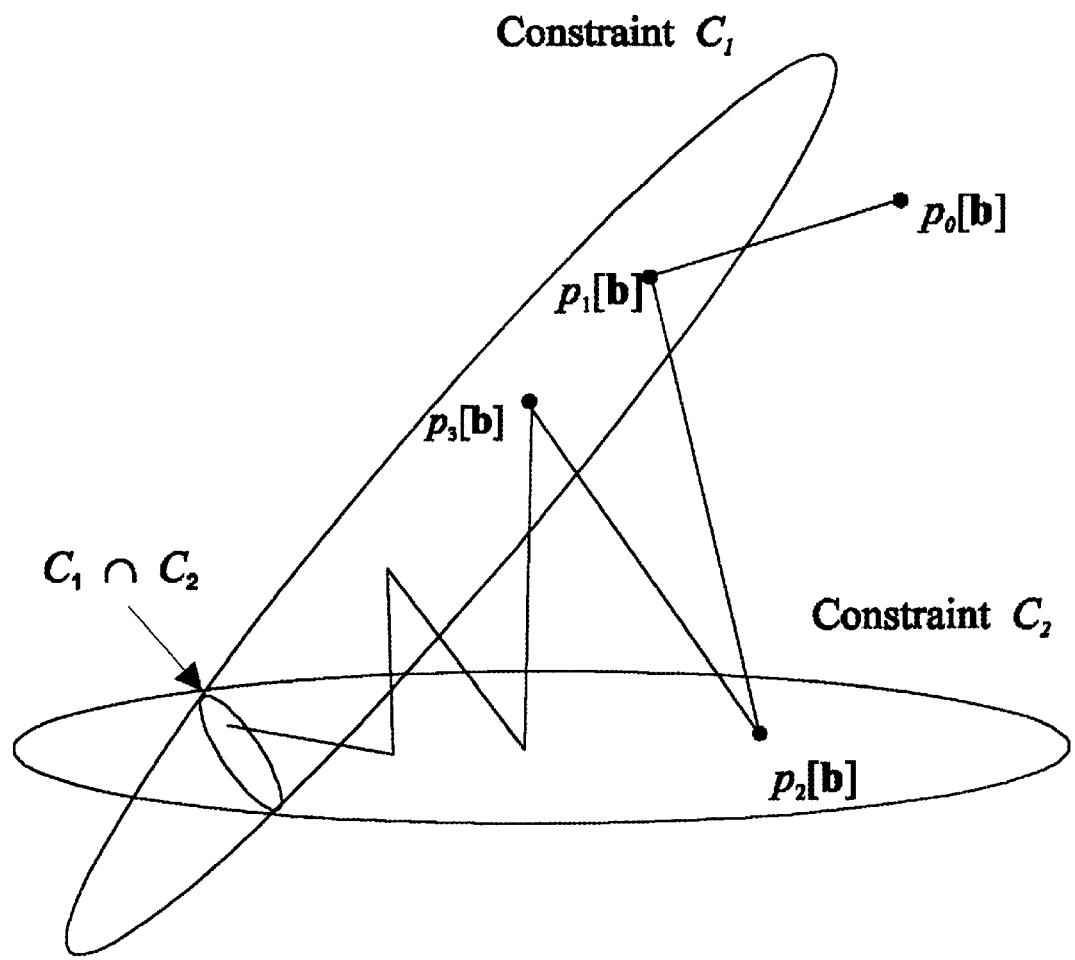
FIG. 23 is an illustration of iterative search between different constraint sets.

The "global" MCE distribution is that distribution which satisfies all the constraints and is "closest" to the a priori distribution, whereas a "local" MCE distribution only satisfies a particular constraint subset. This iterative algorithm is illustrated graphically in FIG. 23 for the case of two constraint subsets. The estimate distribution oscillates between two convex hulls representing those distributions, which satisfy the two respective constraint subsets. It eventually converges to a distribution that lies in the intersection of the two. Prior to convergence, the estimated distribution, $p_k[b]$, at any given step will, in general, only satisfy one constraint set. The convergence properties of this algorithm are covered by the following theorem.

Theorem 2.6 (Convergence of the iterative MCE algorithm). For the algorithm described above, the limit $$p_*[b] = \lim_{k\to\infty} p_k[b] \quad (54)$$

exists and $p_*[b]$ is the MCE distribution satisfying the fixed constraint set $$C = \bigcap_v C_v.$$

Proof: The MCE distribution $p_{k+1}[b]$ satisfies $$H[p_{k+1}, p_k] = \min_{s \in C_v} H[s, p_k]. \quad (55)$$

Given an a priori distribution $p_k$, the corresponding MCE distribution $p_{k+1}$ based on the constraint set $C_v$, and any other distribution $p_*$ satisfying $C_v$; these three distributions satisfy the triangle equality for MCE distributions. In particular, $$H[p_*, p_k] = H[p_*, p_{k+1}] + H[p_{k+1}, p_k]. \quad (56)$$

Since cross-entropy is non-negative, this implies $$H[p_*, p_k] \geq H[p_*, p_{k+1}], \quad (57)$$

and equality holds only if $p_{k+1}=p_k$. For a given k, this is true for any $p_*$ in the constraint set $C_v$. Assuming that $p_*$ is the unique global MCE distribution, the relation (57) is true for all k since $p_*$ lies in all the constraint sets. Since the cross-entropy in (57) is monotonically decreasing and is bounded below by zero, this implies that in the limit as k→∞

$$\lim_{k\to\infty} H[p_*, p_k] = c \quad (58)$$

where c is a nonnegative constant. This, in turn, implies that $$\lim_{k \to \infty} p_k = p_c \qquad (59)$$

for some fixed distribution $p_c$, otherwise the cross-entropy would not have converged. But then $p_c$ must be the MCE distribution for each constraint set. Consequently, $p_c = p_*$.

When cross-entropy methods are applied to a two-dimensional product code such as illustrated in FIG. 15, an a priori distribution q(X) determined from the channel samples, as described by (35) is used. Estimates of the a posteriori symbol probabilities for each horizontal codeword, constraint subset, are made. The resulting probabilities are used as an a priori distribution for processing each of the vertical codewords. The algorithm is repeated, making a number of horizontal and vertical passes, until convergence occurs. Convergence generally occurs quite quickly.

This iterative approach is analogous to the repeated application of constraint subsets in the iterative solution to the MCE problem. The key to this approach is the BCJR algorithm, which estimates the a posteriori symbol probabilities. That is, for each codeword it determines the marginal distributions of the MCE solution for the given constraint set, analogous to (48), rather than the complete distribution, analogous to (40). This is equivalent to finding the MCE solution for the given a priori distribution and the constraint subset for a particular codeword, but with the additional constraint that the resulting symbol probabilities are independent.

It is the introduction of this additional constraint or independence assumnption that makes the algorithm suboptimum. Unlike the other constraints (parity check equations) that are time-invariant, the constraint corresponding to the independence assumption is time-varying, that is, at stage k, the constraint depends on $p_{k-1}$. The independence assumption has two important consequences. Firstly, it simplifies significantly the calculation of the MCE distribution. Secondly, it is an approximation and as such it results in some degradation in performance.

It is difficult to quantify the amount of degradation that is to be expected with this additional assumption. However, it depends upon the encoding strategy and the choice of the constraint subsets used in the decoding. A major advantage of the product code structure is that when choosing constraint subsets corresponding to the horizontal and vertical parity check equations, then the independence assumption is valid for the first and second decodings (D decodings in a D-dimensional product code). TIhe assumption is not true on subsequent decodings but it is likely approximately true given the good performance of these techniques.

Turbo codes involve a use of recursive systematic codes, random interleavers, and a modified version of the iterative detection algorithm. Initially, it was thought that the function of the random interleavers was to provide approximate independence between the different stages of the decoding process. It was later found that this was only one function of the random interleavers. In addition, they also reduce the coefficient of the dominant error event. This explains why random interleavers work significantly better than block interleavers in the present application.

Figure 24:
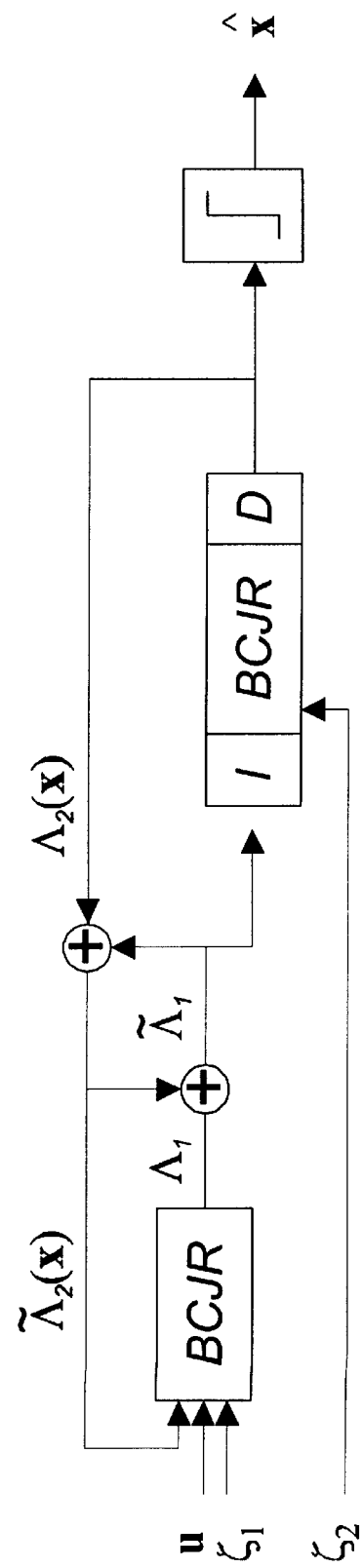
FIG. 24 is an illustration of Turbo detection algorithm showing difference operations and the interleaver (I) and de-interleaver (D) operations.

Referring to FIG. 24, the difference operations performed on the log-likelihoods directly are shown. In addition, the interleaver and de-interleaver are juxtaposed with the second stage BCJR algorithm. This emphasizes the parallel nature of the code, and how the interleaver/de-interleaver pair provides a different second code or constraint set in MCE termninology.

Figure 25:
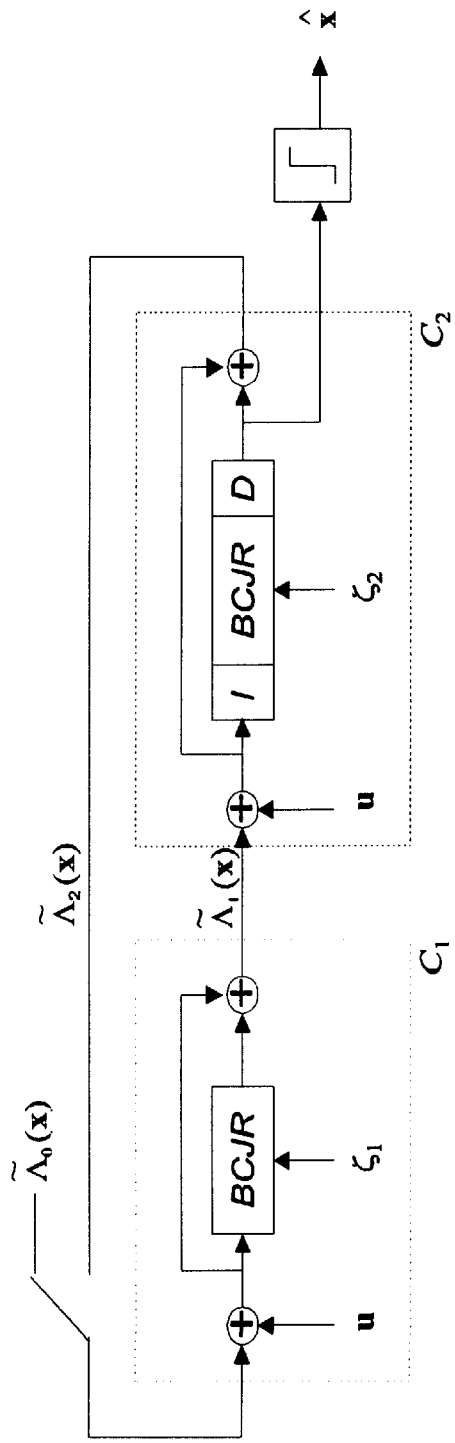
FIG. 25 is an illustration of extrinsic form of the Turbo detection algorithm.

Another form of the Turbo detection algorithm is shown in FIG. 25. This is referred to herein as exirinsic form of the Turbo detection algorithm. This is equivalent to the block diagram of FIG. 24. However, it shows the symmetry between the two stages, and also shows that only the extrinsic information, Λ, is passed between the two stages. The channel samples are fixed inputs to the two decoding stages. This extrinsicform emphasizes the fact that the objective of the iterative decoding is only to increase the extrinsic information associated with the data.

This alternative representation of the Turbo detection algorithm suggests a modified cross-entropy minimization algorithm. When the BCJR algorithm in FIG. 25 is replaced by the true MCE algorithm for the given constraints and $p_k[b]$ represents the probability distribution at the output of the kth iteration of the MCE algorithm the following is known. Recall that the output distribution of the MCE algorithm has the form $$p_k[b] = q_k[b] g_k(b), \qquad (60)$$

where $q_k[b]$ is the a priori distribution, and $g_k(b)$ has the form $$g_{ki}(b) = \exp\left\{-\mu_o - \sum_{f_k \in C_v} \mu_k f_k(b)\right\} \qquad (61)$$

where the summation is over the constraints in the constraint set $C_v$, where v=k modulo M. Computing the difference between the logarithm of the input and the output of the MCE stage $$\tilde{\Lambda}_k(b) = \log p_k[b] - \log q_k[b] \qquad (62)$$
$$= \log g_k(b)$$

corresponds to the extrinsic information obtained from the kth iteration of the algorithm. Let $q_0[b]$ be the a priori distribution for b∈B corresponding to the channel samples. Then, the a priori distribution for the kth stage is $$q_k[b] = q_0[b] g_{k-1}(b)/\eta_k \qquad (63)$$

that is, the combination of the a priori information from the channel and the previous stage's extrinsic information. The parameter $\eta_k$ is a normalization constant. The following corollary to Theorem 4.6 results.

Corollary 1.1 (Convergence of the modified MCE algorithm). The sequence of distributions $\{p_k[b]\}$ produced with the modified MCE algorithm using the a priori distributions $$q_k[b] = q_0[b] g_{k-1}(b)/\eta_k \qquad (65)$$

where $\eta_k$ is a normalization constant, is identical to the sequence of distributions produced with the a priori distributions $$q_k[b] = p_{k-1}[b]. \qquad (65)$$

In particular, there is asymptotic convergence of the modified algorithm to the global MCE distribution $p_*[b]$.

Figure 26:
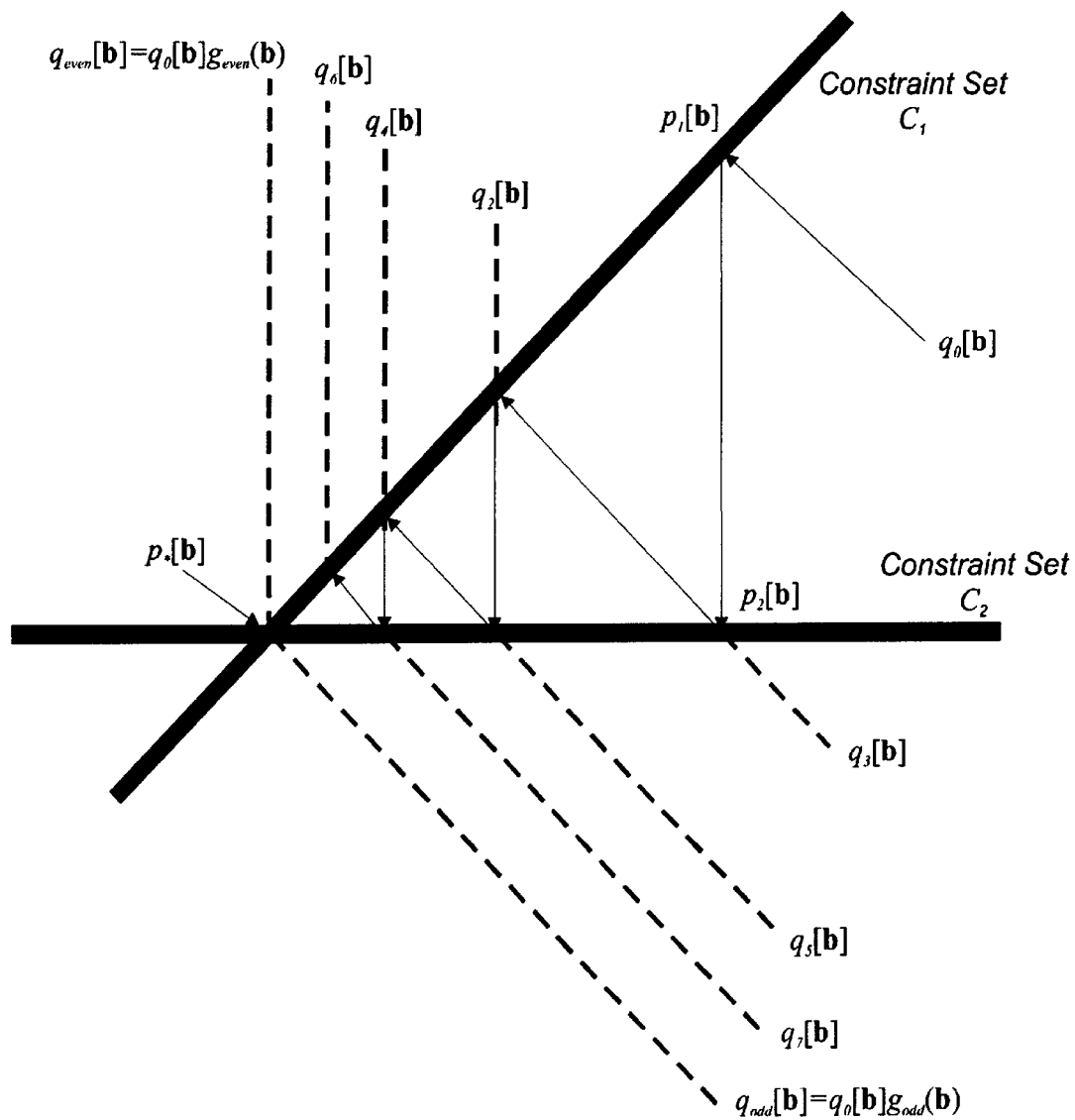
FIG. 26 is an illustration of a geometric interpretation of the modified MCE algorithm.

This modified algorithm can also be interpreted geometrically. TIhe space of probability distributions on B with cross-entropy as the measure is not a metric space. However, it does have some geometric similarities to Euclidean space. In particular, the triangle equality for minimum cross-entropy distributions is analogous to the Pythagorean theorem in Euclidean space. The triangle equality for cross-entropy implies that $$H[r,q_0]=H[r,p_1]+H[p_1,q_0] \qquad (66)$$

for any distribution $r[b]$ that satisfies the constraint set $C_1$. Equation (66) has obvious similarities to the Pythagorean theorem. Thus, in a sense, the line joining $q_0[b]$ and $p_1[b]$ is "orthogonal" to the constraint set $C_1$. That is, orthogonal in a cross-entropy sense not a Euclidean sense. As illustrated in FIG. 26, the first two steps of the modified algorithm are identical to the original algorithm and result in $p_2[b]$.

Similarly, the line joining $p_1[b]$ and $p_2[b]$ is "orthogonal" to the constraint set $C_2$. The a priori distribution for the third step is $p_2[b]$ "minus" the information obtain in the first step, that is, $p_1[b]-q_0[b]$. In FIG. 26, the "minus" operation in the vector sense is illustrated as if it were a Euclidean space. However, the resulting distribution $q_3[b]$ is "collinear"with $p_2[b]$ and $p_3[b]$, since the corollary showed that both $p_2[b]$ and $q_3[b]$ have the same "orthogonal" projection (MCE distribution) on $C_1$.

For the case of two constraint sets, the global MCE distribution can be written as $$p.[b]=q_0[b]g_{odd}(b)g_{even}(b) \qquad (67)$$

where $g_{odd}(b)$ is that portion of the MCE distribution due to the constraints $C_1$, and $g_{even}(b)$ is that portion due to $C_2$. As FIG. 26 illustrates, the interim a priori distributions are estimates of these quantities, in particular, $$q_{2k}[b]=q_0[b]g_{2k-1}(b) \to q_0[b]g_{odd}(b) \qquad (68)$$

and $$q_{2k+1}[b]=q_0[b]g_{2k}(b) \to q_0[b]g_{even}(b) \qquad (69)$$

In this sense, the modified algorithm is trying to independently estimate the contributions of the two constraint sets to the global solution.

The above is the general form for the modified algorithm. In certain circumstances it can be simplified, in particular, for a parallel concatenated coding strategies as illustrated in FIG. 14 and used in the Turbo coding strategy. Recall the partition of the vector $b \in B$ into $(x, z_1, z_2)$ where $x$ represents the systematic bits, and $z_1$ and $z_2$ represent the parity bits corresponding to the two encoders. The first observation is that for a memoryless channel $$q_0[b]=q_0[x]q_0[z_1]q_0[z_2]. \qquad (70)$$

Next consider the third stage of the algorithm where the a priori distribution for the modified algorithm is $$q_3[b] = q_0[b]g_2[b]/\eta_3 \qquad (71)$$
$$= q_0[x]q_0[z_1]q_0[z_2]g_2(x, z_2)/\eta_3$$
$$= q_3[x, z_1, z_2]$$

where the second line follows because the constraint set $C_2$ does not depend upon $z_1$ and thus the extrinsic information can only depend on $x$ and $z_2$. The next step of the algorithm represents a MCE projection onto $C_1$. Consequently, it is only the dependence of this a priori distribution on $x$ and $z_1$ that will have a bearing upon the MCE projection. That is, to obtain $p_3[b]$, we only use that portion of $q_3$ that depends on $x$ and $z_1$ since $C_1$ does not depend upon $z_2$. In fact, if we use as the a priori distribution $$q_3[x, z_1] = \sum_{z_2} q_3[x, z_1, z_2] \qquad (72)$$

it follows that the local MCE distribution is then $$p_3[x, z_1] = \sum_{z_2} p_3[x, z_1, z_2]. \qquad (73)$$

Consequently, the corresponding extrinsic information $$g_3(x, z_1) = \frac{p_3[x, z_1, z_2]}{q_3[x, z_1, z_2]} = \frac{p_3[x, z_1]}{q_3[x, z_1]} \qquad (74)$$

for the next step is unchanged and, thus, neither is the algorithm. The same argument applies for each iteration k. That is, at each iteration, the a priori distribution need only depend on the initial distribution for the systematic bits $q_0[x]$ and the parity bits relevant for this iteration $q_0[z_v]$, as well as the extrinsic information about the systematic bits obtained from the previous stage, $g_{k-1}(x, z_{v-1})$.

It appears that when using the approximate MCE algorithm, performance is much better with the modified algorithm structure. Heuristically, it is because it improves the independence from one stage to another.

The differences between the modified MCE detection algorithm and the Turbo detection strategy are i) the Turbo algorithm assumes $g_{k-1}(x,z_{v-1})=g_{k-1}(x)g_{k-1}(z_{v-1})$. With this separation of the extrinsic information for the systematic and parity bits, only the first factor $g_{k-1}(x)$ has to be carried forward to the next stage. And, ii) the Turbo algorithm assumes that $$g_{k-1}(x) = \prod_{j=1}^{J} g_{k-1}(x(j)) \qquad (75)$$

and this assumption allows replacement of the calculation of the local MCE distribution with the BCJR algorithm.

Cross-entropy can also be useful as a stop criterion in the decoding process. For example to achieve the best performance with Turbo codes may require up to eighteen or more iterations, but the vast majority of the received codewords require only a handful of iterations while a very few require the full complement. Cross-entropy has been shown empirically to be a useful criteria for distinguishing between these cases, and can result in a significant computational saving.

The idea behind the stop criteria is to estimate the cross-entropy between the distributions corresponding to consecutive iterations of the decoding process. This can be expressed as $$E_{p_k[b]}\left[\log \frac{p_k[b]}{p_{k-1}[b]}\right] \approx \sum_i E_{p_k[b(n)]}\left[\log \frac{p_k[b(n)]}{p_{k-1}[b(n)]}\right], \qquad (76)$$

assuming statistical independence of the symbol probabilities. This empirical estimate of the cross-entropy of successive pairs of distributions is compared to a threshold. Whenever the cross-entropy drops below the threshold, indicating little change in the distribution from one iteration to the next, the process is stopped. Simulations have indicated that cross-entropy drops quite dramatically at convergence, indicating that no more errors can be corrected, and this test provides an excellent stop criteria.

Multiuser detection (MUD) is described below. A problem arises in radio communications where, due to limited spectrum, reuse of a spectrum as frequently as possible to increase capacity is desirable. Spectrum reuse often implies interference between the signals of different users. Multiuser detection is one method of reducing the effect of this interference and potentially increasing system capacity.

Code division multiple access (CDMA) is often proposed as a method for sharing spectrum among several users. The conventional approach to detection in a CDMA system is to demodulate each user's signal as if it were the only one present. The detection of the desired signal is protected against the interference due to the other users by the inherent interference suppression capability of CDMA. There are two limitations to this approach.

i) All users interfere with all other users and the interference adds to cause performance degradation. This is minimized by keeping the cross-correlations between users low but there is a limit to what can be achieved in this area.

ii) In many applications there is a serious near/far problem such that high signal levels can swamp lower power users. This can imply the need for tight power control. One way around these limitations is to employ multiuser detection techniques. However, CDMA is not the only potential application of these techniques. Multiuser detection techniques are particularly attractive on the return link of any point-to-multipoint applications, e.g., at the base station of a cellular system, where all user waveforms are known; there is co-channel or adjacent channel interference; and it is required to detect all users.

A general model for multiple access communications is the following. Assuming there are users simultaneously accessing the same communications channel each using a modulating waveform $s_k(t)$ with a symbol period T. Without loss of generality we assume binary signaling with the kth user's channel bit at time i is represented by $b_k(i)$. These signals are combined in the following manner $$S(b, t) = \sum_{i=1}^{N} \sum_{k=1}^{K} b_k(i) w_k s_k(t - iT + \tau_k), \quad (77)$$

$$b \in R^{K \times N}$$

where the messages of the K users are assumed to be N bits long. The parameters $\{\tau_k\}$ represent the relative transmission delays of the different users. Without loss of generality, it is assumed that the delays are ordered, $0 < \tau_1 < \tau_2 < \ldots < \tau_K < T$. For the synchronous case, $\tau_1 = \ldots = \tau_K = 0$. The modulating waveforms, $s_k(t)$, are assumed to be normalized to unit energy, and relative received amplitude levels of the different users are characterized by the positive parameters $\{w_k\}$. For the case of equal power users, $w_1 = w_2 = \ldots = w_K = 1$ is assumed. The vector of bits at symbol interval i is represented by $b(i) \in \{-1, +1\}^K$, and the collection of all bits over M symbol periods is represented by the matrix $b \in \{-1, +1\}^{K \times N}$. The extension of the following to non-binary signaling is straightforward.

With an additive white Gaussian noise channel the corresponding received signal is $$r(t) = S(b, t) + n(t). \quad (78)$$

The noise process, n(t), is a zero-mean white Gaussian process with spectral density $N_0$. This model is applied to a variety of multiple access systems including frequency division multiple access (FDMA) and CDMA. With FDMA, the modulating waveforms are essentially the carrier frequencies. Any pulse shaping that is performed will also be part of the modulating waveform. With CDMA the modulating waveforms correspond to the spreading code assigned to each user. The latter application is where multiuser detection is most often considered because the modulating waveforms are less orthogonal.

Assuming the modulating waveform of each user is known at the receiver, and that the K-user coherent receiver locks to the signaling interval and phase of each active user, when the additive noise is a white Gaussian random process, the conditional probability density function, p(r|b), is proportional to the likelihood function, L(b), defined as $$L(b) = \exp\left\{-\frac{1}{N_0} \int_{T_0} |r(t) - S(b, t)|^2 dt\right\} \quad (79)$$

where $T_0$ is the observation interval. Assuming the transmitted bits are equiprobable bits, the maximum likelihood estimate of the data is that b which minimizes L(b). In particular, b is selected to minimize the log-likelihood $$\Lambda_L(b) = \|r(t) - S(b, t)\|^2 \quad (80)$$

$$= \int_{-\infty}^{\infty} \left(|r(t)|^2 - 2\text{Re}[r(t)S^*(b, t)] + S(b, t)S^*(b, t)\right) dt$$

The integral of first term of this expansion is a constant that is independent of the estimate b, and thus does not affect the minimization. When $$y_k(i) = \int_{-\infty}^{\infty} \text{Re}[r(t) s_k^*(t - iT - \tau_k)] dt \quad (81)$$

so that the yk(i) is the output of a filter matched to the modulating waveform, then the integral of the second term in the expansion of (80) reduces to $$\int_{-\infty}^{\infty} 2\text{Re}[r(t)S^*(b, t)] dt = 2 \sum_{i=1}^{N} \sum_{k=1}^{K} b_k(i) w_k y_k(i) \quad (82)$$

$$= 2 \sum_{i=1}^{N} y(i)^T W b(i)$$

where $W \in R^{K \times K}$ is the diagonal matrix with entries $W_{kk} = w_k$; and $y(i) = (y_1(i), y_2(i), \ldots y_K(i))^T \in R^K$ is the vector of matched filter outputs. For the third term of the expansion, define the klth entry in the cross-correlation matrix $H(i) \in R^{K \times K}$ by $$(H(i))_{kl} = \int_{-\infty}^{\infty} \text{Re}[s_k(t - iT - \tau_k) s_l^*(t - \tau_l)] dt \quad (83)$$

and then the third integral in the log-likelihood function can be written as $$\int_{-\infty}^{\infty} S(b, t) S^*(b, t) dt = \sum_{i=1}^{N} \sum_{j=1}^{N} \sum_{k=1}^{K} \sum_{l=1}^{K} b_k(i) b_l(j) w_k w_l (H(i-j))_{kl} \quad (84)$$

$$= \sum_{i=1}^{N}\sum_{j=1}^{N} b(i)^T WH(i-j)Wb(j)$$

From (80), (82) and (84), maximum likelihood detection is equivalent to choosing b to minimize the log-likelihood function $_L$log (b), that $$\hat{b} = \underset{b \in \{-1,+1\}^{K \times M}}{\arg\min} \Lambda_L(b) = \underset{b \in \{-1,+1\}^{K+M}}{\arg\max} \Omega_L(b) \quad (85)$$

where the modified log-likelihood, that ignores the constant term, is given by $$\Omega(b, y) = 2\sum_{i=1}^{M} 2y(i)^T Wb(i) - \sum_{i=1}^{M}\sum_{j=1}^{M} b(i)WH(i-j)Wb(j) \quad (86)$$

This is a relatively complex expression that can be made muchimpler under a variety of circumstances. The only dependence of the optimum estimate on the received signal is through the matched filter samples, y(i). Thus, the vector of matched filter outputs y(i) form a set of sufficient statistics for this problem. The presence of the delay term $\tau_k$ in (81) implies that the matched filtering is individually synchronized for each user.

In general, the samples corresponding to the kth matched filter $\{y_k(i): i=1 \ldots N\}$ are not sufficient statistics for the detection of the corresponding data $\{b_k(i)=1 \ldots N\}$. However, the complete samples $\{y(i): i=1 \ldots N\}$ do form a set of sufficient statistics for determining $\{b(i): i=1 \ldots N\}$.

The minimization of $\Omega$(b), given by (5–10), is a non-trivial problem. The brute force approach is a combinatorial problem that requires evaluating the above integral over all $|A|^{K \times N}$ possible symbol matrices where A=$\{-1,+1\}$ is the symbol alphabet. Analysis indicates that any solution has a complexity which is exponential in the number of users; however, simplification occurs under various assumptions.

In the synchronous case, all of the relative delays $\{\tau_k\}$ are zero. Assuming that the cross-correlation between modulating waveforms in adjacent symbol intervals is zero, that is, H(i)=0 for |i|>0 by, for example, assuming that the modulating waveform is zero outside the symbol interval, i.e., $s_k(t) \in R[0,T]$ results in Nyquist modulation of waveforms having similar cross-correlation characteristics.

From (77), (78) and (81), the output of the bank of matched filters for a synchronous system can be represented as by the equivalent discrete time system $$y(i)=H(0)Wb(i)+n(i) y(i),b(i),n(i) \in R^K \quad (87)$$

where vector n(i) is a set of zero-mean correlated noise samples with $$n_k(i) = \int_{-\infty}^{\infty} \mathrm{Re}[n(t)s_k^*(t-iT-\tau_k)]dt. \quad (88)$$

Figure 27:
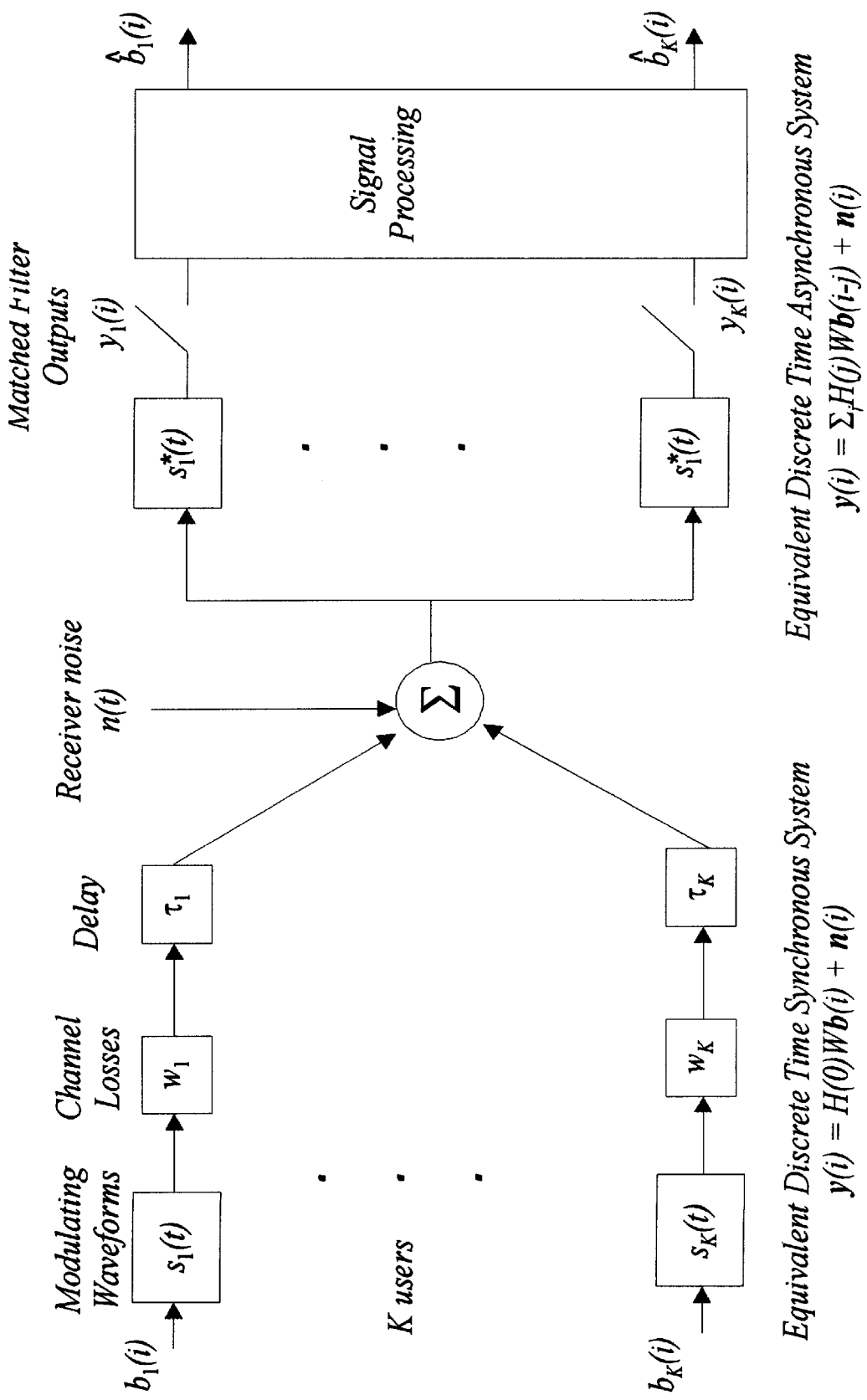
FIG. 27 is an illustration of structure of multiuser communication system.

Assuming noise, n(t), is white, it follows from (88) and (83) that $E[n(i)n(j)^T]=\sigma^2 H(0)\delta(i-j)$. Thus, the system has an equivalent discrete structure, which is described by (87) and illustrated in FIG. 27.

Under these assumptions, the modified log-likelihood function reduces to $$\Omega_s(b, y) = \sum_{i=1}^{N} (2y(i)Wb(i) - b(i)^T WH(0)Wb(i)) \quad (89)$$

and, since the matched filter samples are independent from one symbol period to next, the maximization of (89) can be reduced to the independent maximization of each of the terms in the sum. That is, $$\hat{b}(i) = \underset{b \in A^K}{\arg\max} \{2y(i)Wb - bWH(0)Wb\} \quad (90)$$

While this is a considerably simpler problem to solve, its complexity is still exponential in the number of users.

If the symbol alphabet was analog finding b to maximize (89) or (90) would be equivalent to mean square estimation. In fact, one suboptimum solution to this problem is to use the sign of the mean square estimate, as the data estimate. However, with a discrete symbol alphabet, the optimum solution of (89) or (90) is a combinatorical problem of searching over the $2^K$ possible values for each b(i). The above is only optimum assuming adjacent symbols are independent. If there is a correlation between adjacent symbol periods, for example, due to FEC coding then the optimum solution will be similar to the asynchronous case.

As a point of comparison, the conventional detector simply takes the sign of the bits at the output of the matched filter, that is, $$\hat{b}(i)=\mathrm{sign}\{y(i)\} \quad (91)$$

where the sign(.) operator is applied on an element by element basis. This approach is of much lower complexity than the optimum approach but clearly relies on low cross-correlations, that is, H(0) should be approximately diagonal, for good performance.

In the asynchronous case, it is no longer assumed that the relative delays of all users are zero. Without loss of generality, it is assumed that the time delays are ordered such that $0<\tau_1<\tau_2<\ldots<\tau_k<T$. It is also generally assumed that the modulating waveforms are zero outside of the symbol interval. This implies that the cross-correlation matrices H(i)=0 for |i|>1. The corresponding discrete time representation is $$y(i)=H(-1)Wb(i-1)+H(0)Wb(i)+H(1)Wb(i+1)+n(i) \quad (92)$$

which illustrates the dependence of the current output on the preceding and following symbols due to their overlap. If H(i)≠0 for |i|>1 then (84) can be augmented in the obvious manner to show the dependence on more distant symbols.

The noise process in the above is correlated both at each transition and between transitions according to $$E[n(i)n(j)^T]=\sigma^2 H(i-j) \quad (93)$$

Under these conditions, the modified log-likelihood function is given by $$\Omega_a(b, y) = \sum_{i=1}^{N} \begin{pmatrix} 2y(i)^T Wb(i) - b(i)^T WH(-1)Wb(i-1) \\ -b(i)WH(0)Wb(i) \\ -b(i)WH(1)Wb(i+1) \end{pmatrix} \quad (94)$$

where it is assumed the end terms, b(0) and b(M+1), are either zero or known. Relative to the synchronous case, the asynchronous case has two extra terms corresponding to the overlap between adjacent bits.

Figure 28:
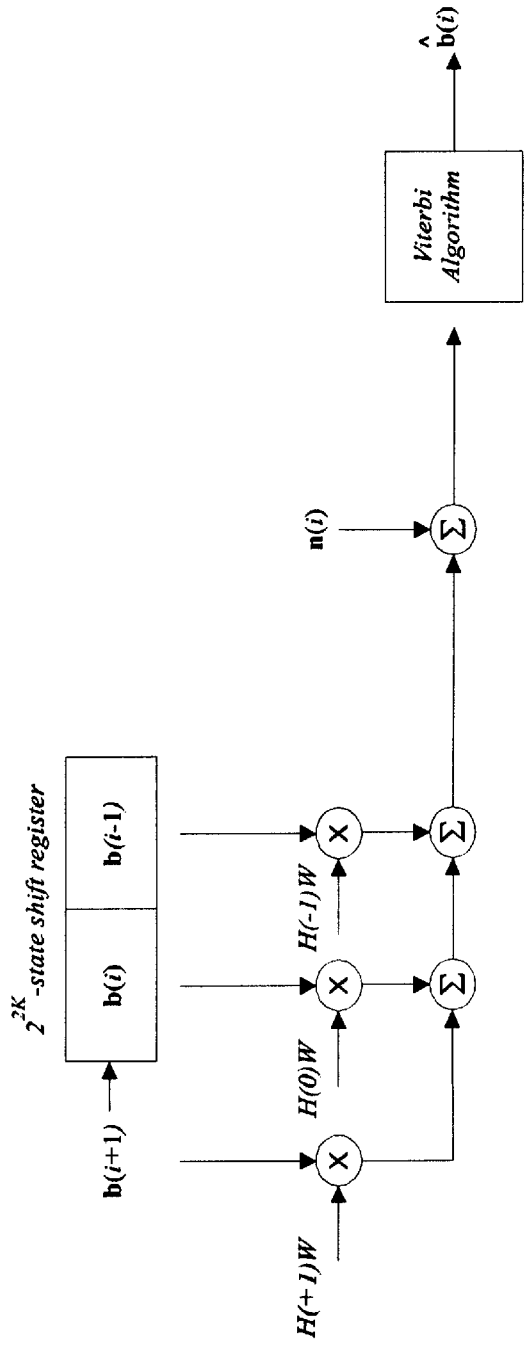
FIG. 28 is an illustration of a finite-state machine representation of multi-user channel with Viterbi detection.

The asynchronous multiuser detection problem is a generalization of the intersymbol interference problem. It is known to derive a (matrix) whitening filter for y(i) in the general asynchronous case, such that the resulting noise vector is white. This is a precursor to equalizer desion for the present problem. A multi-user channel is modellable as a linear finite-state machine, as shown on the left-hand side of FIG. 28, similar to a convolutional encoder. This is a $2^{2K}$ state machine driven by the symbol vectors and with the outputs weighted by the cross-correlation matrices as indicated by (92).

Given the analogy to convolutional encoding. it is clear that dynamic programming such as the Viterbi algorithm is an appropriate method for solving the problem. When $\Omega_a(x(m),m)$ is the maximum cumulative metric overall sequences of length m ending in state $x(m)=(b(m),b(m+1))$ where $x(m)$ ranges over possible $2^{2K}$ bit combinations of $(b(m),b(m+1))$, then $$\Omega_a(x(m), m) = \max_{x(m-1)} \{\Omega_a(x(m-1), m-1) + \phi(x(m-1), x(m), m)\} \quad (95)$$

where $\phi(x(m-1),x(m),m)$ is the branch metric for the transition from state $x(m-1)$ to $x(m)$ with input $y(m)$ and is given by (assuming the transition is permitted)

$$\phi(x(m-1), x(m), m) = 2y(m)^T W b(m) \quad (96)$$
$$-b(m)WH(-1)Wb(m-1)$$
$$-b(m)WH(0)Wb(m)$$
$$-b(m)WH(1)Wb(m+1).$$

The maximum likelihood sequence is the sequence $\{b(i), i=1 \ldots M\}$ corresponding to the maximum metric $\Omega_a(x(M),M)$. The Viterbi algorithm would have $2^{2K}$ states, and thus would only be appropriate for relatively small systems. The computation of (96) is not as onerous as it first appears because the last three terms are constants, which depend only on the state and not the received signal. Thus they are often precomputed and stored.

$H(-1)=H^T(1)$ and consequently, the log-likelihood function in (86) can be rearranged and written as $$\hat{b} = \arg\max_{b \in A^{K \times M}} \left\{ \sum_{i=1}^{M} (2y_i^T W b_i - b_i WH(0) W b_i - 2b_i WH(1) W b_{i-1}) \right\} \quad (97)$$

with the appropriate end conditions. With this decomposition of the log-likelihood function, the metric at each step, the internal expression, depends only 2K bits and not 3K bits as in (95). This corresponds to a Viterbi algorithm with $2^K$ states and with a time-complexity per bit of $O(4^K/K)$. A second decomposition of the log-likelihood function wherein time steps do not correspond to symbol intervals but rather to the intervals $[lT+\tau_i, lT+\tau_{i+1})$ has been proposed. Over such intervals, the contribution to the overall metric (86) depends only on K bits, and there are only two branches per transition. This corresponds to a finite state machine with $2^{K-1}$ states. The previous algorithms were based on a time-invariant trellis with one transition per symbol period. An alternative prior art approach corresponds to a periodic time-varying trellis with K transitions per symbol period. This latter approach reduces the number of states in the Viterbi algorithm to $2^{K-1}$ and the time complexity per bit to $O(2^K)$. However, even this further reduction in complexity is not sufficient to make it practical for large scale systems.

The efficiency of a detector is defined as the ratio between the required SNR in the multiuser system to the required SNR in an equivalent single user system having the same bit error rate. The limit of the efficiency as the background Gaussian noise level goes to zero is the asymptotic efficiency. It characterizes the underlying performance loss when the dominant impairment is the existence of other users rather than additive channel noise. Asymptotic efficiency is analogous to asymptotic coding gain. Asymptotic coding gain represents the power gain relative to an uncoded system as the SNR becomes large. Asymptotic efficiency is the gain (loss) relative a single user system as the SNR becomes large. Both are directly related to the minimum distance of the signaling waveforms. With the former it corresponds to the free distance, $d_{free}$, of the forward error correction code. With the latter, it corresponds to $d_{k,min}$, the normalized minimum distance between any two K-dimensional sequences: ${}^k b^1, {}^k b^2 \in B$; where ${}^k b^1$ and ${}^k b^2$ differ in at least the subsequence corresponding to the kth user, that is, $$d_{k,min}^2 = \min_{{}^k b^1, {}^k b^2 \in B} \frac{1}{4} \int_{-\infty}^{\infty} |S({}^k b^1, t) - S({}^k b^2, t)|^2 dt \quad (98)$$

If the channel was symmetric, that is, if all the cross-correlations and channel losses are identical then there would be no dependence upon k, and $d^2_{min}$, would be the minimum distance between any two distinct K-dimensional sequences: $b^1, b^2 \in B$. In [Ver86a], Verdú showed that with the optimal detector the asymptotic probability of error of the kth user, $P_k$, is approximately $$P_k \approx Q(d_{k,min}/\sigma) \quad (99)$$

where the Q function is given by $$Q(x) = \frac{1}{\sqrt{2\pi}} \int_x^{\infty} e^{-v^2/2} dv. \quad (100)$$

This result applies to both synchronous and asynchronous detectors. The design objective is to choose the waveforms such that $d_{k,min}$ is as large as possible. The maximum achievable asymptotic efficiency of the kth user is given by $$\eta_k = d^2_{k,min} \quad (101)$$

For uncoded signals, an asymptotic efficiency of 1 implies the same BER performance as in a single user channel. An asymptotic efficiency of zero does not necessarily imply an error floor but it does imply that the asymptotic slope of the performance curve is less than that of the single user case.

For a synchronous channel with symmetric users and an optimal detector, asymptotic efficiency is given by $$\eta = \min_{\varepsilon \neq 0} \sum_{n=1}^{N} \varepsilon(n)^T WH(0) W\varepsilon(n) \quad (102)$$

where the minimum is over all non-zero error sequences $\{\varepsilon(n) \in \{-1,0,+1\}^K, n=1 \ldots N\}$.

Near-far resistance is defined as the asymptotic efficiency minimized over the energies of all interfering users. If this minimum is non-zero and, as a consequence, the performance level is guaranteed no matter how powerful the multiuser interference and the detector is near-far resistant. The kth user near-far resistance in a synchronous channel is the square of the distance of the kth user signal to the space spanned by the signals of the interfering users. There is similar interpretation in the asynchronous case except that time-shifted versions of the modulating waveforms, $s_k(t-\tau_k)$, for $0<\tau_k<T$ are also considered.

The optimum MUD has potentially very good performance but its complexity limits its practicality. Matched filters' output can be represented as $$y(i)=H(0)Wb(i)+n(i) \qquad (103)$$

The conventional single user receiver with binary signaling simply takes the sign of the output of the matched filter $$\hat{b}(i)=\text{sign}(y(i)) \qquad (104)$$

where the sign( ) operator is applied to each of the elements of the vector y(i). This receiver works well when the cross-correlations between the users is low. However, when the cross-correlations are not low or there is a significant power differential between users then performance is often poor. The term linear receivers refers to receivers which estimate the data based on a linear transformation of the output of the matched filters, that is, $$\hat{b}(i)=\text{sign}(Ty(i)) \qquad (105)$$

In the absence of noise and assuming all users are independent, the obvious approach is to apply the inverse transformation $T=(H(0)W)^{-1}$. This detector has some interesting properties. This detector does not require knowledge of the energies of any of the active users. To prove this, note that $$\begin{aligned}\text{sign}\{Ty(i)\} &= \text{sign}\{W^{-1}H(0)^{-1}y(i)\} \\ &= \text{sign}\{H(0)^{-1}y(i)\}\end{aligned} \qquad (106)$$

since W is a positive diagonal matrix of the channel gains. Therefore, the same decisions are obtained by multiplying the matched filter outputs by the inverse of the normalized cross-correlation matrix, and are thus independent of power level. It has been shown that this decorrelating detector is the optimum maximum likelihood synchronous detector when the energies of the individual users are not known by the receiver. This also assumes that H(0) is invertible.

In the general case, the decorrelating detector is given by $$\hat{b}(i)=\text{sign}(H(0)^1 y(i)) \qquad (107)$$

where $H(0)^1$ is a member of the set of generalized inverses of the cross-correlation matrix H(0). This set of detectors has the following properties:
  i) if user k is linearly independent, then its asymptotic efficiency is independent of both the energy of the other users and the specific generalized inverse selected; and
  ii) the near-far resistance of the decorrelating detector equals that of the optimum multiuser detector.

For certain conditions on the energy levels, the decorrelating receiver is actually optimum.

For the case of two users, explicit expressions for the asymptotic efficiency of the various detectors as a function of the power ratio of the two users, $w_2/w_1$, and their normalized cross-correlation $H_{12}(0) \equiv \rho$ have been derived. For the optimum detector the asymptotic efficiency is given by $$\eta_1 = \min\left\{1, 1+\left(\frac{w_2}{w_1}\right)^2 - 2|\rho|\frac{w_2}{w_1}\right\} \qquad (108)$$

With the optimum detector, as the interferer grows in relative strength the asymptotic efficiency approaches 1 which corresponds to the single user case. Intuitively, the stronger an interferer, the more accurately the interference can be estimated and removed from the desired signal. However as the asymptotic efficiency of the first user improves, the asymptotic efficiency of the second user degrades.

For the conventional detector, the two-user asymptotic efficiency is given by $$\eta_1 = \max^2\left\{0, 1-|\rho|\frac{w_2}{w_1}\right\}. \qquad (109)$$

The asymptotic efficiency of this detector clearly approaches zero as the relative power of the interference increases.

For the decorrelating detector, the two-user asymptotic efficiency is given by $$\eta_1 = 1-\rho^2. \qquad (110)$$

As indicated before the asymptotic efficiency of the decorrelating detector is independent of the signal energies of the different users. This not only implies symmetric asymptotic efficiencies for both users but illustrates the near-far resistance of the decorrelating receiver.

The asymptotic efficiency of the optimum linear detector is a combination of the performance of the optimum detector for low interference powers and the performance of the decorrelating detector for high interference powers. It is given by $$\eta_1 = \begin{cases} 1 - 2|\rho|\frac{w_2}{w_1} + \left(\frac{w_2}{w_1}\right)^2 & \text{if } \frac{w_2}{w_1} < \rho \\ 1-\rho^2 & \text{otherwise} \end{cases} \qquad (111)$$

Figure 29:
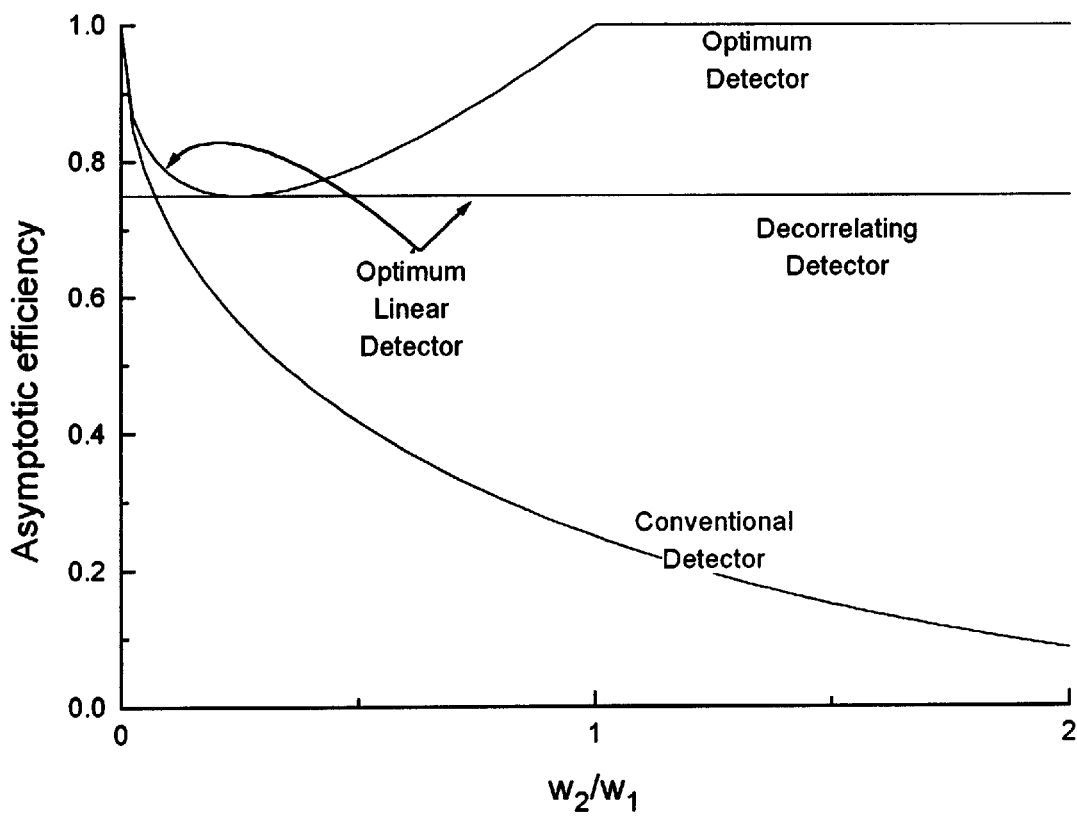
FIG. 29 is a graph of asymptotic efficiencies for various detectors with two users having a correlation $\rho=0.5$.

Not only is the asymptotic efficiency of the optimum linear detector identical to the decorrelating detector for high interference but the detector is identical as well. The asymptotic efficiencies of these four detectors are shown graphically in FIG. 29 for the case $\rho=0.5$.

Figure 30:
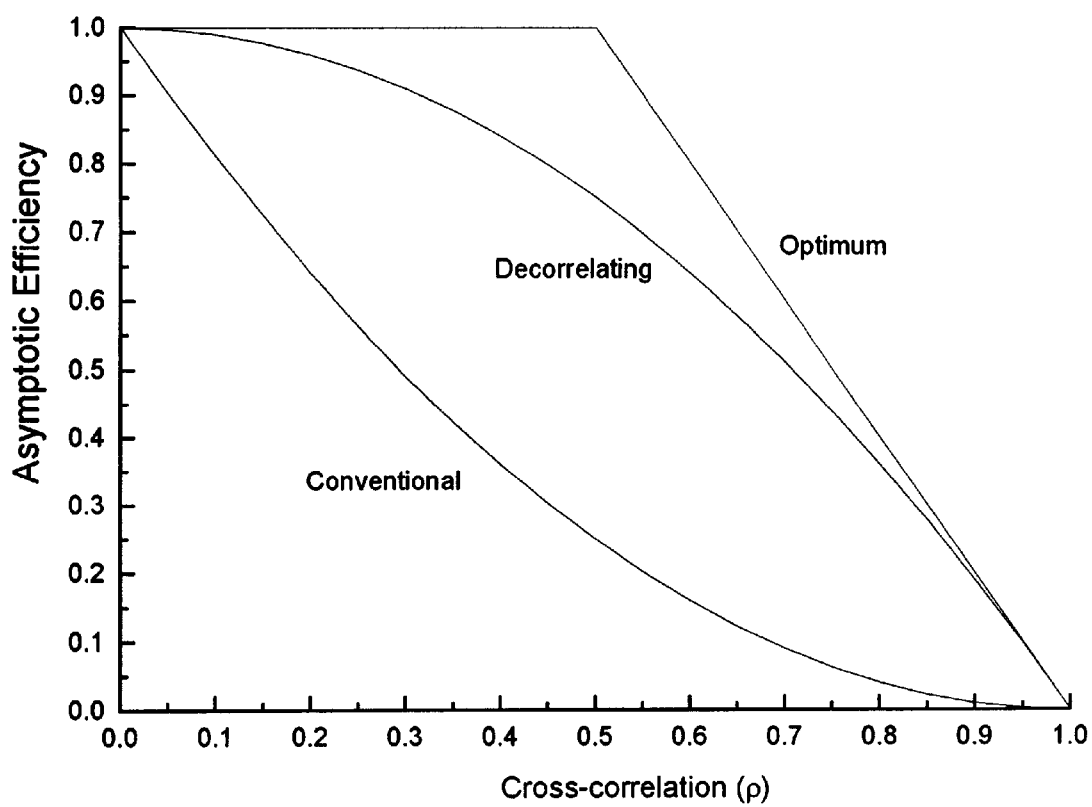
FIG. 30 is a graph of asymptotic efficiency for two equal-power users as a function of user cross-correlation ($\rho$) for various synchronous detectors.

In FIG. 30, the asymptotic efficiency of the various detectors for the case of two equal power users is shown as a function of the user cross-correlation $\rho$. Qualitatively, the curves show the relative ranking of the three different detectors in terms of performance at high SNR. Furthermore, the performance of the optimum approach appears to be the asymptotes of the performance obtained with the decorrelating detector. For cross-correlations less than 0.5, the optimum detector has no asymptotic loss. However, at a cross-correlation of 0.75 there is a 3 dB asymptotic loss relative to single user performance. With the decorrelating detector, there is a 1.25 dB asymptotic loss at a cross-correlation of 0.5. That the discontinuity in the derivative of the asymptotic efficiency curve for the optimum detector may appear peculiar. However, it is due to the fact that at a $\rho$ of 0.5, there is a change in the error event which has the minimum distance. This is what causes the corner in the optimum asymptotic efficiency curve.

Figure 31:
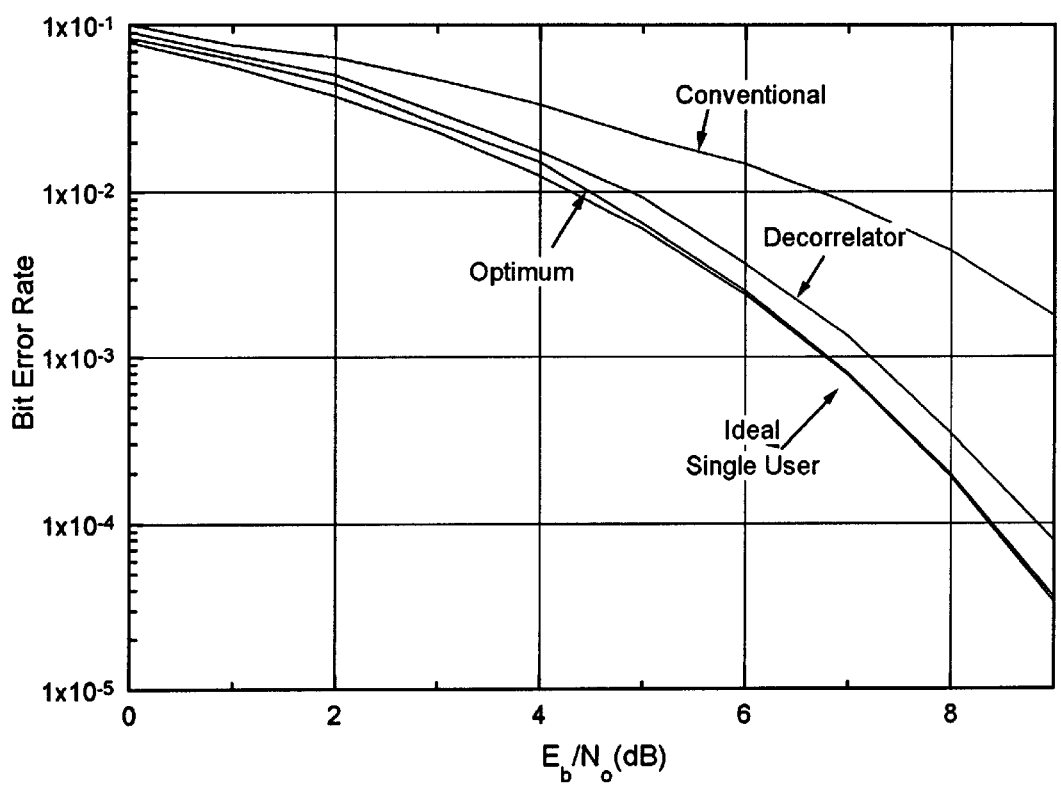
FIG. 31 is a graph of BER performance of optimum, decorrelating, and conventional multi-user detectors over Gaussian channel with K=2 users ($\rho=0.33$)

The asymptotic efficiency results provide insight to the high-SNR performance. At low SNR simulation is used. In FIG. 31, the simulated bit error rate performance of the various detectors over a Gaussian channel is shown for a case of two users with a cross-correlation of 0.33. This correlation is high for a CDMA system and implies a high degree of spectral efficiency.

As the results show, with the optimal detector rapidly converges to the ideal single user performance as the SNR increases. This is consistent with the asymptotic efficiency results. Even at low SNR the loss is only a fraction of a dB. With the much simpler decorrelating detector the additional performance loss is marginal. The asymptotic loss with the decorrelating detector should be $-10\log_{10}(1-\rho^2)=0.5$ dB. Both of these schemes perform better that the conventional detector and the advantage increases with the SNR. For the above example, the users were assumed to have signals of equal amplitude ($w_1=w_2$) and consequently, the optimum linear detector is the decorrelating detector.

Figure 32:
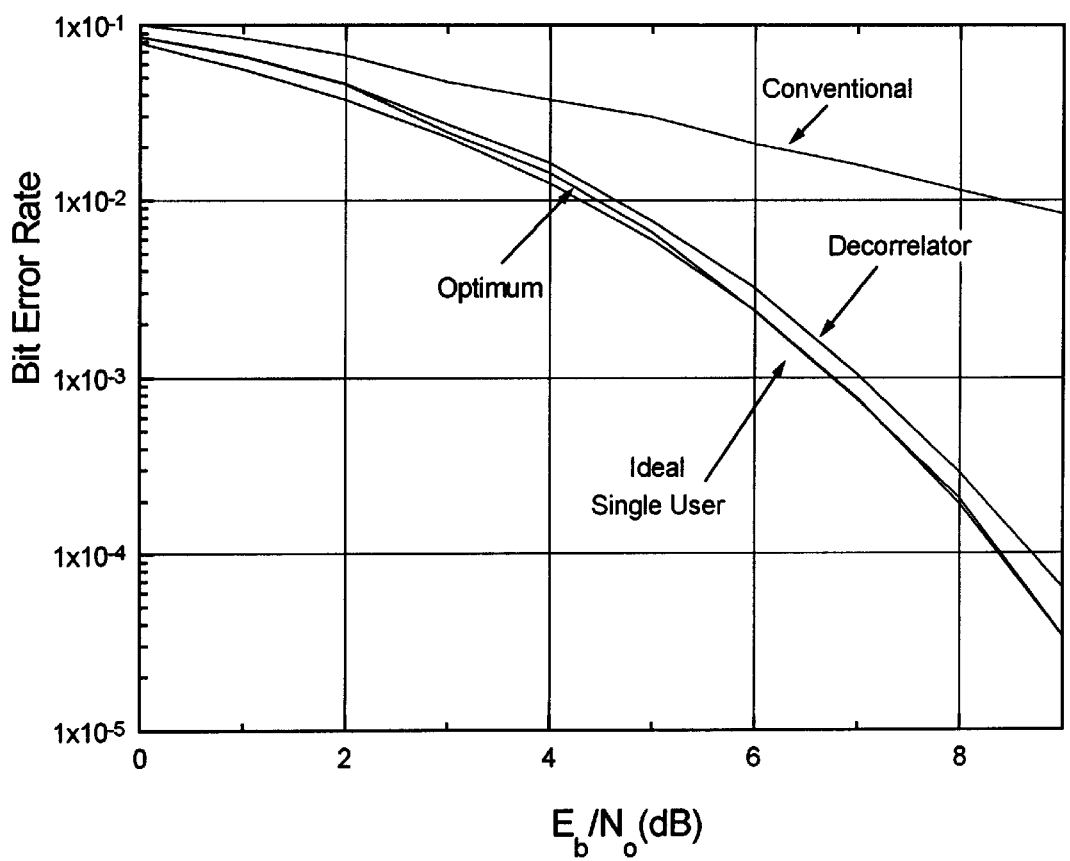
FIG. 32 is a graph of BER performance of optimum, decorrelating, and conventional multi-user detectors over Gaussian channel with K=7 users ($\rho=1/7$).
Figure 33:
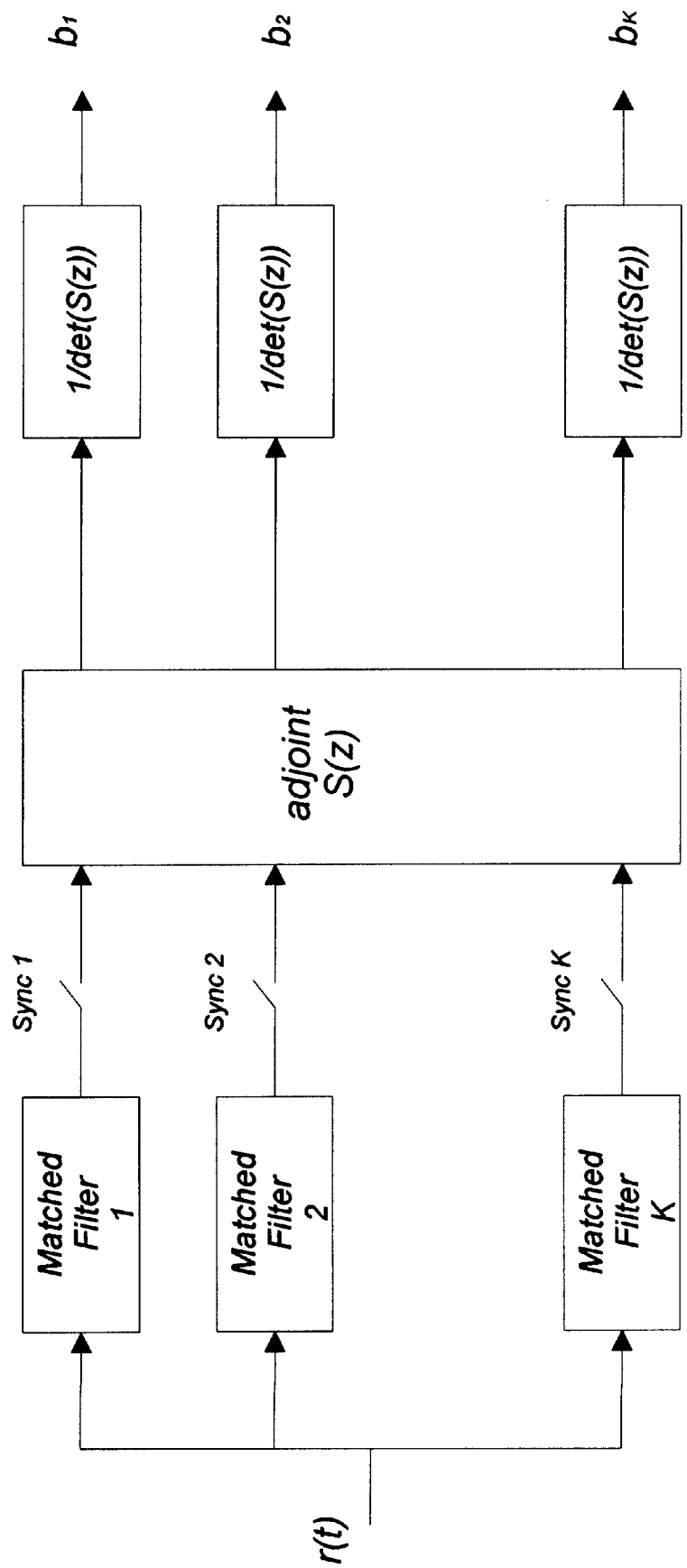
FIG. 33 is a block diagram of limiting asynchronous decorrelating receiver.

In FIG. 32 the corresponding results for the case of seven users with a uniform cross-correlation of 1/7 is shown. This corresponds to a system that uses codes that correspond to a PN sequence of length $2^3-1$, and cyclically shifted versions thereof. Quantitatively, the results with the optimal and decorrelating detectors are quite similar to the two-user case. The loss with the conventional detector is significantly larger in this case.

Linear suboptimum multi-user detectors for the asynchronous Gaussian channel have been evaluated for the near-far resistance. The approach taken was to note that the asynchronous problem, where the output of the bank of matched filters is given by (81), can be put into the same form as the synchronous case (with NK users) by defining $$Y = \begin{bmatrix} y(1) \\ y(2) \\ \vdots \\ y(N) \end{bmatrix}, B = \begin{bmatrix} b(1) \\ b(2) \\ \vdots \\ b(N) \end{bmatrix}, N = \begin{bmatrix} n(1) \\ n(2) \\ \vdots \\ n(N) \end{bmatrix} \quad (112)$$

where Y, B, N$\in$R$^{NK}$, and $$H = \begin{bmatrix} H(0) & H(1) & & 0 \\ H(-1) & H(0) & \ddots & \\ & \ddots & \ddots & H(1) \\ 0 & & H(-1) & H(0) \end{bmatrix} \quad (113)$$

and W=diag $\{W, W, \ldots W\}$. Then, the equivalent synchronous system results—

$$Y=HWB+N \quad (114)$$

A critical assumption to this approach to asynchronous problem is that $\|S(t,b)\|\neq 0$ for all b or, equivalently, H is invertible.

Under this assumption, a decorrelating detector for the ith bit of the kth user is an $((i-1)K+k)$th row of H$^{-1}$, analogous to the synchronous case. For finite N, the decorrelating detector is non-stationary, that is, for the kth user there is a different decorrelating filter for each bit i. This detector has many of the properties of the corresponding synchronous detector. In particular, i) the decorrelating detector is independent of the received energies;

ii) the decorrelating detector eliminates the multiuser interference present in the matched filter output, and though not necessarily optimal for specific user energies, it is optimal with respect to the worst possible distribution of energies;

iii) the kth user bit error rate is independent of the energies of the interfering users; and iv) the decorrelating detector achieves the near-far resistance of the optimum multiuser detector.

For the values of N encountered in practical applications, inverting a NK by NK matrix is not practical. In the limiting case, as the sequence length N$\to\infty$, the decorrelating detector approaches the K-input K-output linear time invariant filter with transfer function $$H(z)=[H(-1)z+H(0)+H(1)z^{-1}]^{-1}=[S(z)]^{-1} \quad (115)$$

This decorrelating filter can be viewed as the cascade of a matrix of finite impulse response filter with transfer function adjoint S(z), which decorrelates the users but introduces intersymbol interference among the previously non-interfering, symbols of the same user, and a second filter, consisting of a band of K identical filters with transfer function $[\det(S(z))]^{-1}$, which removes this intersymbol interference. This decorrelating filter is stable but non-causal assuming a condition analogous to H being invertible in the finite case. However, with sufficient delay approximation to a desired degree of accuracy by truncation of the impulse response is possible.

While the decorrelating receiver is not claimed to be an optimum linear receiver in the asynchronous case, the synchronous results suggest that it may be such over a range of signal energies. A major advantage of the decorrelating receiver besides being near-far resistance is that it requires no knowledge of the signal energies.

As with the synchronous case it is interesting to compare the asymptotic efficiencies of the three different asynchronous detectors. The asymptotic efficiency for the conventional detector in the two-user case is given by $$\eta_1 = \max^2\left\{0, 1 - (\rho_{12}+\rho_{21})\frac{w_2}{w_1}\right\} \quad (116)$$

where we have defined $\rho_{12}=|H_{12}(0)|$ and $\rho_{21}=|H_{12}(1)|$. That is, $\rho_{12}$ is the cross-correlation of the current symbol with the preceding symbol of the interfering user, and $\rho_{21}$ i is the cross-correlation of the current symbol with the following symbol of the interfering user.

The asymptotic efficiency for the optimum multi-user detector in the two-user case is given by $$\eta_1 = \min\left\{1, 1+\left(\frac{w_2}{w_1}\right)^2 - 2\max\{\rho_{12},\rho_{21}\}\frac{w_2}{w_1}, \right. \quad (117)$$
$$\left. 1+2\left(\frac{w_2}{W_1}\right)^2 - 2(\rho_{12}+\rho_{21})\frac{w_2}{w_1}\right\}$$

The asymptotic efficiency for the limiting decorrelating detector in the asynchronous two-user case is given by $$\eta_1 = \sqrt{[1-(\rho_{12}+\rho_{21})^2][1-(\rho_{12}-\rho_{21})^2]} \quad (118)$$

Figure 34:
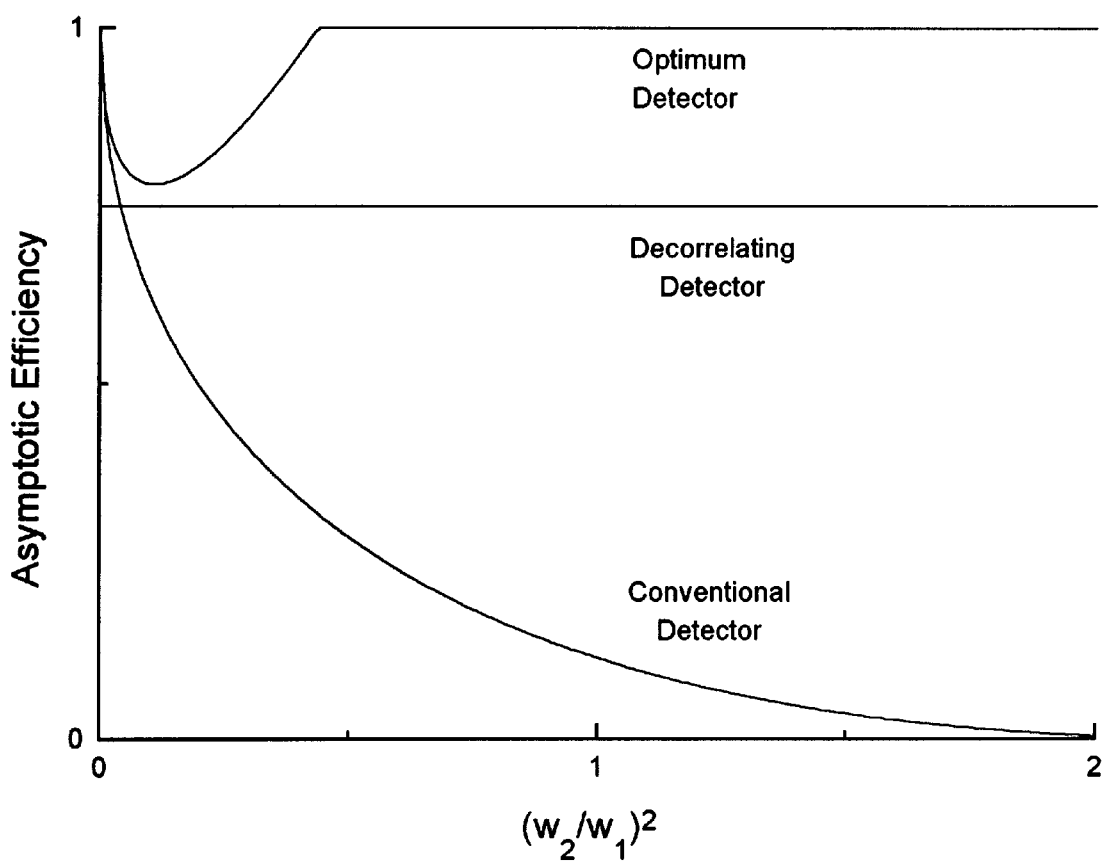
FIG. 34 is a graph of asymptotic efficiencies for various detectors with two asynchronous users with correlations $\rho_{12}=\rho_{21}=0.33$.

Clearly, the asymptotic efficiency depends upon the two correlation parameters $\rho_{12}$ and $\rho_{21}$, which are not totally independent. To illustrate the behaviour of the asymptotic efficiency in the asynchronous case, an example where all the correlation parameters are positive and $\rho_{12}+\rho_{21}=\rho$, where the latter is the cross-correlation in the synchronous case is used. The asymptotic efficiency, when $\rho_{12}=\rho_{21}=0.33$, is shown in FIG. 34 for the different detectors. Qualitatively, the results are similar to the synchronous case.

Figure 35:
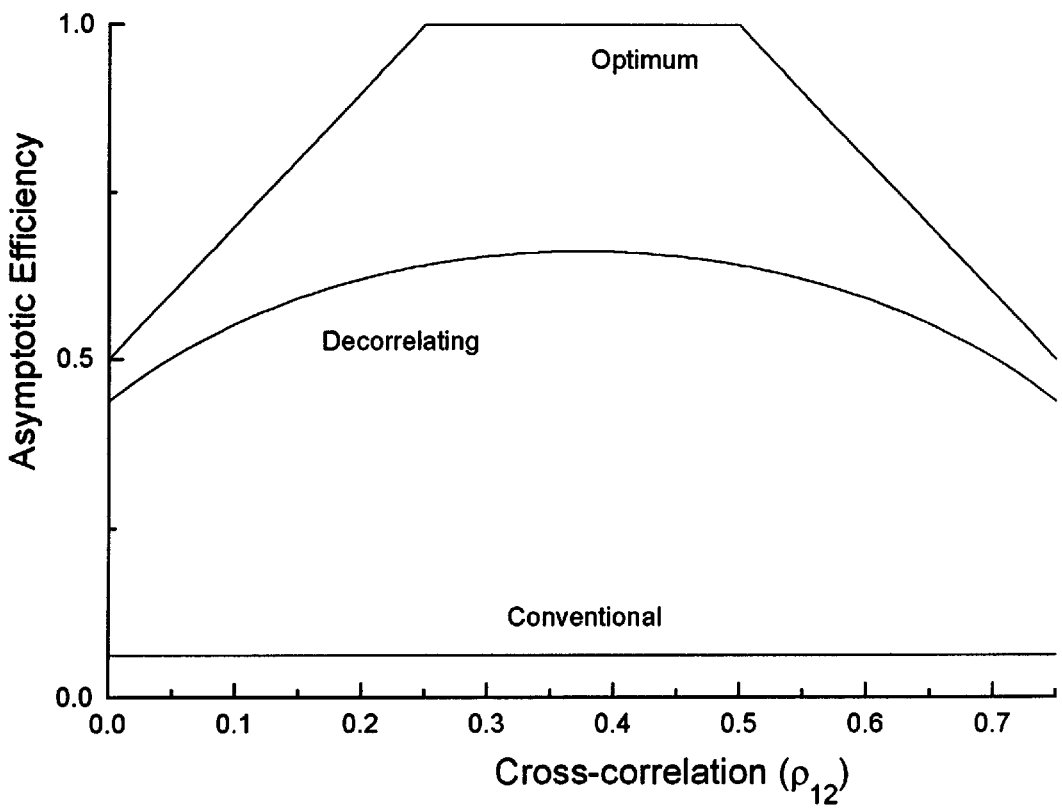
FIG. 35 is a graph of asymptotic efficiency of asynchronous optimum, decorrelating and conventional detectors over Gaussian channel as a function of cross-correlation ($\rho_{12}+\rho_{21}=\rho=0.75$)

The asymptotic efficiencies for the three different detectors are shown in FIG. 35. Over a small range, the optimal detector has no asymptotic loss. This range corresponds to the condition of both $\rho_{12}$ and $\rho_{21}$ being less than 0.5. Thus it is consistent with the behaviour in the synchronous case. Outside of this range the losses increase linearly. Analogous to the synchronous case, the decorrelator performance appears to smoothed version of the optimal performance. The decorrelator suffers its greatest loss relative to the optimal detector (just less than 2 dB) over the range where the optimal detector suffers no losses. The performance of the decorrelator is quite uniform over the whole range with less than 2 dB total variation in the loss with respect to single user performance. The performance of the conventional detector depends on the sum of the two correlations, $\rho_{12}$ and $\rho_{21}$, and is thus constant for this example.

Figure 36:
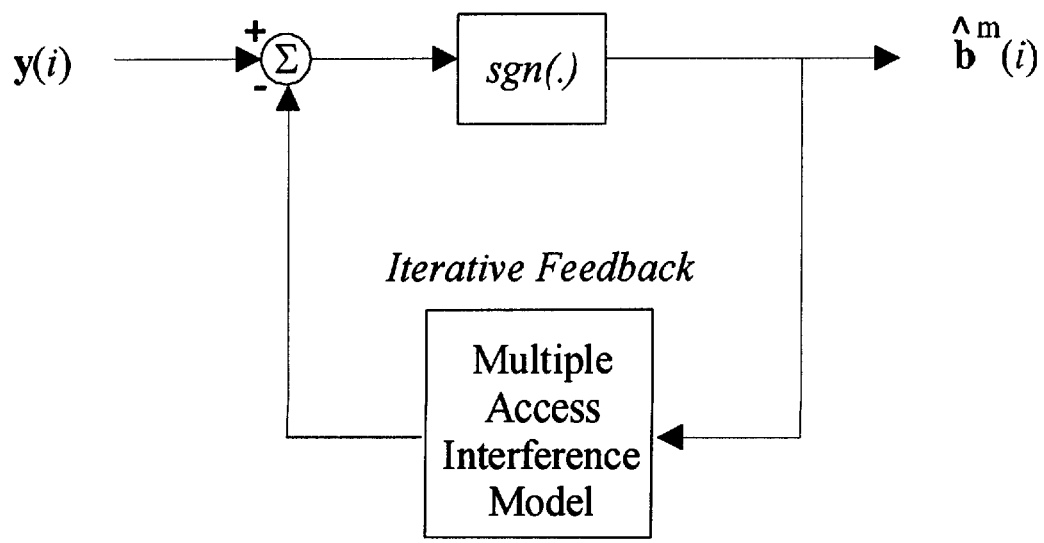
FIG. 36 is an illustration of Varanasi-Aazhang multistage interference cancellation algorithm.
Figure 37:
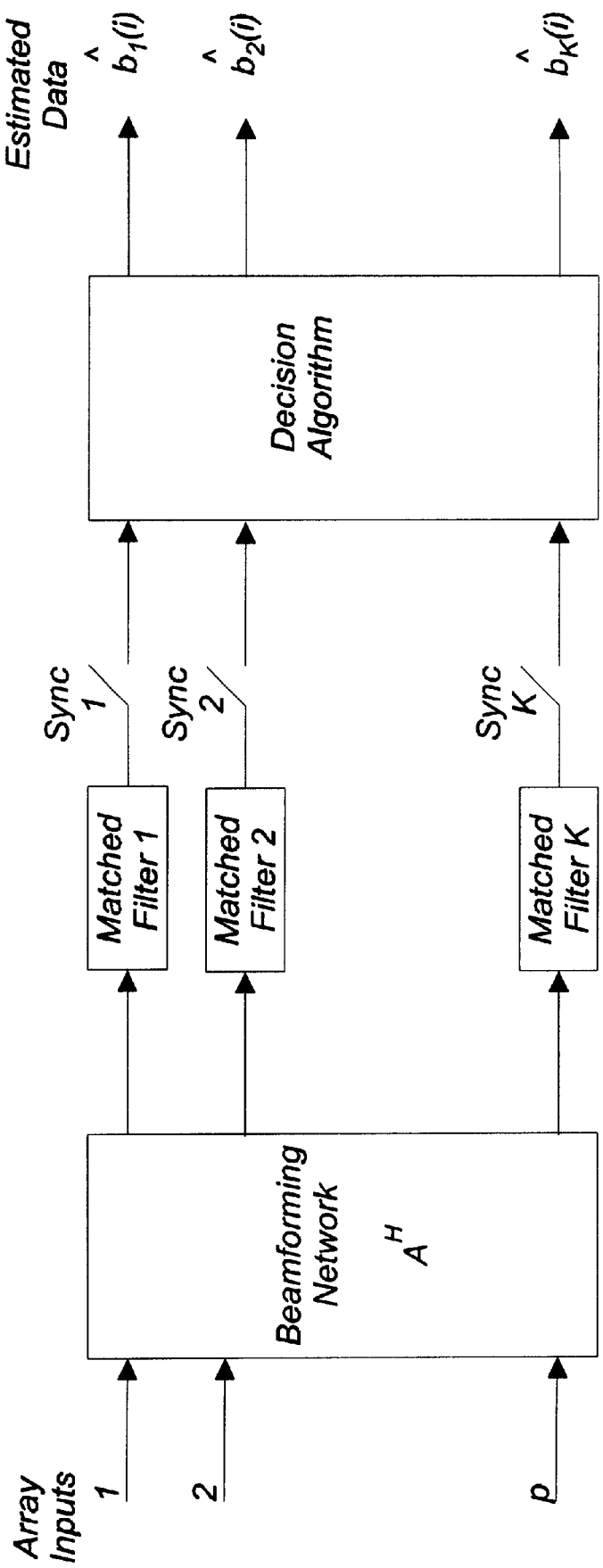
FIG. 37 is an illustration of multi-user array processing algorithm.

The study of nonlinear suboptimum detectors is an active field of research. It is clear that in the synchronous case, the loss of the decorrelating detector relative to the optimal detector is relatively small over a wide range of scenarios. The decorrelating detector has the added advantage of being independent of the user power levels. In the asynchronous case there can be losses of close to 2 dB and perhaps more when using the decorrelating detector. Nonlinear detectors are being investigated in an attempt to narrow the gap between the performance of practical suboptimum detectors and the optimum detector in the asynchronous case. M. K. Varanasi and B. Aazhang discuss a suboptimal multi-user detector that is based on successive multiple-access interference cancellation stages in an article "Multistage detection in asynchronous code-division multiple access communications," *IEEE Trans. Comm.*, vol. 38, No.4, pp.509–519, April 1990, which is hereby incorporated by reference. In the article a modulating waveform is assumed limited to one symbol period, $s_k(t) \in R[0,T]$. The dependence of the sufficient statistics, $y(i)$, on the bit sequence is given by (92). The proposed approach is a multistage suboptimum solution to the maximization of the log-likelihood function. In particular, the modified log-likelihood function is given by $$\Omega_a(b, y) = \sum_{i=1}^{N} (2b_i^T y_i - b_i H(-1)b_{i+1} - b_i H(0)b_i - b_i H(1)b_{i-1}) \quad (119)$$

where, for simplicity, we have assumed W=I, the identity matrix. TIhe initial estimate of the data, $b^0(i)$, is given by the sign of the matched filter output $$b^0(i) = \text{sgn}(y(i)) \quad (120)$$

that is, by the conventional receiver. Subsequent estimates are obtained by subtracting the estimated interference (reconstructed using the current estimate of the other bits) from the received sample $$b^{m+1}(i) = \text{sgn} \{y(i) - H(-1)b^m(i+1) - (H(0)-I)b^m(i) - H(1)b^m(i-1)\} \quad (121)$$

where I is the K×K identity matrix. This algorithm is illustrated in FIG. 36.

Bounds on the performance of this algorithm are presented for the two-user case; bounds for larger numbers of users are provided in the paper but not evaluated. When the users have equal power, there is a marginal degradation in performance relative to single user performance over the range of BERs from $10^{-2}$ to $10^{-6}$. When one user is stronger than the other, the relative degradation of the weaker user is less, while that of the stronger is greater. The relative degradation of the stronger user does not increase rapidly with its relative strength.

From an overall system viewpoint, this type of tradeoff between weaker and stronger users is desirable. Stronger users will have better BERs than weaker users, and should be able to tolerate more degradation in performance.

Traditional multiple access techniques use waveforms that have low cross-correlations. For example, with code division multiple access techniques, users are assigned spreading codes which have low cross-correlations. Similarly, with frequency division multiple access, users are assigned different carrier frequencies that implicitly have low cross-correlations that depend upon their frequency separation. With time division multiple access, users which do not overlap in time clearly have no cross-correlation. Low cross-correlations, however, do not necessarily imply high spectral efficiency. Detection problem where the user waveforms do not necessary have low cross-correlations are examined below. High cross-correlations between the waveforms of the different users implies small excess bandwidth.

There are three potential shortcomings to the results presented above noted results relating to active interference suppression techniques. The first is that research in this area is aimed primarily at wideband CDMA-type systems while the majority of existing commercial systems are narrowband. Thus, the techniques as described are applicable only to new systems but do not directly offer any benefit, in terms of increased capacity for existing systems. Secondly, to achieve this greater interference tolerance these wideband systems rely heavily on forward error correction coding. The research into effective techniques for multiuser detection with forward error correction coding is quite new. Thirdly, the majority of the simulation results in the literature are for two users. This leads one to question the practicality of multiuser detection for a large number of users.

The theoretical Gaussian multiple access channel is defined as K users, each transmitting a synchronous data stream $\{b_k(i)\}$ such that the channel output at time i is given by $$y(i) = \sum_{k=1}^{K} b_k(i) + n(i) \quad (122)$$

where $\{n(i)\}$ is an additive white Gaussian noise sequence. Define $C(\gamma)$ as the capacity (in bits per channel use) of a single user channel where $$C(\gamma) = \frac{1}{2}\log_2(1 + \gamma) \quad (123)$$

and $\gamma = 2E_s/N_0$ is the signal to noise ratio. Let $R_k$ be the transmission rates of the K different users with a common signal to noise ratio $\gamma$. Then the capacity of this channel is subject to the following constraint $$\sum_{k \in J} R_k \leq C(|J|\gamma) \text{ for all sets } J \subset \{1, \ldots, K\} \quad (124)$$

where $|J|$ is the cardinality of the set. The amazing feature about this result is that the capacity of channel continues to grow as one adds more users. The capacity is the same as if the all of the power were devoted to a single user. If all of the user rates are identical to R, then one has the following constraint on the single user rate $$R \leq \frac{1}{K} C(K\gamma) \quad (125)$$

Figure 38:
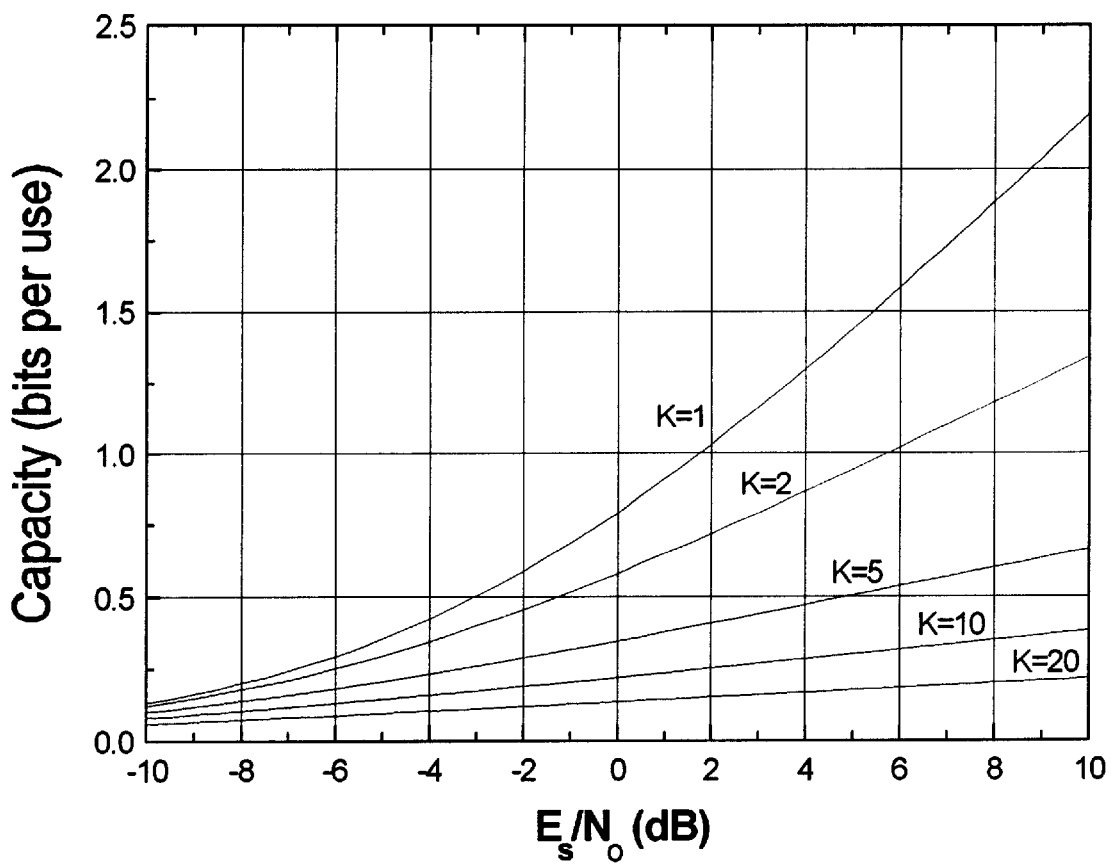
FIG. 38 is a diagram of theoretical bound on single user capacity for a Gaussian multiple access channel with K users having the same rate and SNR.

The total capacity of the channel does not increase linearly with the number of users but in a logarithmic fashion as determined by C. Consequently, the single user capacity decreases as more users are added. This dependence of the single user capacity on the number of users is shown in FIG. 38. Clearly, as the number of users increases there is a significant decrease in the individual user's capacity even though the total capacity is increasing.

A. J. Viterbi proposed in an article "Very low rate convolutional codes for maximum theoretical performance of spread-spectrum multiple-access channels", *IEEE J. Sel. Areas Comm.*, vol. 8, no.4, pp.641–649, May 1990 a method of achieving this theoretical capacity of the multiple access channel by using CDMA with orthogonal convolutional codes. Viterbi first demonstrated that by the use of orthogonal convolutional codes, one can achieve the maximum bandwidth efficiency of a spread spectrum multiple access system, in which every user is independently demodulated. This maximum capacity is calculated by noting that for $\gamma << 1 C(\gamma) \approx \gamma/(2 \ln 2) = E_s/N_0/\ln 2$, so $$KC(\gamma) \approx \frac{KE_s}{N_o} \frac{1}{\ln 2} \approx \frac{1}{\ln 2} \text{ bits/channel use} \quad (126)$$

This assumes that the majority of the noise is caused by the multiple access interference so $KE_s \approx N_0$ and that a channel use refers to a channel use by K users. In this case, since one is not performing joint detection, capacity does not increase with the number of users K. With this same coding technique, Viterbi shows that for K users of the same bandwidth, bit rate and code rate but with monotonically increasing power levels; one can approach within a factor α the theoretical capacity of the Gaussian multiple access channel. This is achieved by iteratively estimating the signals and subtracting their effect from the composite received signal, starting with the strongest first. The factor α approaches one as the constraint length of the code becomes asymptotically large.

A mathematical model for multiuser detection is presented above. In particular, the equivalent discrete-time synchronous model can be represented by $$y(i) = HWb(i) + n(i) \quad (127)$$

where $y(i) \in R^K$ is the vector of matched filter outputs at time i, $b(i) \in \{-1,+1\}^K$ represents the corresponding data inputs, $H \in R^{K \times K}$ represents the cross-correlation matrix of the user waveforms, and $W \in R^{K \times K}$ is a diagonal matrix representing the channel amplitudes for each of the K users. The noise vector $n(i) \in R^K$, has a covariance matrix given by $$E[n(i)n(i)^T] = \sigma^2 H \quad (128)$$

that is, the colouring of the noise is determined by the cross-correlation matrix. What this model does not provide is an indication of how performance depends upon the number of users, K. To illustrate this dependence in a quantifiable manner, we introduce the concept of a K-symmetric channel. In the synchronous case, a K-symmetric channel is characterized by a cross-correlation matrix, which is given by $$H = \begin{bmatrix} 1 & \rho & \cdots & \rho \\ \rho & 1 & \cdots & \rho \\ \rho & \rho & 1 & \cdots \\ \cdots & \cdots & \rho & 1 \end{bmatrix} \quad (129)$$

and a channel gain matrix, W=I. This corresponds to the case where all users have the same cross-correlation between their modulating waveforms, and suffer the same propagation losses. Design of the modulating waveforms of the K users to produce (129) is, in general, not possible without some bandwidth expansion. There are some common examples. The case $\rho=0$ corresponds to perfectly orthogonal signaling, for example, using the orthogonal Hadamard codes in a CDMA system or orthogonal frequencies in an FDMA system. In either case there is a bandwidth expansion proportional to the number of users. When different cyclic shifts of the same M-sequence are used as the modulating waveforms of the users, then this corresponds to a cross-correlation of -1/M-1. Supplementing this with the all 1s sequence, the bandwidth expansion factor is only (K-1) for K users. Using the same modulating waveform for each user, then this corresponds to a $\rho=1$, and the bandwidth expansion factor is 1. The matrix H is a cross-correlation matrix and therefore must be positive semi-definite. This constrains the cross-correlation parameter to $-1/K-1<\rho<1$.

Introducing a K-symmetric channel produces some desirable results. Since the channel is symmetric, the results apply to all users. This channel also has the nice limiting properties that the case $\rho=0$ corresponds to orthogonal users, and the case $\rho=1$ corresponds to the multiple access channel.

With the K-symmetric channel, the asymptotic efficiency of various detectors over a Gaussian channel can be expressed quite simply. Asymptotic efficiency of a detector is the loss relative to single user performance over the same channel as the SNR becomes large. This is usually determined by assuming that asymptotic performance is dominated by the minimum distance error event.

Conventional detector. The conventional detector is characterized by the operation $$\hat{b}(i) = \text{sign}(y(i)). \quad (131)$$

From (127), the ith matched filter output for the K-symmetric channel is given by $$y_k(i) = b_k(i) + \rho \sum_{j \neq k} b_j(i) + n_k(i) \quad (131)$$

From (131) it is clear that the minimum distance of an error event for the conventional detector occurs when all of the interfering users must have the opposite polarity of the desired bit and the asymptotic efficiency is given by $$\eta = \max^2\{0, 1-(K-1)|\rho|\}. \quad (132)$$

From (132), it is clear that the asymptotic efficiency of the conventional detector rapidly decreases to zero as the number of users increases; however, the number of minimum distance error events is one. If all minimum distance events produced an error and the bits are equiprobable, this corresponds to an error floor of $\frac{1}{2}^K$.

Decorrelating detector. With the decorrelating detector, the bit estimates are given by $$\hat{b}(i)=\text{sign}(H^{-1}y(i)) \tag{133}$$

Since the decorrelating detector inverts the channel, the same distance properties as with the single user channel result. However, after the channel inversion, the noise covariance matrix is modified to become $H^{-1}$. For a particular user in the K-symmetric channel, the individual noise variance is given by $$\sigma^2=(H^{-1})_{11}\sigma_0^2 \tag{134}$$

Thus the asymptotic efficiency will be inversely proportion to the quantity $(H^{-1})_{11}$ resulting in the following theorem.

Theorem 3.1 For the decorrelating detector, the efficiency with the K-symmetric channel is $$\eta = \frac{(1-\rho)(1+(K-1)\rho)}{1+(K-2)\rho}. \tag{135}$$

The efficiency of the decorrelator has zeros at the limits of the allowable range for $\rho$. From (135), it is evident that, optionally bounds are placed on efficiency (when $\rho>0$) of the decorrelating detector $$1-\rho<\eta<1-\rho^2 \tag{136}$$

where the upper bound is exact for K=2, and the lower bound is approached as K becomes large. Thus, when the correlation is large, the noise enhancement with the decorrelating detector becomes quite significant. From this it is also clear, that if the cross-correlations are small, the noise enhancement can be kept small regardless of the number of users. From equation (134), it is clear that the relative loss with the decorrelator is the same at all signal to noise ratios. Thus, the asymptotic efficiency and the efficiency are identical.

Optimum detector. The asymptotic efficiency of the optimum detector is given by $$\eta = \min_{\varepsilon \neq 0} \varepsilon^T H \varepsilon \tag{137}$$

where $\epsilon$ is an error sequence, $\epsilon \in \{-1,0,+1\}^K$. For the optimum detector, the following results.

Theorem 3.2. The asymptotic efficiency of the optimal detector for the K-symmetric channel is given by $$\eta=\min\{1,2(1-|\rho|)\} \tag{138}$$

for all K.

This obtained by minimizing (137). The fact that the minimum distance does not depend on the number of users is not an intuitive result. The result is bounded by the one and two-user cases. Thus, the performance of the optimum multiuser detector over a K-symmetric channel is asymptotically independent of the number of users. Due to its optimality, the performance of the optimal detector will be upper bounded by that of the decorrelator. This is of value when estimating the performance of the optimal detector at low signal to noise ratios.

Figure 39:
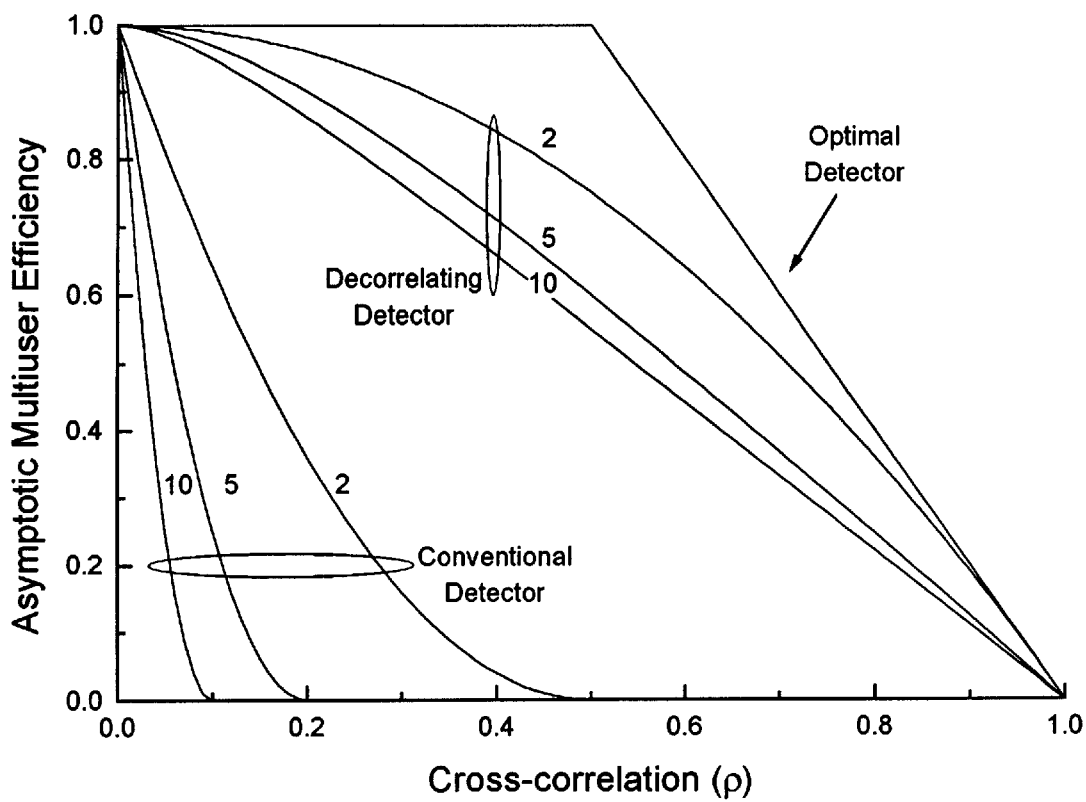
FIG. 39 is a diagram of asymptotic efficiencies of conventional, decorrelating, and optimum detectors as a function of the number of users (K) and the cross-correlation parameter ($\rho$)

In FIG. 39, the asymptotic efficiencies for the three different detectors for two, five, and ten users, as a function of the cross-correlation parameter $\rho$ is shown for comparison. As indicated within the figure, the asymptotic efficiency of the optimal detector is independent of the number of users. Both the conventional and decorrelating detectors degrade with the number of users. The asymptotic efficiency of the conventional detector approaches zero quickly as the number of users is increased. The asymptotic efficiency of the decorrelating detector approaches the line (=1-(; at (=0.5 and large K it approaches a 3 dB degradation relative to the optimal detector.

Figure 40:
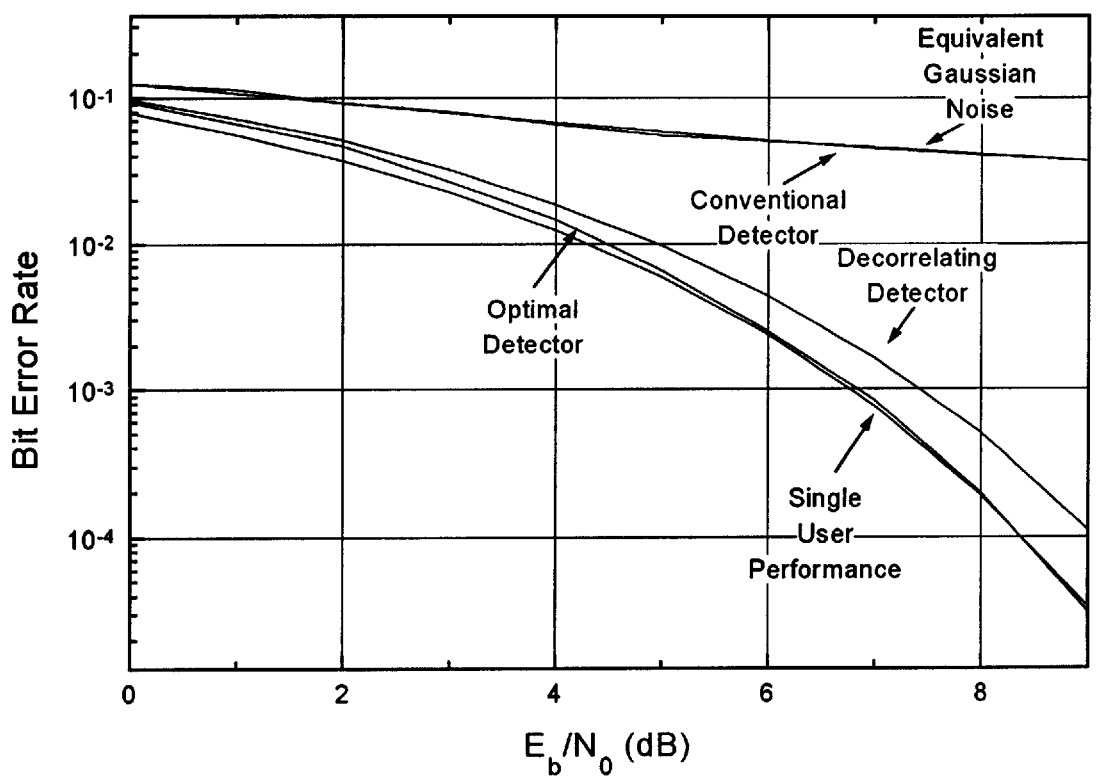
FIG. 40 is a diagram of BER performance of three different detectors over a K-symmetric channel with K=5 users and a cross-correlation parameter $\rho=0.25$.
Figure 41:
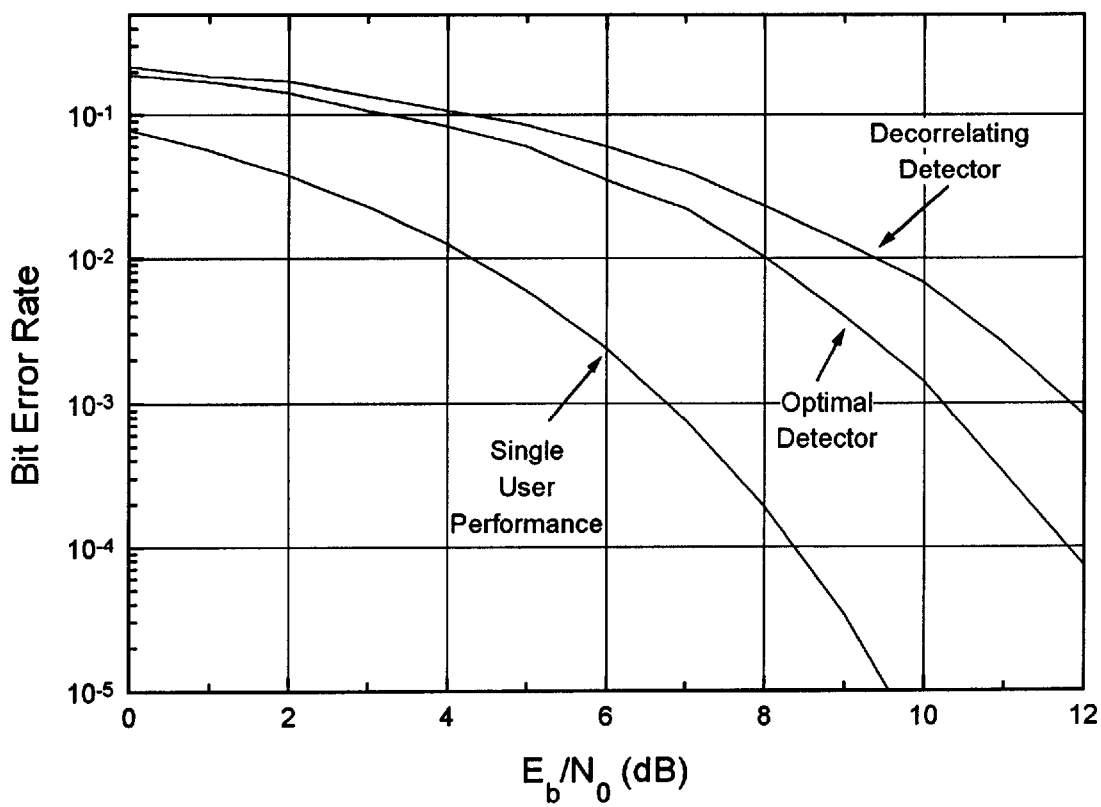
FIG. 41 is a diagram of BER performance of decorrelating and optimal detectors over a K-symmetric channel with K=5 users and a cross-correlation parameter $\rho=0.75$.

In FIGS. 40 and 41, the simulated bit error rate performance of the different detectors is shown for a K-symmetric channel with 5 users and correlation parameters of (=0.25 and 0.75, respectively. The optimal detector has no asymptotic loss relative to single user performance as predicted by the theory. Under the same conditions the decorrelating detector shows a loss of approximately ⅔ of a dB which is also predicted by the theory. For the conventional detector, the theory predicts that the asymptotic efficiency is zero. This is clearly true but it does little to characterize the performance at low Eb/N0. As the figure indicates, performance is closely approximated by making a Gaussian assumption about the multiple access interference in this case.

In FIG. 41 the performance is own for the optimal and decorrelating detectors with a correlation $\rho=0.75$. Performance with the conventional detector is much worse in this case and is not shown in FIG. 41. Under these conditions, the optimal detector has a loss relative to single user performance that approaches 3 dB, the value predicted theoretically. With the decorrelating detector, the asymptotic loss approaches the 5.1 dB predicted by theory. The relative loss with the decorrelating detector is constant as a function of the $E_b/N_0$, and the performance of the optimal detector approaches that of the decorrelator at lower SNR values.

To analyze the behaviour of multiuser detectors when the data stream includes forward error correction coding, the minimum distance error event of the corresponding code is analysed. Assuming linear codes for the single user channel, the minimum distance of the FEC code is defined as $d_{free}$. This is the minimum Hamming distance between any two codewords belonging to the code, i.e. any two codewords must differ in at least $d_{free}$ channel bits.

Figure 42:
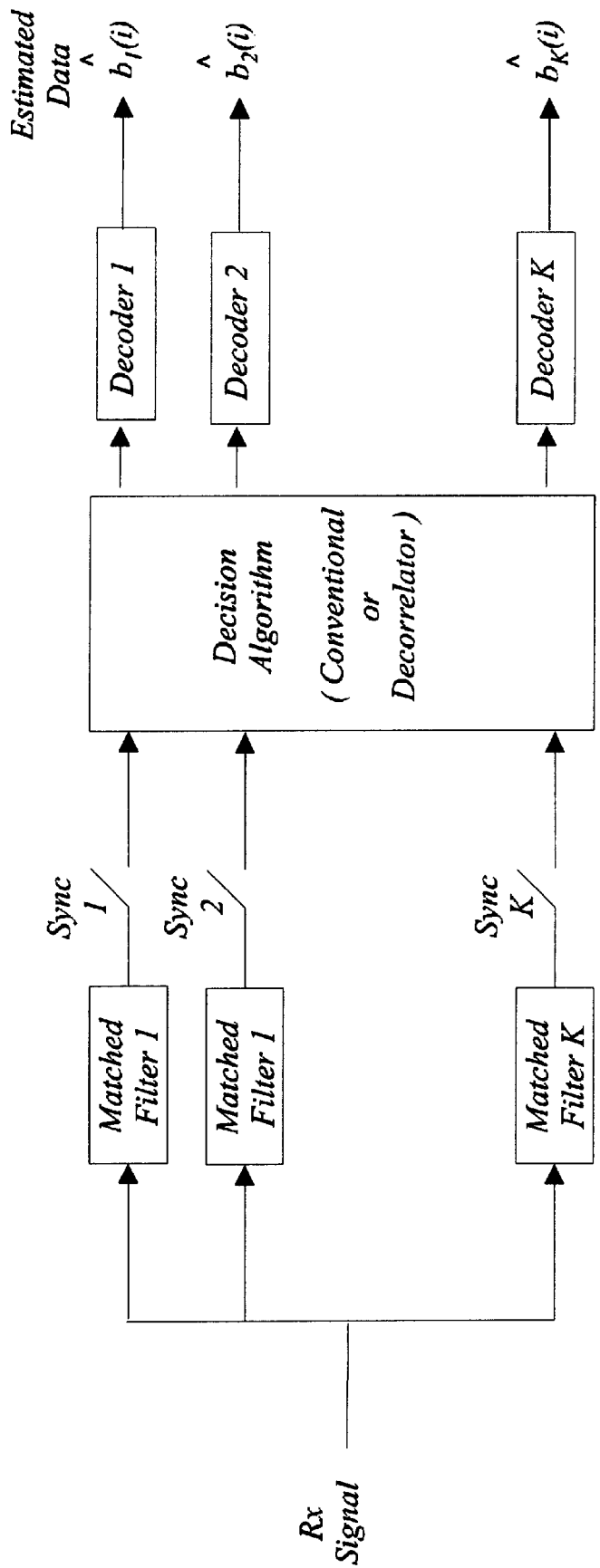
FIG. 42 is an illustration of conventional and decorrelating detector structures for multiuser signals with forward error correction coding.

For the case of the conventional detector and the decorrelating detector, the detector structure includes soft decisions from K matched filters and K independent channel decoders as shown in FIG. 42. In between is the identity transformation, in the case of the conventional detector, and the channel inversion matrix $H^{-1}$, in the case of the decorrelator.

Conventional detector. For the conventional detector, the asymptotic efficiency is a simple extrapolation of the uncoded results for the uncoded case. For the K-symmetric channel and a particular user it is given by $$\eta=d_{free}\max^2\{0,1-(K-1)\rho\} \tag{139}$$

Figure 43:
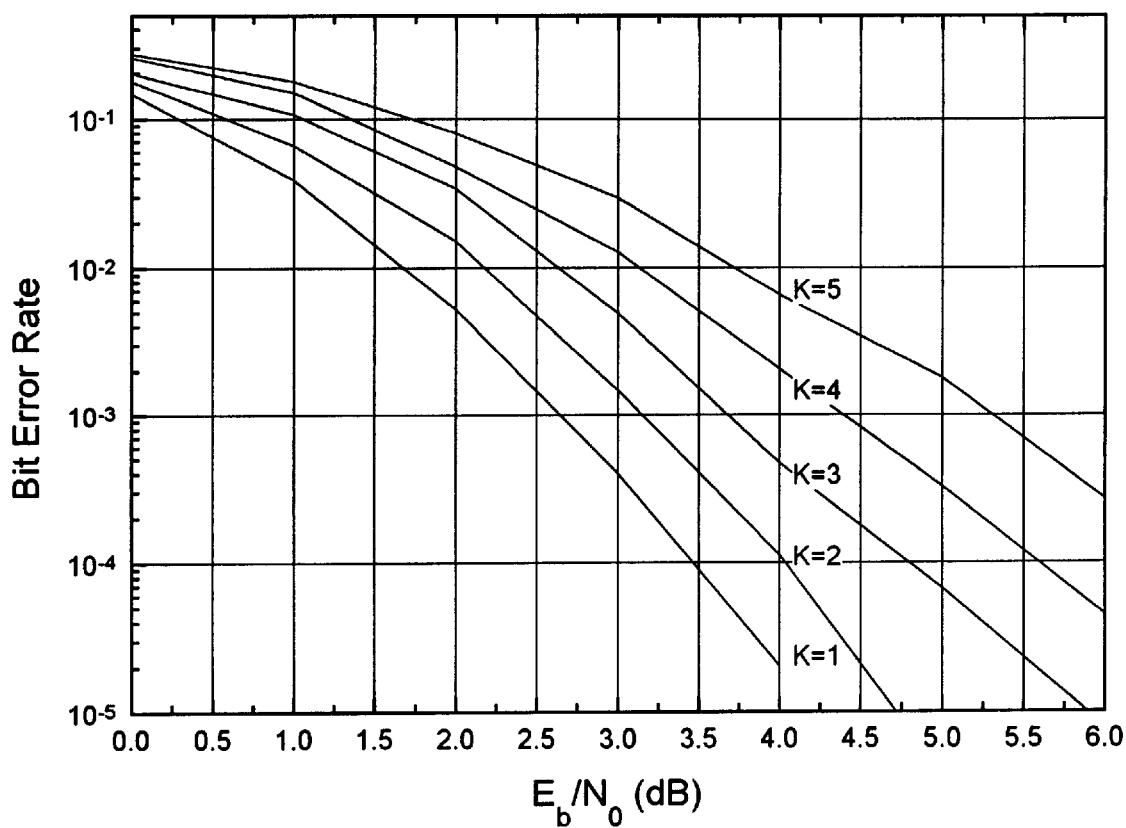
FIG. 43 is a plot of the BER performance of conventional detector with rate ½ constraint length 7 convolutional code ([1011011 1111001]) for different numbers of users (K) and cross-correlation parameter $\rho=0.25$.
Figure 44:
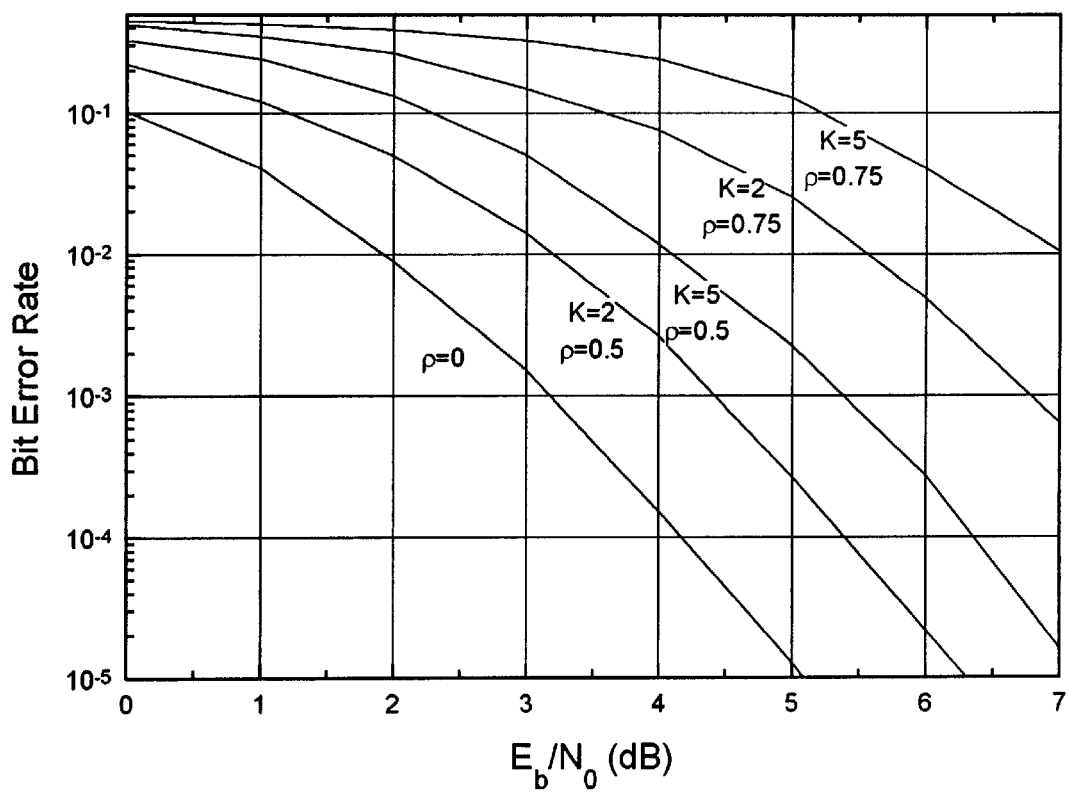
FIG. 44 is a plot of the BER performance of decorrelating detector with rate ½ convolutional code for different numbers of users (K) and cross-correlation parameters ($\rho$). (Code generators: [10011 11101])

While this is the minimum distance, it requires all (K-1) other users to have the opposite polarity of the desired bit, for all $d_{free}$ of the bits where the two codewords differ. Assuming equiprobable bits, this has a probability of ½^((K-1)d^free), and thus the probability of its occurrence is extremely rare. Thus, the asymptotic efficiency has little significance for the conventional detector with coding over the typical operating ranges. The simulated performance of the conventional detector with coding is shown in FIG. 43. This is clearly much better than that predicted by (139). For this operating range it is much better approximated by assuming, the multiple access interference is Gaussian in nature.

Decorrelating detector. The performance of the decorrelating detector with forward error correction coding follows directly from that of the uncoded case, once one recognizes that the decorrelator completely removes the effect of the other user interference at the expense of increasing the noise. In particular, for the coded K-symmetric channel the asymptotic efficiency with the decorrelating detector is given by $$\eta = \frac{(1-\rho)(1+(K-1)\rho)}{1+(K-2)\rho} d_{free} \qquad (140)$$

The simulated performance of the decorrelator with coding is shown in 44. With this detector with fixed $\rho$ and K, there is a constant loss across the operating range relative to coded single user performance. This loss is given by the right hand side of (140) excluding the factor $d_{free}$.

Optimum detector—no interleaving. The optimum detector of asynchronous users with coding is known. The optimum detector of synchronous users with coding is a special case of this result that does not appear to have been dealt with in the literature except for the limiting, ideal multiple access channel. In particular, there will be some simplification of the optimum detector the synchronous case but the trellis will have a complexity proportional to $2^{\kappa K}$, where $\kappa$ is the constraint length of the code and K is the number of users. When considering the minimum distance error event in this case, it is not sufficient to consider a single bit but one must consider the whole K-dimensional sequence of length N. That is, $$\eta = \min_{\varepsilon \neq 0} \sum_{n=1}^{N} \varepsilon(n)^T H\varepsilon(n) \qquad (141)$$

where $\{\varepsilon(n) \in \{-1,0,+1\}^K, n=1, \ldots, N\}$ is the K-dimensional error sequence. The minimum is over all non-zero error sequences. For user k, a minimum distance error event corresponds to a one-dimensional sequence $\varepsilon_k(n), n=1 \ldots N$ where only $d_{free}$ of the elements, $\varepsilon_k(n)$, are non-zero. As with the conventional detector, analysis concentrates on the error events corresponding to the minimum distance event of the code.

Theorem 3.3 With the optimum multiuser detector over a synchronous K-symmetric channel, the asymptotic multiuser coded efficiency is $$\eta = d_{free} \min \{1, 2(1-\rho)\}. \qquad (142)$$

where all users are applying the same code.

The normalized distance of any K-dimensional error event is given by $$d^2 = \sum_{n=1}^{N} \varepsilon(n)^T H\varepsilon(n) \qquad (143)$$

$$= \sum_{n=1}^{N} \left\{ (1-\rho) \sum_{j=1}^{K} \varepsilon_j^2(n) + \rho \left( \sum_{j=1}^{K} \varepsilon_j(n) \right)^2 \right\}.$$

A non-zero error sequence implies that at least $d_{free}$ of the $\varepsilon_j(n)$ must be non-zero for some user j. Then, as in the uncoded case, the case where k users have a minimum distance error event is considered. For k even, $$d^2 > 4d_{free}\{(1-\rho)k+\rho \cdot 0\} \qquad (144)$$

where one achieves this lower bound by pairing the user error sequences such that they align in time (index n) and are the negative of one another. The assumption of a linear code is sufficient to insure the negative of any error sequence (codeword difference) is also a permissible error sequence (codeword difference). It also requires that additive inverses in the code space are mapped to additive inverses in Euclidean space for transmission, the exception to this is the all ones codeword which is assumed to map to the Euclidean inverse of the all zeros codeword. Analogously, for k odd, $$d^2 > 4d_{free}\{(1-\rho)k+\rho \cdot 1\}. \qquad (145)$$

An asymptotic efficiency is obtained by taking the scaled minimum of (144) and (145) which occurs with k=2 and k=1, respectively, and $$\eta = d_{free} \min \{1, 2(1-\rho)\}. \qquad (146)$$

Thus, the asymptotic efficiencies of the conventional, decorrelating and optimum detectors with FEC coding, are simply scaled versions of the uncoded efficiencies for the K-symmetric channel that decrease as the correlation between users increases.

Optimum detector—random interleaving. When users are pseudo-randomly interleaved with respect to one another, a large but straightforward trellis structure of the non-interleaved case falls apart. In principle, a trellis could be defined that includes the effects of this interleaving but its complexity is significant, even for two users. Consequently, the optimum detector under these conditions is far from practical. However, it is still useful to attempt to characterize the performance of such an optimum detector, in order to gauge the performance of suboptimum detectors.

Theorem 3.4 (Optimal asymptotic efficiency with coding and random interleaving.) The expected value, over all pseudo-random interleavers of length N, of the asymptotic efficiency of the optimum multiuser detector for K users with forward error correction coding over a synchronous Gaussian channel is $$\eta_e = d_{free}, \qquad (147)$$

for N sufficiently large. Sufficient conditions are $d_{free} > 4$ and $N > K^2 d_{free}^2$.

For general cross-correlation matrix H, the normalized minimum distance is given by $$d^2 = \sum_{n=1}^{N} \varepsilon(n)^T H\varepsilon(n) = \sum_{n=1}^{N} \left\{ \sum_{j=1}^{K} \varepsilon_j^2(n) + 2 \sum_{i<j} h_{ij} \varepsilon_i(n) \varepsilon_j(n) \right\} \qquad (148)$$

In the case of a single user having a minimum distance error event, the asymptotic efficiency is $$\eta = d_{free} \qquad (149)$$

For k users each having an error event of weight $d_{free}$, $|h_{ij}| < 1$ for $i \neq j$ and lower bound the minimum distance as follows $$d^2 > \sum_{n=1}^{N} \left\{ \sum_{j=1}^{K} \varepsilon_j^2(n) - 2 \sum_{i<j} |\varepsilon_i(n)||\varepsilon_j(n)| \right\} \qquad (150)$$

For each user's error event, it can be selected so that it aligns with one other error event during one bit interval. However, having more bits in the error events align (and be of opposite sign) is a function of the random interleaving. The probability of further alignment decreases as the interleaver size increases. In particular, for a random interleaver, $$\Pr[|\varepsilon_i(n)|] = \begin{cases} \dfrac{d_{free}}{N} & \text{if } |\varepsilon_i(n)| = 1 \\ 1 - \dfrac{d_{free}}{N} & \text{if } |\varepsilon_i(n)| = 0 \end{cases} \quad (151)$$

and $$E[\min\{d^2\}] > \sum_{n=1}^{N} \left\{ \sum_{j=1}^{k} \varepsilon_j^2(n) - (K^2 - K)\left(\dfrac{d_{free}}{N}\right)^2 \right\} - 2k \quad (152)$$

$$= k d_{free} - (K^2 - K)\dfrac{d_{free}^2}{N} - 2k$$

where the fact that there are $K^2-K$ off-diagonal terms in a $K \times K$ matrix is used. The last term on the right hand side of (152) represents the ability to align k bits of the k user error events. Forcing the k-user bound given by (152) to be greater than the single user bound, $E[\eta] > d_{free}$, produces the condition $$N > \dfrac{(K^2 - K)d_{free}^2}{(k-1)d_{free} - 2k} \quad (153)$$

For the denominator to be positive for all k, $d_{free} > 4$. Under this condition the denominator is minimized when k=2, so a sufficient condition is $N > (K^2-K)d_{free}^2 > K^2 d_{free}^2$.

The first important observation about this theorem is that it applies to all synchronous Gaussian multiuser channels, not just K-symmetric channels. Secondly, although the theorem applies to the expected value of the asymptotic efficiency, the proof shows that value is deterministic for the case of an error event by a single user, and that the expected value for k-user error events can be considerably larger, by choosing N sufficiently large. Consequently, the result is expected to be quite accurate in practice.

The random interleaving has the effect of causing the minimum distance error event to have essentially zero probability. This is similar to what was observed with Turbo codes. It has a similarly beneficial effect with multiuser detection when there is a high correlation between users. Although in this case, it is not dependent on the use of systematic, recursive convolutional codes.

This theorem highlights the importance of not separating the detection and decoding problems. Even in an uncoded case, the efficiency of an optimum detector degrades for $\rho > 0.5$. This loss disappears when the detection process is not separated from the decoding process.

Corollary 2.1. The results of Theorem 3.4 applies when H is time-varying.

Unfortunately, with random interleaving, the trellis is unmanageable, and constructing an optimum decoder, even for two users, appears computationally prohibitive.

Figure 45:
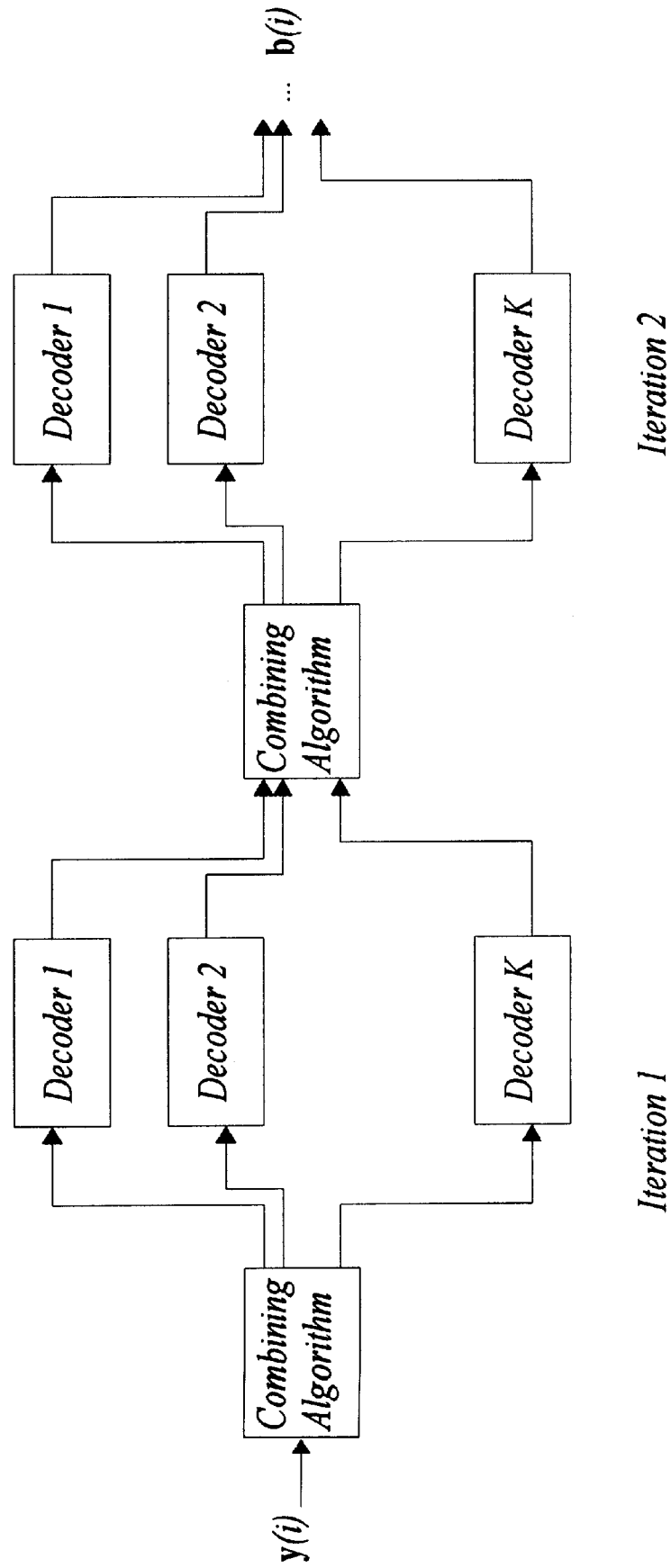
FIG. 45 is an illustration of iterative multiuser detection algorithm.

An intuitive approach to multiuser detection with coding is illustrated in FIG. 45. With this intuitive approach, the outputs of the K matched filters are combined to produce an initial estimate of the code bits of each user. These individual data streams are then decoded in parallel. The updated estimates of the code bits provided by the parallel decodings are then combined to provide a new set of estimates and the process is repeated. This is iterated until there is convergence. Given the intuitive structure for an iterative algorithm suggested by FIG. 45, it would be advantageous to use the theoretical framework provided by minimum cross entropy (MCF) to determine a combining algorithm. In the MCE framework, the K decoders (including interleaving and de-interleaving) of FIG. 45, represent a projection unto the K-constraint sets satisfied by the data.

Unlikely other decoders, the iterative structure shown in FIG. 45 operates in parallel rather than serially. Technically, the decoders could be arranged in a serial fashion. Alternatively, when one has unequal power users it may be advisable to decode the users in order of signal strength, starting with the strongest user first.

Modifications to the iterative MCE algorithm are made to accommodate the parallel structure. Preferably, the modified algorithm converges. For a given output, y(i) of the bank of K matched filters, b(i) represents the corresponding transmitted code vector, and the code sequence for a particular user is represented by $b_k = (b_k(1), \ldots b_k(N))$.

Lemma 1.1 Equivalence of parallel and serial implementations. Given an a priori distribution $q_o(b)$ of the random variables $$b = \begin{bmatrix} b_1 \\ b_2 \\ \vdots \\ b_K \end{bmatrix} \quad (154)$$

and the K constraint sets $C_1, \ldots C_K$, corresponding to the code and interleavers of the K users, let $$p[b] = q_0[b]g_1(b)g_2(b)g_3(b) \ldots g_K(b) \quad (155)$$

be the MCE distribution after applying each of the constraint sets serially. Let $$p^1[b] = q_o[b]g_1'(b) \quad (156)$$

$$\ldots$$

$$p^K[b] = q_o[b]g_K'(b)$$

be the K MCE distributions obtained if the constraints are applied in parallel. Let $$p'[b] = \dfrac{p^1[b] \ldots p^K[b]}{(q_o[b])^{K-1} v_1} \quad (157)$$

where $v_1$ is a normalization constant chosen such that $\Sigma_b p'[b] = 1$. If this is a coding problem and the constraints are parity check equations then $$p'[b] = p[b]. \quad (158)$$

MCE distribution is the product of the intrinsic (a priori) distribution and the extrinsic (code constraints) distribution. This lemma shows how to combine the output of the parallel scheme to produce the same output as the serial scheme. Equivalence of the parallel and serial implementations of the MCE algorithm only apply to the coding application, due to the structure of the constraints.

Given the equivalence of the parallel and serial implementations, the convergence theorems of both the original and the modified MCE algorithms hold. That is, a true MCE implementation will converge to the most probable K-dimensional sequence (codeword). Given the superior performance of the modified MCE algorithm when used with the practical assumptions, it is used below. The following lemma results.

Lemma 1.2 A priori distribution with parallel implementation. With the definitions of Lemma 1.1 and the modified MCE algorithm, the appropriate a priori distribution to use with the kth branch of the parallel implementation is $$q^k[b] = q_0[b] g_1(b) \ldots g_{k-1}(b) g_{k+1}(b) \ldots g_k(b)/v_k \tag{159}$$

where $v_k$ is the appropriate normalization constant.

Lemmas 1.1 and 1.2 define the theoretically optimum method for combining the various probability distributions obtained at each stage of the detection process.

Thus, a MCE decoder exactly as shown in FIG. 45 is constructable. The a priori distribution $q_0[b]$ is derived from the matched filter outputs y. This a priori distribution is the input of each of the K parallel de-interleaver/decoder/interleaver combinations. The resulting distributions are then combined as described in Lemma 1.2, and the process is iterated. The difficulty is, as with previous MCE algorithms, that all operations apply to the multi-dimensional distribution of b. This corresponds to $2^{KN}$ function values which can be huge, even for small K and N. Consequently, in practice, the exact implementation of the iterative MCE algorithm is too complex and several approximations must be made.

Clearly, the objective is to use the BCJR algorithm operating only on $b_k$ for the kth decoder suggesting the following suboptimum algorithm.

i) Calculate the initial a priori distribution $q_0[b]$ from the matched filter outputs y. If we let $\theta[.]$ represent the probability measure associated with the channel and data prior to any decoding, then define $$q_o[b] = \theta[b \mid y] \tag{160}$$

$$= \frac{\theta[y \mid b] \theta[b]}{\theta[y]}$$

For a Gaussian memoryless channel $$\theta[y(i) \mid b(i)] = \tag{161}$$

$$\frac{\det(H)}{\sqrt{2\pi\sigma^2}^{K/2}} \exp\left\{-\frac{1}{2\sigma^2}(y(i) - Hb(i))^T H^{-1}(y(i) - Hb(i))\right\}$$

where the noise has a covariance $\sigma^2 H$. The distribution $\theta[b]$ corresponds to a uniform distribution if the transmitted bits are equiprobable and independent. The denominator in (160) is equivalent to a normalization term. Throughout the following a memoryless channel is assumed and the time dependence I are suppressed.

ii) Form the corresponding marginal distributions:

$$q_o[b_k] = \sum_{B_k} q_o[b] \tag{162}$$

here $B_k$ is the set of all $2^{K-1}$ bit patterns for all users except the kth.

iii) Perform K parallel BCJR decodings, using $q_0[b_k]$ as inputs to the respective decodings. This produces the distribution $$p_j[b_k] = q_{j-1}[b_k] g_k(b_k) \tag{163}$$

where the subscript j refers to the iteration number. This corresponds to an MCE decoding under the assumption that the random interleaving makes successive bits independent.

The optimal MCE algorithm calculates a pdfs for the complete data set b at the output of each decoder and Lemma 1.2 shows how to combine them. After step iii), only marginal distributions $p_j[b_k]$ at the output of each decoder are present and Lemma 1.2 does not apply directly. One approach is to assume the K marginal distributions are independent, and then combine them in a fashion indicated by Lemma 1.2. It is reasonable to assume that these distributions are independent from one symbol period to another due to the random interleaving. However, the K user symbols at one particular time are potentially highly correlated through the matched filter samples. Thus, this second independence assumption does not appear reasonable. An alternative approach is to use the Bayesian rule based on (160) for updating the prior distributions.

iv) The a priori distribution for the jth iteration is given by $$q_j[b] = \frac{\theta[y \mid b] \prod_{k=1}^{K} p_j[b_k]}{v_j} \tag{164}$$

where $v_j$ is the appropriate normalization constant. This combining algorithm still implicitly combines the decoder outputs, as if they were independent, but the resulting distribution is not independent.

In the actual computation, the complete distribution given by (164) is not required. What is required are the marginal distributions analogous to (162). In addition, use of the modified MCE algorithm is preferred. Analogous to Lemma 1.2, this now corresponds to using only the extrinsic information for the other users when updating the current users. Thus the modified fourth step is the following.

iv') The a priori marginals for the jth iteration are updated according to $$q_j[b_k] = \frac{\theta[b_k]}{v_{jk}} \sum_{B_k} \theta[y \mid b] \prod_{i \neq k} p_j[b_i] \tag{165}$$

where $v_{jk}$ are the appropriate normalization constants.

The combining algorithm described by (165), indicates a linear combination of the Gaussian pdfs associated with each code vector b, using a weight associated with that code vector determined by the previous decoding stage, and normalize the result. When estimating the new marginal distribution for $b_k$, information regarding $b_k$ obtained from a previous decoding stage is not used and instead a uniform distribution is assumed.

Thus, the proposed suboptimum algorithm consists of steps i), ii), followed by repeated execution of steps iii) and iv'). It should be emphasized that it is assumed that the bits in different time intervals are independent. In particular, $$p_j[b_k] = \prod_{n=1}^{N} p[b_k(n)] \tag{166}$$

This implies that all of the probability distribution calculations (except for the BCJR algorithm) are calculable one bit interval at a time.

Simulation results for the proposed iterative detection algorithm are presented below. Results are presented for two, five, and ten users over a K-symmetric channel with a variety of ρ values. All simulations use a block size of 500 information bits for each user. Each user uses the same rate ½ constraint length 5 convolutional code with generators [10011] and [11101]. Each user uses a different pseudo-random interleaver and the same set of interleavers is used for all simulation runs. Each simulation point is tested for the minimum of 1600 errors or 4 million bits.

Figure 46:
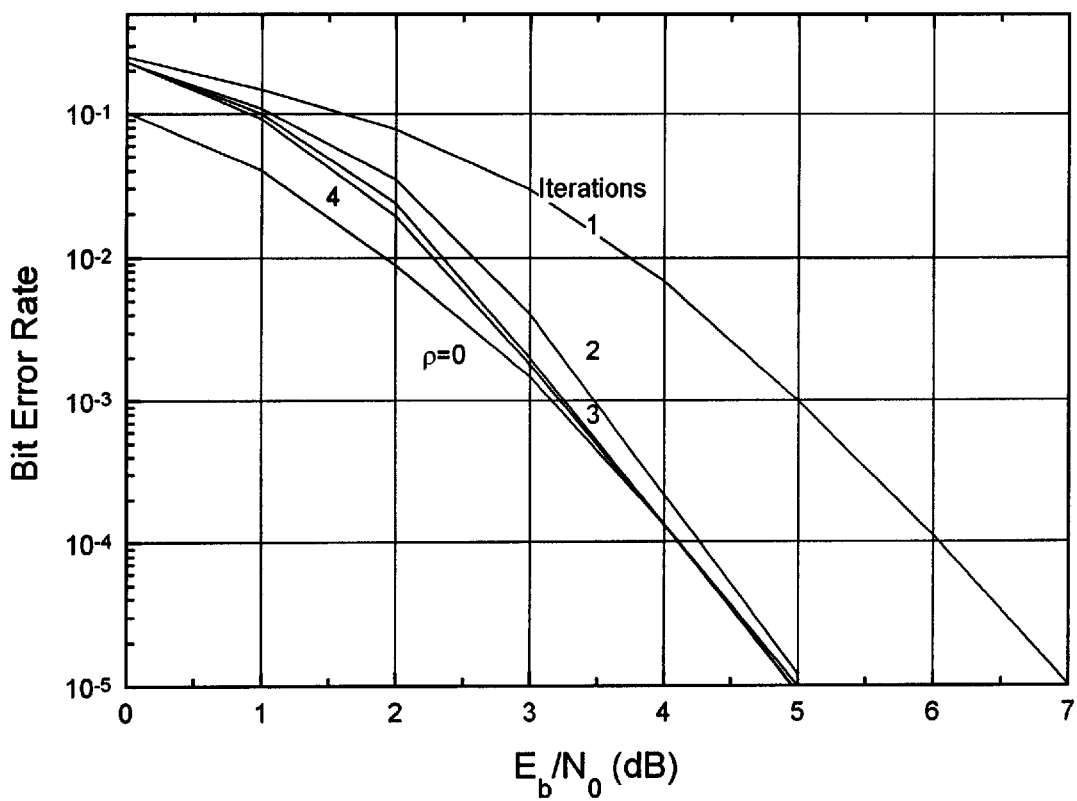
FIG. 46 is a graphical comparison of BER performance of iterative detector with two users and $\rho=0.75$ to ideal single user performance.

Two user results. In FIG. 46 the performance of the iterative detector with 1, 2, 3 and 4 iteration stages for two users with a $\rho=0.75$ is shown. This corresponds to a significant amount of multiple access interference. For comparison purposes, the single user results, corresponding to a $\rho$ of 0, are included. Performance converges with a small number of iterations to the equivalent performance obtained in a single user channel and does so at quite low $E_b/N_0$. At an $E_b/N_0$ of 0 dB the loss is less than 1 dB. This is very good performance considering the high correlation between the users.

Figure 47:
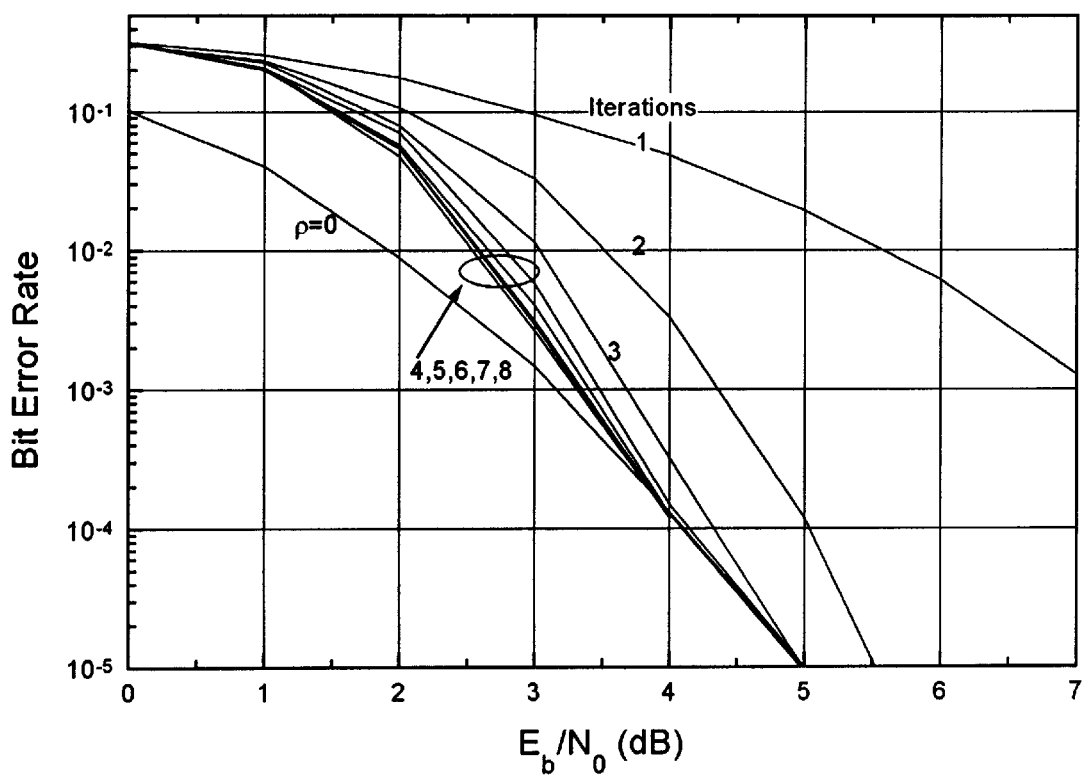
FIG. 47 is a graphical comparison of BER performance of iterative detector with two users and $\rho=0.90$ to ideal single user performance.

In FIG. 47, a same situation with two users but with a higher cross-correlation, $\rho=0.90$ is shown. When comparing FIGS. 46 to 47, performance is significantly worse after the first iteration in FIG. 47 but with enough iterations performance still converges to single user performance. At the low end performance degrades as correlation increases. Further iteration does not improve matters in this case. There is rapid convergence to single user performance at an $E_b/N_0$ of 4 dB and higher. These results support Theorem 3.4, indicating that there is no asymptotic loss with random interleaving, and also indicating the near-optimum performance of the MCE-based decoding algorithm.

Figure 48:
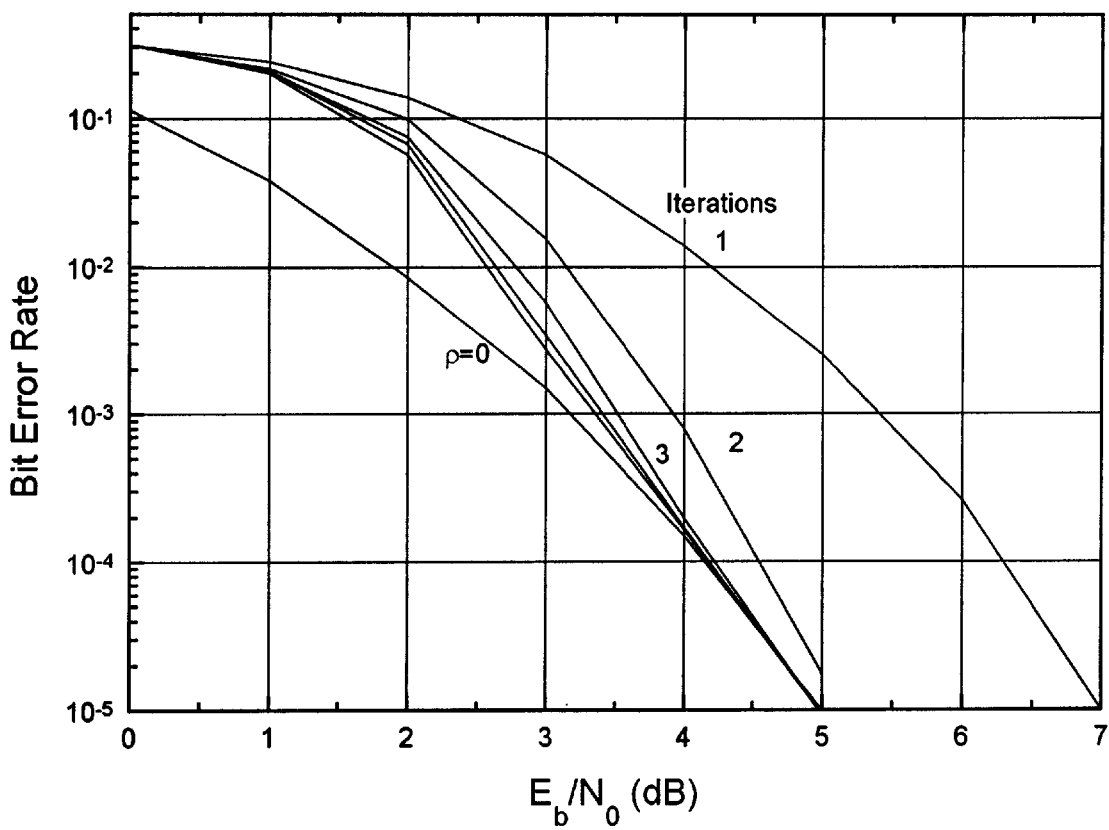
FIG. 48 is a graphical comparison of BER performance of iterative detector with five users and $\rho=0.60$ (1,2,3,4 and 5 iterations) to ideal single user performance.
Figure 49:
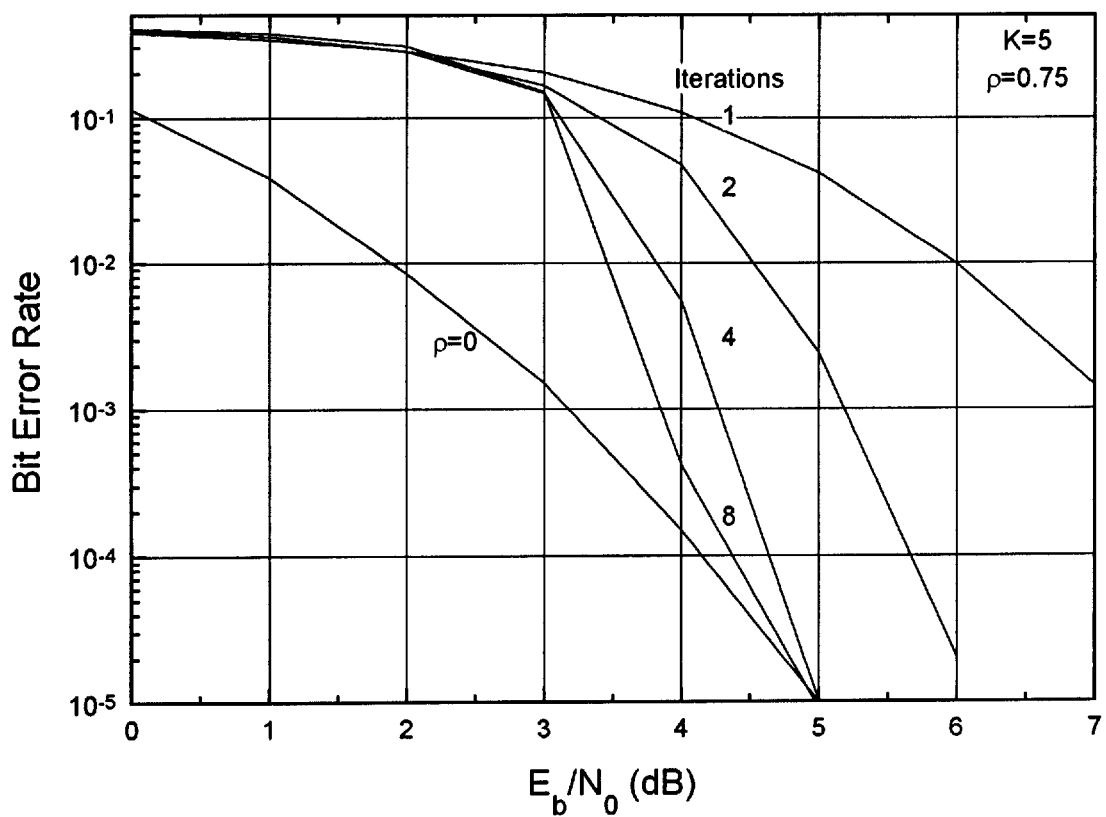
FIG. 49 is a graphical comparison of BER performance of iterative detector with five users and $\rho=0.75$ (1,2,4 and 8 iterations) to ideal single user performance.

Five user results. In FIG. 48, the performance of the iterative detector with five users and a $\rho$ of 0.60 is shown. The results are quite similar to the two-user case, there are no significant additional losses as the number of users increases. In FIG. 49, the performance with five users and a $\rho$ of 0.75 is shown. Performance is starting to change and to degrade significantly at the lower $E_b/N_0$ ratios. A threshold effect is becoming apparent. Above the threshold, performance still converges to single user performance with enough iterations. Below the threshold, the channel is unusable.

Figure 50:
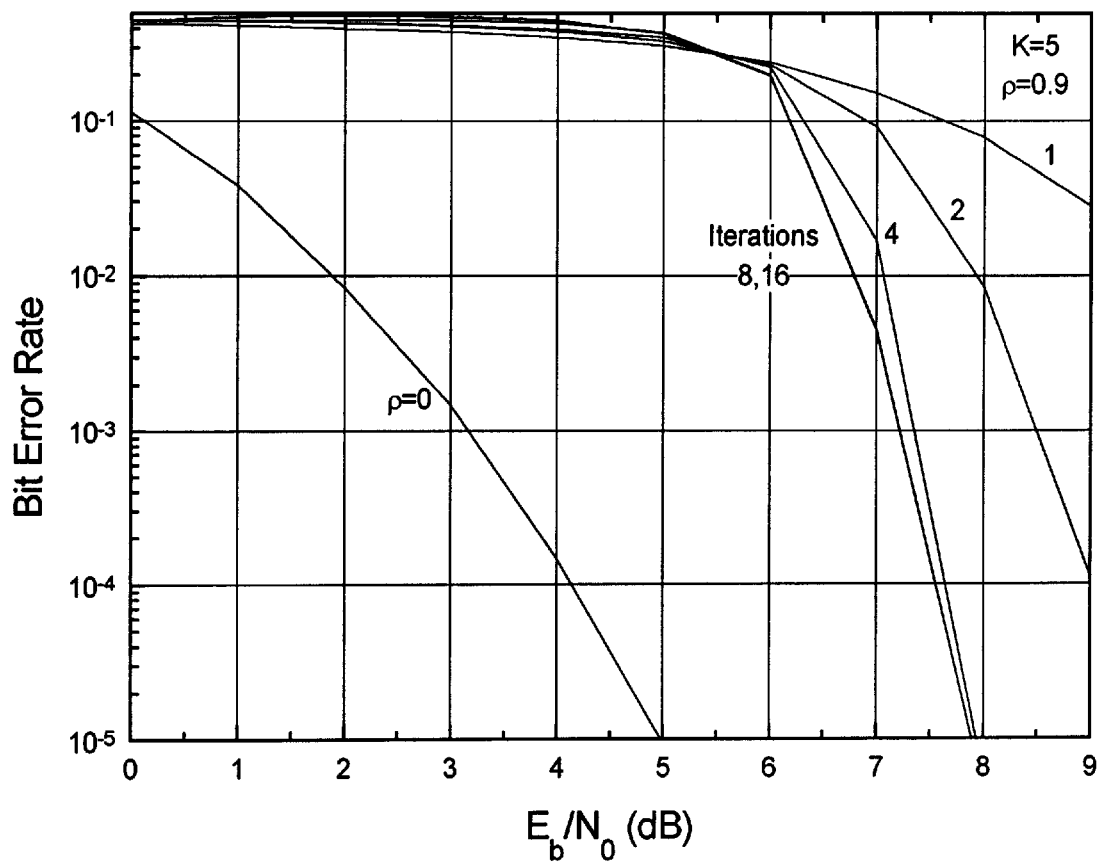
FIG. 50 is a graphical comparison of BER performance of iterative detector with five users and $\rho=0.90$ (1,2,4, 8 and 16 iterations) to ideal single user performance.

In FIG. 50, the performance with five users and a $\rho$ of 0.90 is shown. In this case, the threshold effect is even more apparent, and performance has moved significantly away from the single user performance curve. The degradation is 3 dB at a bit error rate of $10^{-5}$ and no amount of iteration will improve upon this.

Figure 51:
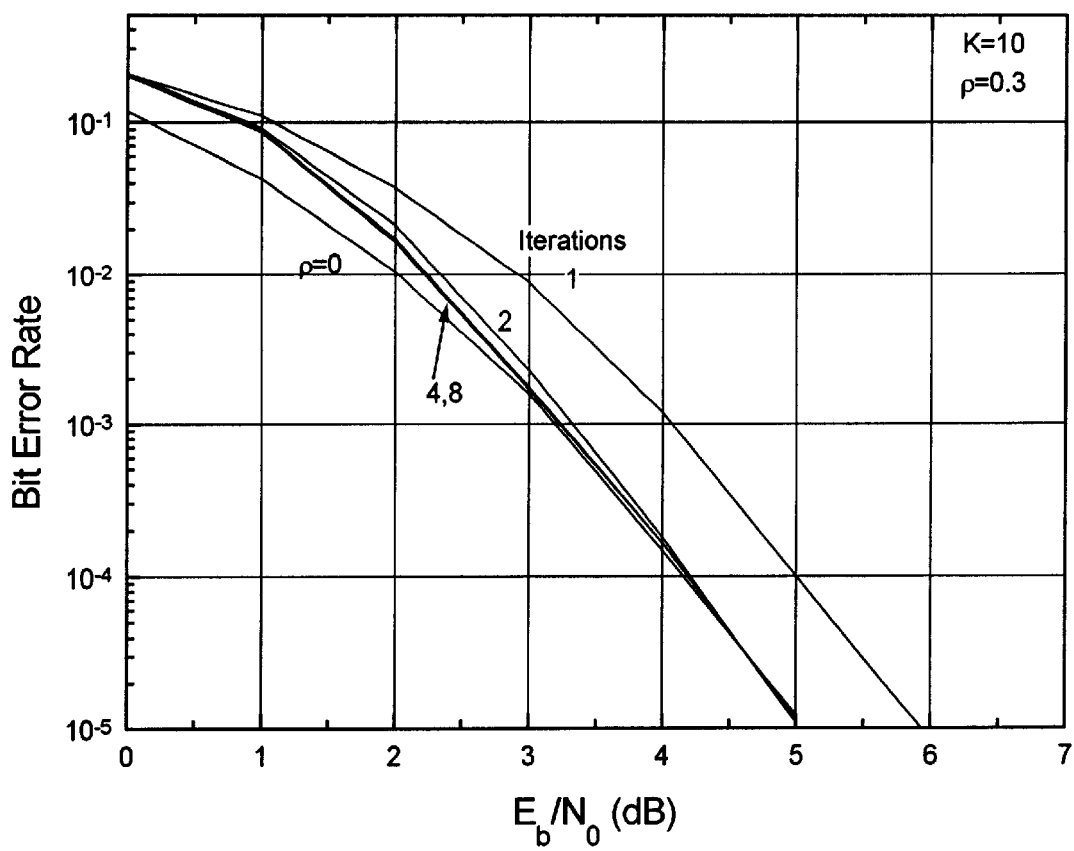
FIG. 51 is a graphical comparison of BER performance of iterative detector with ten users and $\rho=0.30$ (1,2,4 and 8 iterations) to ideal single user performance.

Ten user results. The simulation results with ten users and a $\rho$ of 0.30 are shown in FIG. 51. Performance in this case is quite similar to the two-user case with rapid convergence to single user performance and only marginal degradation at low $E_b/N_0$ ratios.

Figure 52:
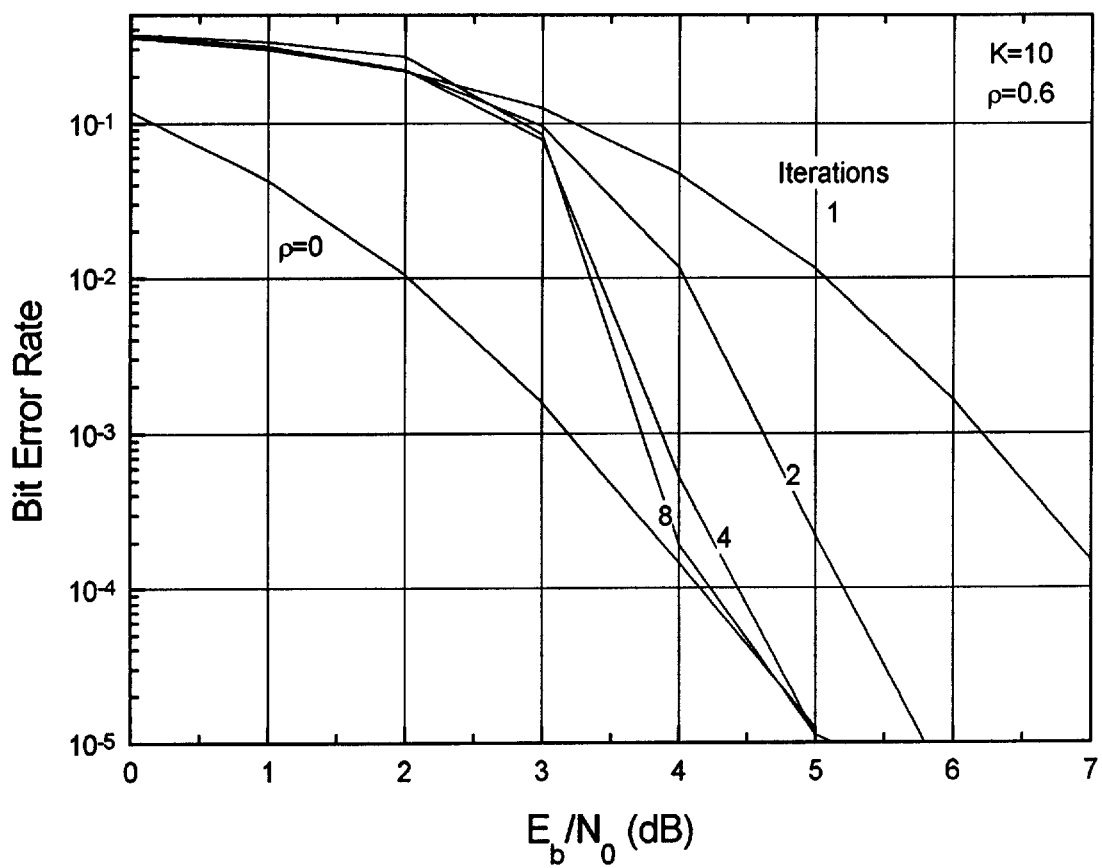
FIG. 52 is a graphical comparison of BER performance of iterative detector with ten users and $\rho=0.60$ (1,2,4 and 8 iterations) to ideal single user performance.

In FIG. 52, the simulated performance with ten users and a $\rho$ of 0.60 is shown. In this case, performance on the first iteration is significantly degraded and a threshold is becoming apparent. That is, there is a $E_b/N_0$ above which iteration improves performance and below which, it degrades performance. However, with enough iterations performance still converges to the single user performance for $E_b/N_0$ ratios of 4 dB and higher. This is somewhat surprising. One would expect that, if five users with a $\rho$ of 0.9 significantly degrades the detector performance, then ten users with a $\rho$ of 0.6 would also cause difficulty, particularly since the variance of the multiple access interference, $\rho^2(K-1)$, is identical in these two cases.

Figure 53:
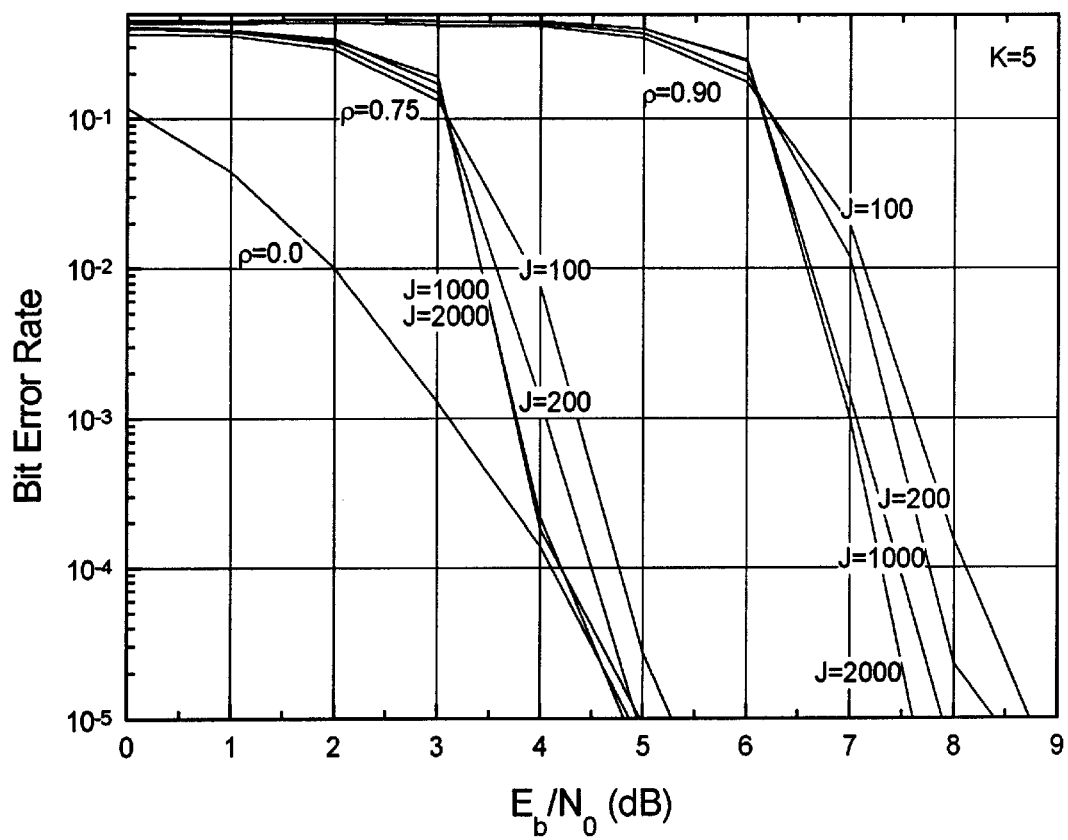
FIG. 53 is a diagram illustrating dependence of detector performance on interleaver size for cross-correlations of $\rho=0.75$ and 0.90 where results are for five users and rate ½ constraint length 5 convolutional code and eight iterations of the joint detector.

Interleaver size. As the earlier analysis indicated, the larger the interleaver size, the more the results are expected to approximate those of random coding. The expected value of the efficiency is still expected to be $d_{free}$ of the code, but the variation about this mean should intuitively decrease as the block size increases. In FIG. 53 the performance with K=5 users with interleaver sizes of 100, 200, 1000, and 2000 information bits (approximately twice this many channel bits) are shown for the constraint length 5 rate ½ convolutional code. Results are shown for the K-symmetric channel with cross-correlation values of $\rho=0.75$ and 0.90. As the results show, the interleaver size has little affect on the threshold behaviour of the detector. Although the simulation results are not conclusive, it also appears that the interleaver size has little effect on the asymptotic performance of the detector. The interleaver size does affect the slope of the performance curve above threshold before it asymptotes to single user performance. Larger interleaver sizes improve performance in the range between threshold and single user performance. The results shown in FIG. 53 correspond to eight iterations in each case. Although not shown, simulation results indicate that increasing the interleaver size has little effect on the rate of convergence. That is, the different interleaver sizes require a similar number of iterations for performance to converge.

Figure 54:
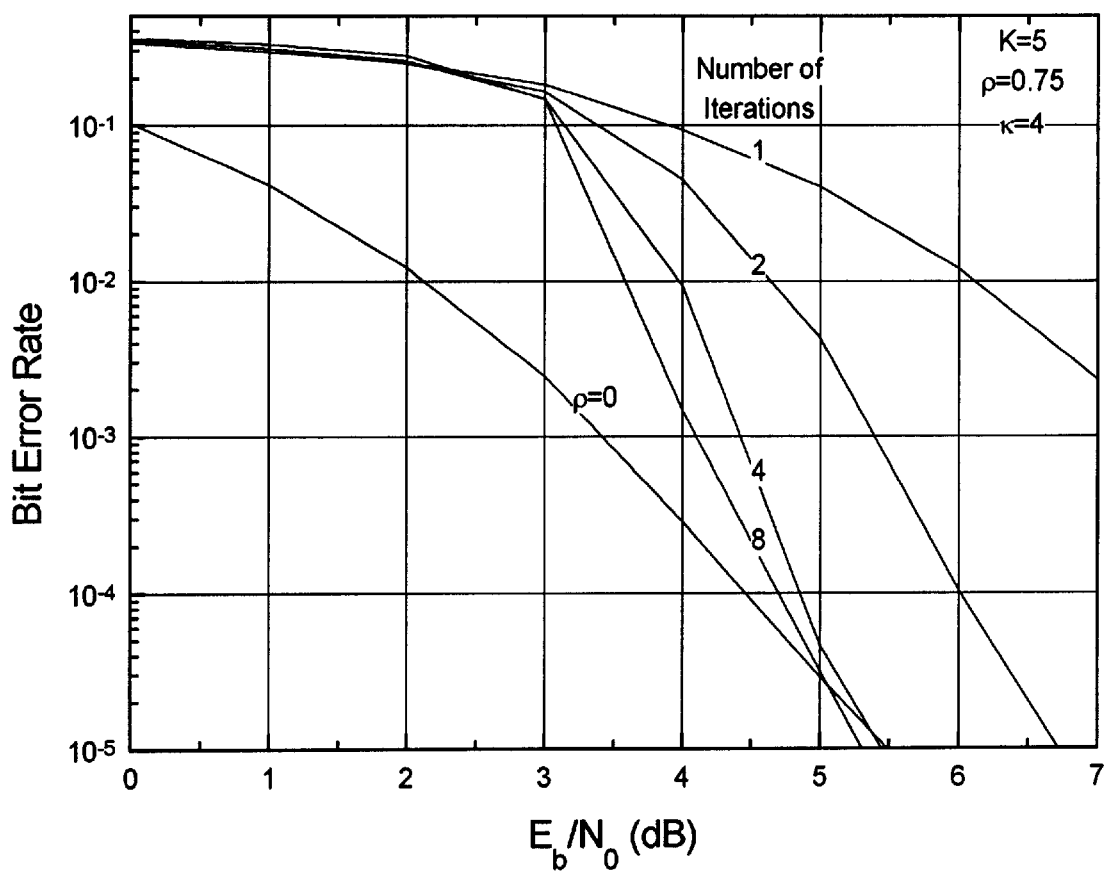
FIG. 54 is a graphical illustration of BER performance of multiuser detector with rate ½ constraint length 4 convolutional code over K-symmetric channel with $\rho=0.75$ and K=5 users. Interleaver contains 500 information bits.
Figure 55:
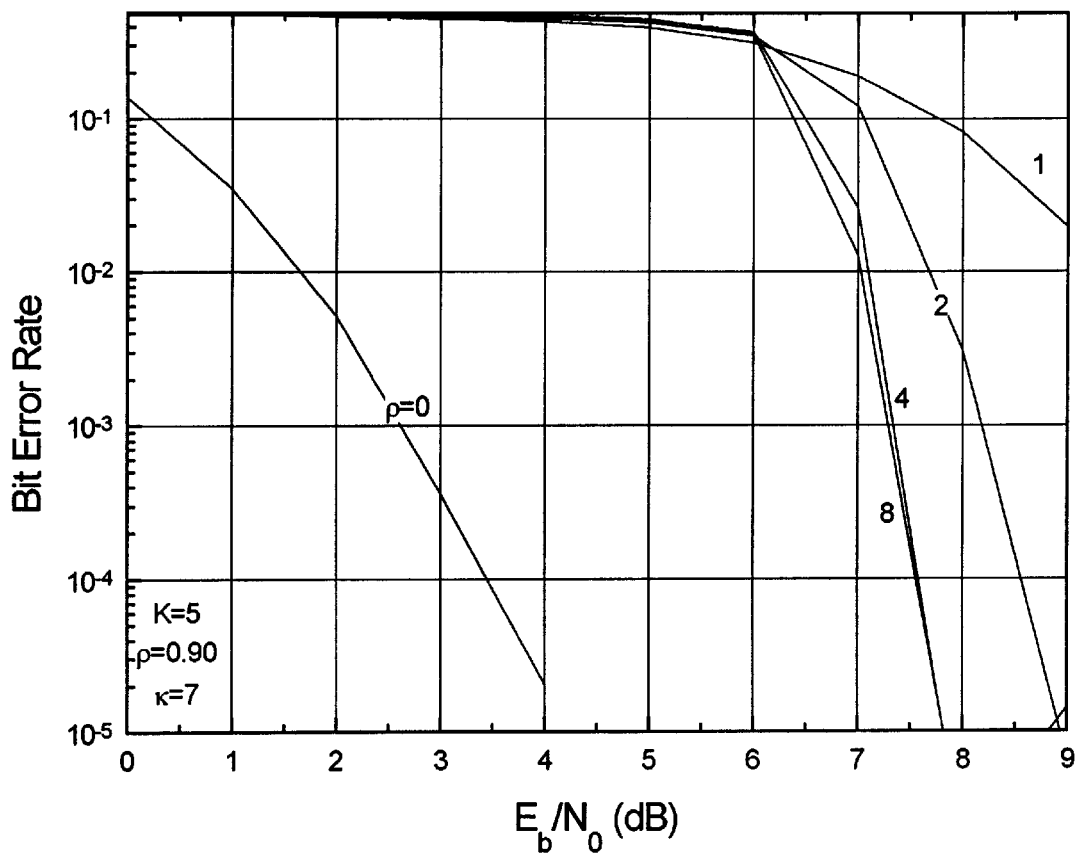
FIG. 55 is a graphical illustration of BER performance of multiuser detector with rate ½ constraint length 7 convolutional code over K-symmetric channel with $\rho=0.90$ and K=5 users. Interleaver contains 500 information bits.

Code dependence. The dependence of performance on the forward correction code is also of interest. For comparison with the constraint length 5 rate ½ convolutional code used to this point, rate ½ convolutional codes with constraint lengths of 4 and 7 were simulated. The generator matrices for these codes are given by [1101 1111] and [1011011 1111001], respectively. The performance results with the constraint length 4 code and an interleaver size of 500 information bits are shown in FIG. 54 for a K-symmetric channel with five users and a $\rho=0.75$. The corresponding results for the constraint length 7 code are shown in FIG. 55 for a K-symmetric channel with a $\rho=0.90$. The results are qualitatively similar to the constraint length 5 code in both cases. In particular, the threshold does not appear to depend upon the forward error correction code used. Although not shown here, performance was also simulated with a recursive systematic code and the performance obtained was qualitatively the same as obtained with the non-recursive codes shown here.

General observations. In general, the iterative detector performs well under a wide variety of channel conditions, asymptotically achieving single user performance in most cases. Below the threshold SNR, increasing the number of iterations generally degrades performance. While, above threshold, increasing the number of iterations generally improves performance. Further, as K and $\rho$ become large, numerical difficulties with the algorithm result, particularly at the higher signal to noise ratios.

Also, there are rare occurrences in the execution of the BCJR algorithm where the forward and backward predictors are inconsistent. That is, the set of states of non-zero probability, determined by the backward predictor, does not intersect the corresponding set of the forward predictor. This suggests the existence of an error event of distance zero or close to it. In some cases subsequent iteration will correct this. This is not unexpected as Theorem 3.4 is a statistical result and some variation is expected with different interleavers.

Figure 56:
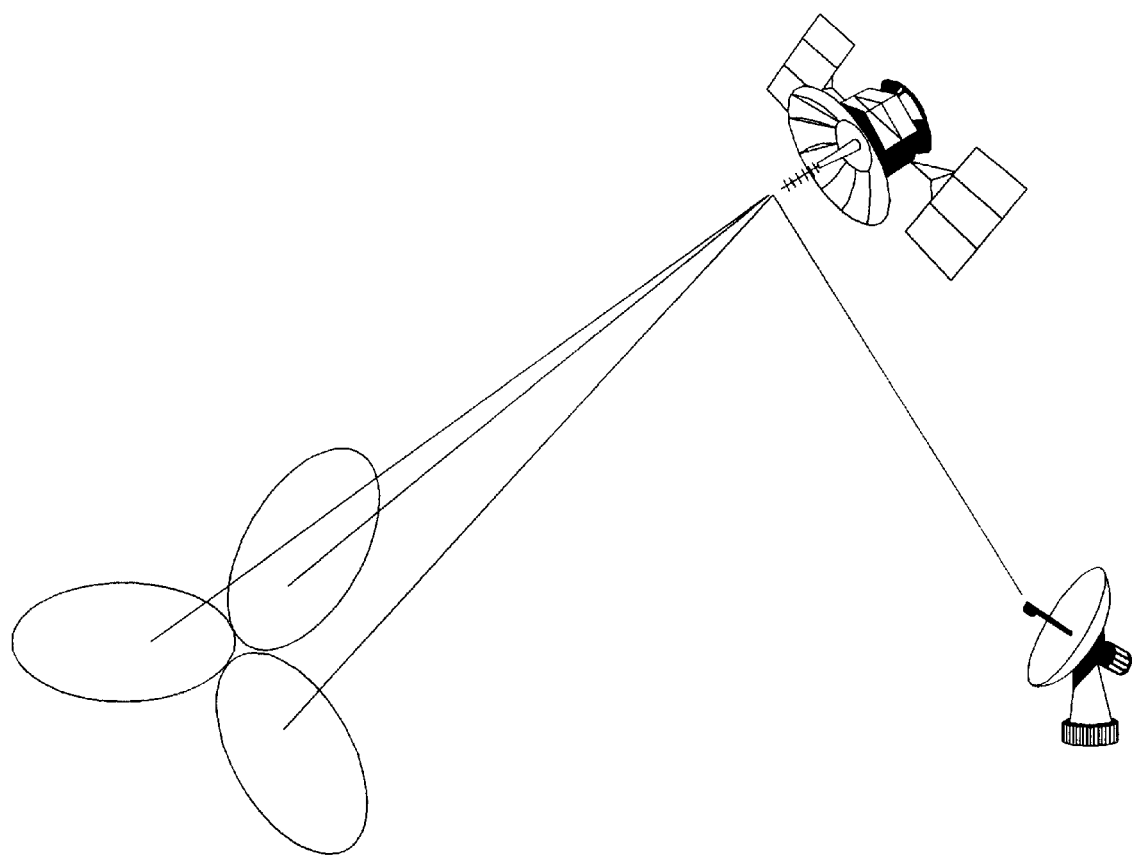
FIG. 56 is an illustration of co-channel interference with multi-beam satellites.

Below, other embodiments and applications are discussed. A more practical application is addressed with a problem occurring on a return link of a multibeam satellite, as well as in several other circumstances. In the satellite case, there are a number of spotbeams (or cells) to which communications are to be provided. To maximize spectral efficiency, it is preferred to use a same frequencies in each of the spotbeams. A simplification of this situation is illustrated in FIG. 56. The satellite antenna characteristics provide some isolation between adjacent spotbeams but, in general, it is not enough by itself to allow frequency re-use in adjacent beams. In particular, the spotbeam edges are often only 3 dB lower than the centre of the beam. One approach is to use a spread spectrum modulation, in order to further increase the isolation between users in adjacent beams. However, the majority of existing satellite systems are narrowband, i.e., minimal excess bandwidth per carrier, and for this reason it is undesirable to make spread spectrum a requirement.

On the return link, a system usually has access to received signals from each spotbeam at a same earth station. This allows a possibility of performing joint processing. Since each signal is received in each spotbeam, albeit with varying degrees of attenuation, this amounts to a multiuser detection problem with diversity.

An overview of the detection strategy follows. There are p receivers for K users. Often, p equals K. As noted above, the noise-free portion of the received signal with spatial diversity can be represented as $$S(b, t) = \sum_{i=1}^{N} \sum_{k=1}^{K} a_k b_k(i) \sqrt{w_k}\, s_k(t - iT - \tau_k) \quad (167)$$

$$S \in R^p(-\infty, \infty).$$

The vector $a_k \in R^p$ represents the gain of the p different receivers (sensors) for user k. For k=1, $a_k$ typically has the form $$a_1 = \begin{bmatrix} 1 \\ a_{12} e^{j\theta_{12}} \\ \vdots \\ a_{1p} e^{j\theta_{1p}} \end{bmatrix}. \quad (168)$$

The channel gain $w_k$ in equation (167) represents individual user gain effects such as propagation losses, power control, and fading. When combined with additive Gaussian noise, the received signal is $$r(t)=S(b,t)+n(t) r \in R^p(-\infty,\infty) \quad (169)$$

where n(t) is a p-vector of independent white Gaussian noise samples with $$E[n(t)n(s)^H]=\sigma^2 I \delta(t-s)\ I \in R^{p \times p} \quad (170).$$

Figure 57:
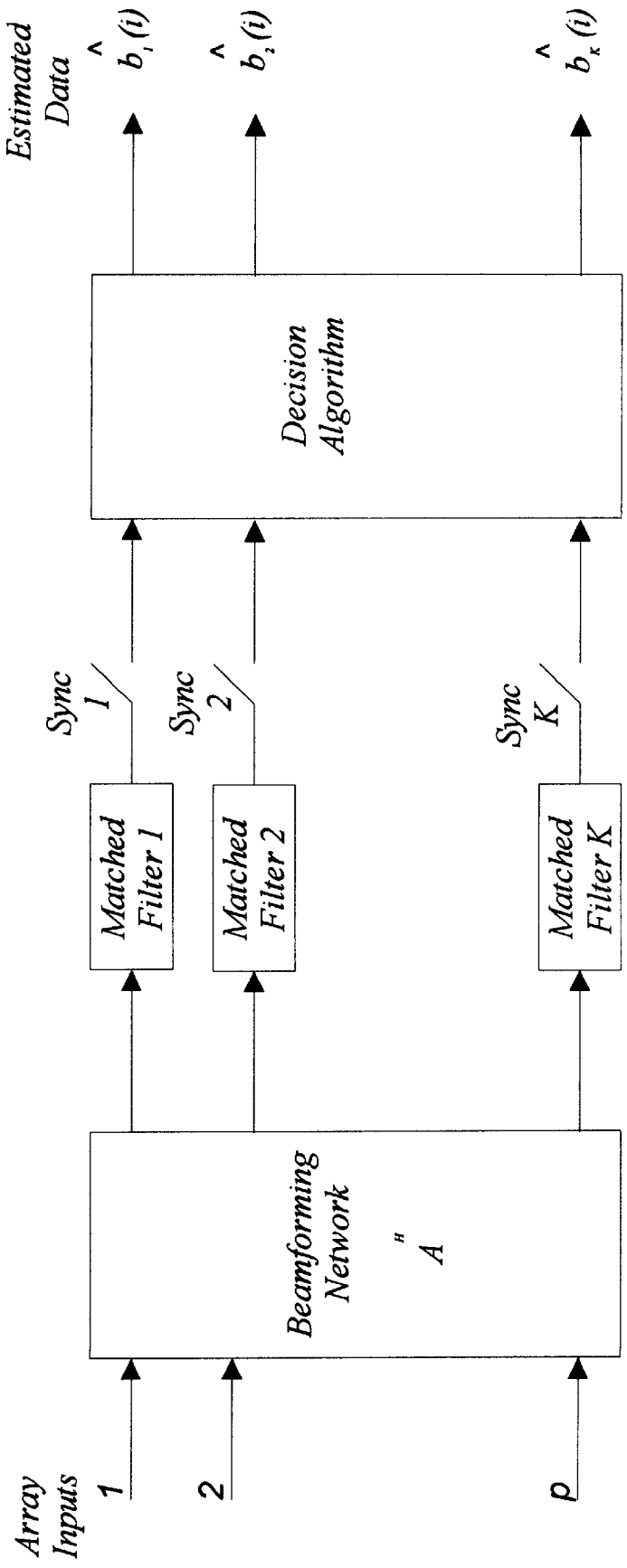
FIG. 57 is a simplified diagram of a process structure for multiuser detection with spatial diversity.

As described above, the optimum approach with spatial diversity is to first process the received signal vector with a transformation matched to the beamforming network and then match filter the outputs, as illustrated in FIG. 57.

With this approach the spatial-temporal cross-correlation matrix for the different users in the synchronous case is given by $$H_{ij} = \text{Re}\left[ a_i^H a_j \int_{-\infty}^{\infty} s_i(t - \tau_i) s_j^*(t - \tau_j) dt \right] \quad (171)$$

$$H \in R^{K \times K}$$

where $s_k(t)$ is the normalized waveform of the kth user. The corresponding equivalent discrete time model for generating the matched filter outputs y(i) is given by $$y(i)=HW^{1/2}b(i)+n(i) y(i) \in R^{K \times 1},\ i=1\ldots M \quad (172)$$

As with the non-diversity case, the matched filter outputs represent sufficient statistics for obtaining the optimum solution. The receiver in FIG. 57 maximizes the signal to noise ratio on the samples y(i), as shown above. After the matched filtering the sampled output noise process is not white. In particular, $$E[n(i)n(j)^T]=\sigma^2 H \delta(i-j) \quad (173)$$

analogous to the non-diversity case.

The diversity case is characterised by defining a simple but representative channel for K users. This model is based on the multibeam satellite scenario. It assumes that all users have the same modulating waveform, and thus the cross-correlation factor between user waveforms is one. The isolation between users is provided totally by the spotbeams with the assumption that for the kth receiver $$a_k = \begin{bmatrix} \psi \\ \vdots \\ \psi \\ 1 \\ \psi \\ \vdots \\ \psi \end{bmatrix} \quad (174)$$

that is, there is a common attenuation of other user signals which is characterized by the antenna (sensor) crosstalk parameter $\psi$. Under this assumption, the K-symmetric diversity cross-correlation matrix is given by $$H = \begin{bmatrix} 1+(K-1)\psi^2 & 2\psi+(K-2)\psi^2 & \cdots & 2\psi+(K-2)\psi^2 \\ 2\psi+(K-2)\psi^2 & 1+(K-1)\psi^2 & \cdots & 2\psi+(K-2)\psi^2 \\ \cdots & \cdots & \cdots & \cdots \\ 2\psi+(K-2)\psi^2 & \cdots & 2\psi+(K-2)\psi^2 & 1+(K-1)\psi^2 \end{bmatrix} \quad (175)$$

which is equivalent to $$H = D_g \begin{bmatrix} 1 & \rho & \cdots & \rho \\ \rho & 1 & \cdots & \rho \\ \cdots & \cdots & \cdots & \cdots \\ \rho & \cdots & \rho & 1 \end{bmatrix} \quad (176)$$

where $$\rho = \frac{2\psi+(K-2)\psi^2}{1+(K-1)\psi^2} = 1 - \frac{(1-\psi)^2}{D_g} \quad (177)$$

and $$D_g=1+(K-1)\psi^2 \quad (178)$$

From (177), it is evident that ρ and ψ are nonlinearly proportional to one another with $0 \leq \rho \leq 1$ for $0 \leq \psi \leq 1$. From (176), it is clear that the diversity case is a scaled version of the non-diversity case with the main difference being the diversity gain, $D_g$.

For the K-symmetric channel, the asymptotic efficiency results for the single channel can be extended readily to the diversity case. The only additional consideration is the dependence of both the cross-correlation parameter ρ and the diversity gain $D_g$ on the number of users K.

For the uncoded case, the following result on the asymptotic efficiency of the three detectors: conventional, decorrelating, and optimum were considered in the uncoded case above.

Lemma 2.1 (Uncoded efficiencies with diversity). The asymptotic efficiency of the three uncoded detectors: conventional, decorrelating, and optimum, with a K-symmetric diversity channel are increased by a factor $D_g$.

Figure 58:
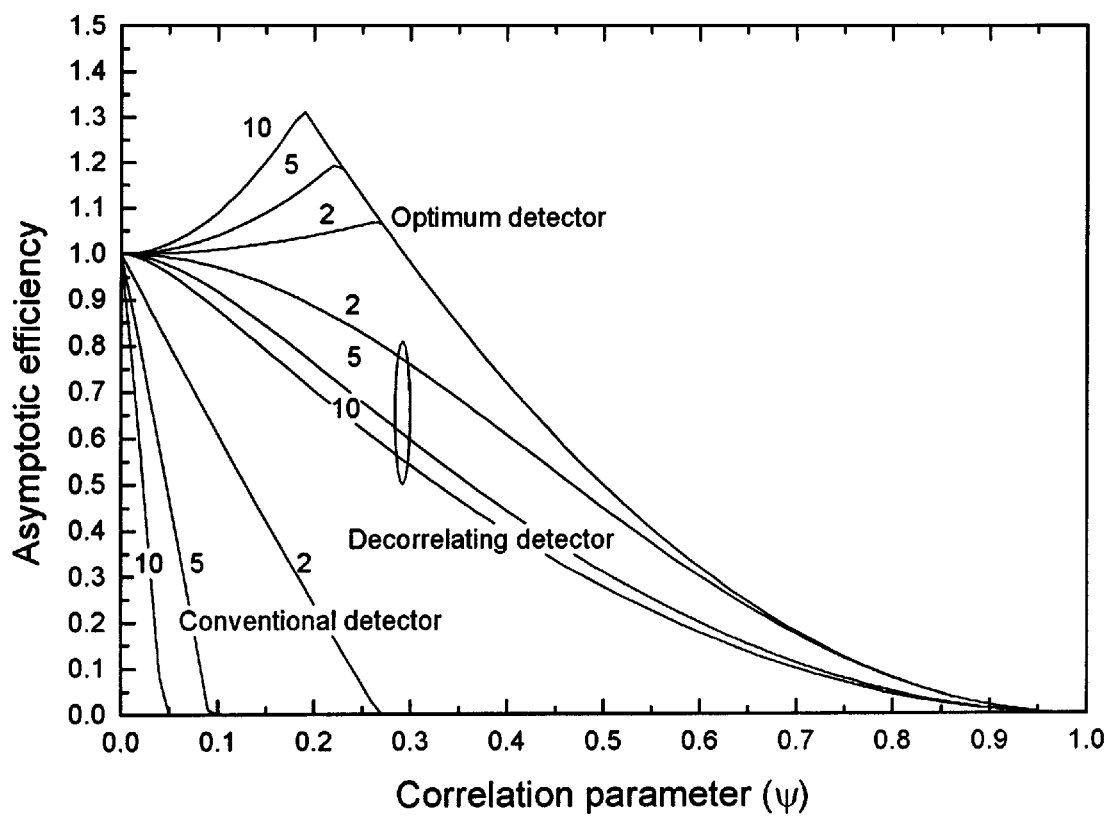
FIG. 58 is a diagram of asymptotic efficiency of different detectors over K-symmetric diversity channel for 2, 5, and 10 users.

This lemma is proved by simply observing that the difference, between the discrete time model for the diversity case and the non-diversity case, is equivalent to a reduction in the noise variance by the factor $D_g$. A comparison of the asymptotic efficiencies of the three detectors, as a function of the crosstalk parameter, ψ, between users is shown in FIG. 58 for the cases of two, five and ten users. The effects of the diversity gain are apparent with the optimal detector, while they are not apparent with the decorrelating and conventional receivers. For larger values of ψ, the asymptotic efficiency of the optimum detector does not depend upon the number of users. The performance with the conventional and decorrelating detectors is qualitatively similar to that obtained with the single channel.

Similar to the uncoded case, the following lemma is for a forward error correcting code of distance $d_{free}$.

Lemma 2.2 (Coded efficiencies with diversity). The asymptotic efficiency of the three uncoded detectors: conventional, decorrelating, and optimum, with a K-symmetric diversity channel are increased by a factor $D_g$.

The proof is the same as in the uncoded case. This result also applies when there is pseudo-random interleaving of the different users over a K-symmetric channel. In the latter case, however, it only applies to the expected value of the asymptotic efficiency for the K-symmetric channel. It does not apply to a general Gaussian channel but a similar result is expected there.

Given these similarities to the non-diversity case, the iterative MCE detection techniques noted above can be applied directly to the diversity case, and qualitatively similar results are predicted.

Figure 59:
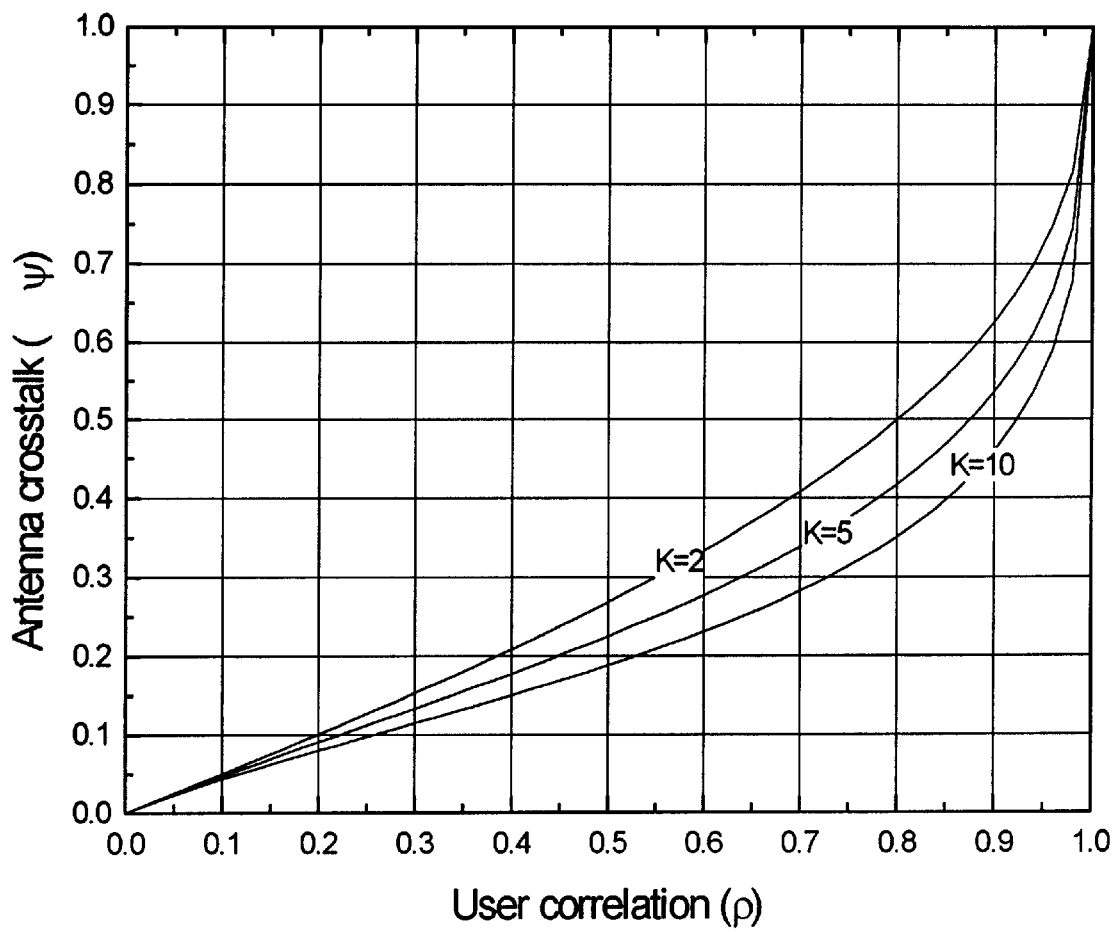
FIG. 59 is an illustration of relationship between crosstalk parameter ($\psi$) and the user correlation parameter ($\rho$)

The simulation arrangement for the following results is similar to that described above for the iterative detection algorithm. Results are presented for two and five users over a K-symmetric channel with a variety of crosstalk parameter values, ψ, values. All simulations use a block size of 500 information bits for each user. Each user uses the same rate ½ constraint length 5 convolutional code with generators [10011] and [11101]. Each user uses a different pseudo-random interleaver, and the same set of interleavers was used for all simulation runs. Each simulation point was tested for the minimum of 1600 errors or 4 million bits. The difference with the diversity simulations occurs in the implementation of the channel and the combining algorithm. In the channel model, both the signal voltage and noise variance are increased by the factor $D_g$. In the combining algorithm, the factor $D_g$ must be appropriately included in the metric calculation (see equation (161)). The simulation results are presented in terms of the parameter ρ. The relationship between ψ and ρ is given by (177) and is illustrated in FIG. 59. This is useful for determining the diversity gain, $D_g$, which is given by (178).

Figure 60:
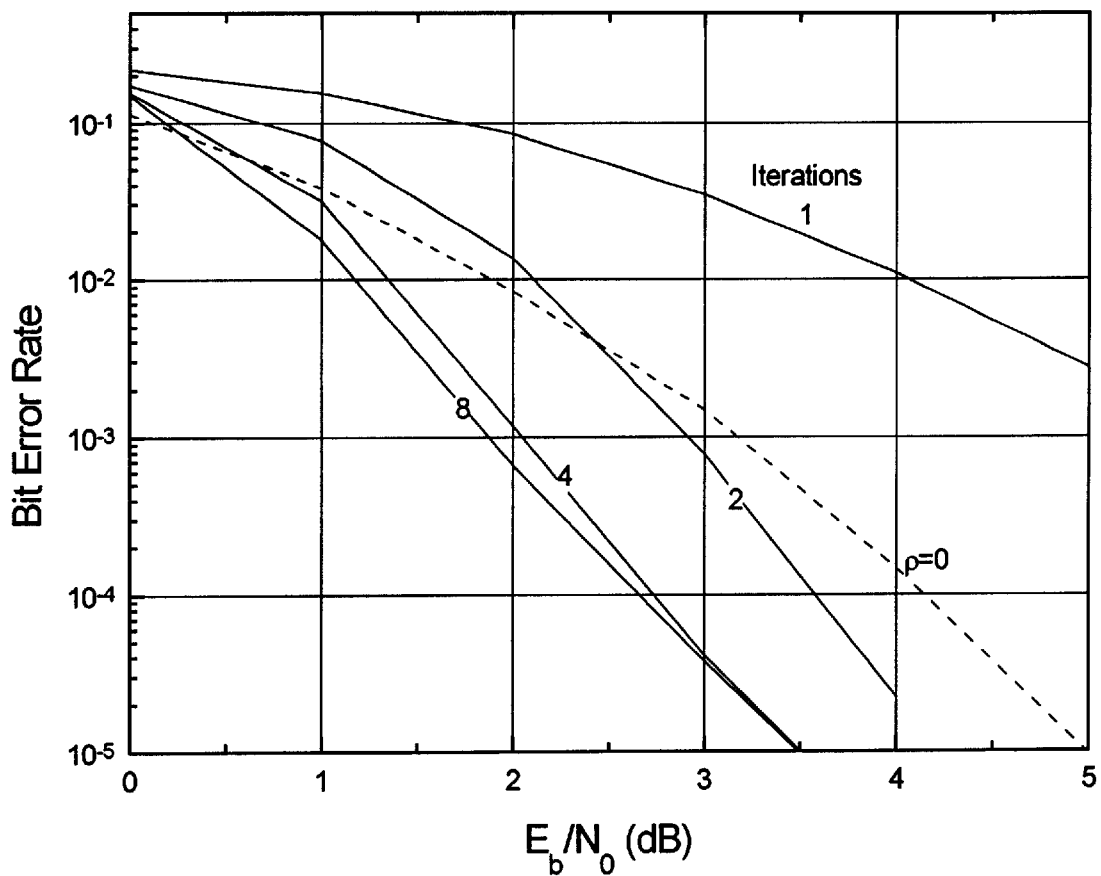
FIG. 60 is a graphical comparison of BER performance of iterative detector with two users and $\rho=0.90$ to ideal single user performance.

Two user results. In FIG. 60 the bit error rate performance of the iterative MCE detector for two users with a ρ=0.90 is shown. For comparison purposes, the single user results, corresponding to a ρ of 0, are included. The horizontal axis represents the single user, no diversity, $E_b/N_0$ ratio.

In the two-user case, performance converges after approximately eight iterations, although convergence is faster at higher signal to noise ratios. At the higher SNRs, a diversity gain relative to single user performance is evident. The theoretical diversity gain is given by (178), which evaluates to $D_g$=1.45 dB in this scenario, and closely matches what is observed in FIG. 60 at high SNR. At lower SNRs, the diversity gain is not as large but the performance still exceeds single user performance at low SNRs.

Figure 61:
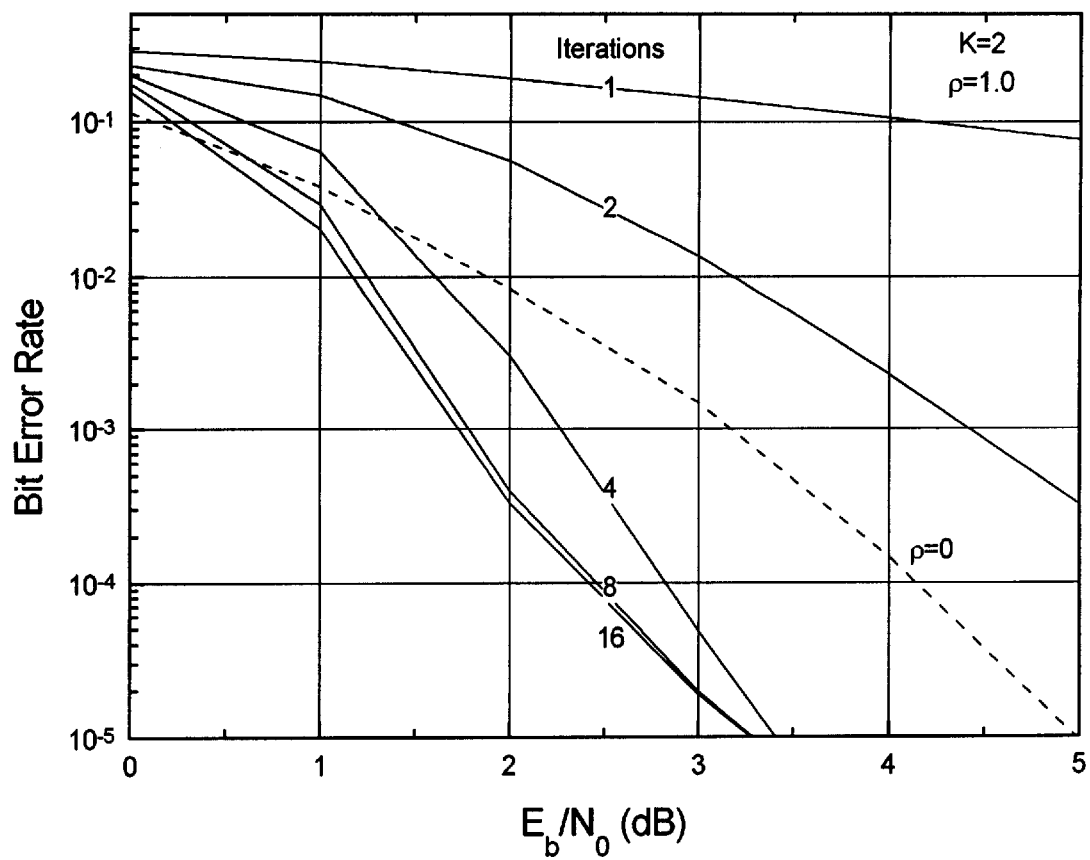
FIG. 61 is a graphical comparison of BER performance of iterative detector with two users and $\rho=1.0$ to ideal single user performance.

In FIG. 61, a simulation of a case of two users with a ρ of 1.0 is shown. This corresponds to the multiple access channel with diversity. Performance with 1, 2, 4, 8 and 16 iterations is shown. Between eight and sixteen iterations there is little improvement. For this scenario the ideal diversity gain is 3 dB. However, as the results indicate, only a gain of 1.75 dB relative to single user performance at a BER of $10^{-5}$ is achieved. From the simulation results it is not clear whether the full 3 dB improvement relative to single user performance is achieved asymptotically.

Figure 62:
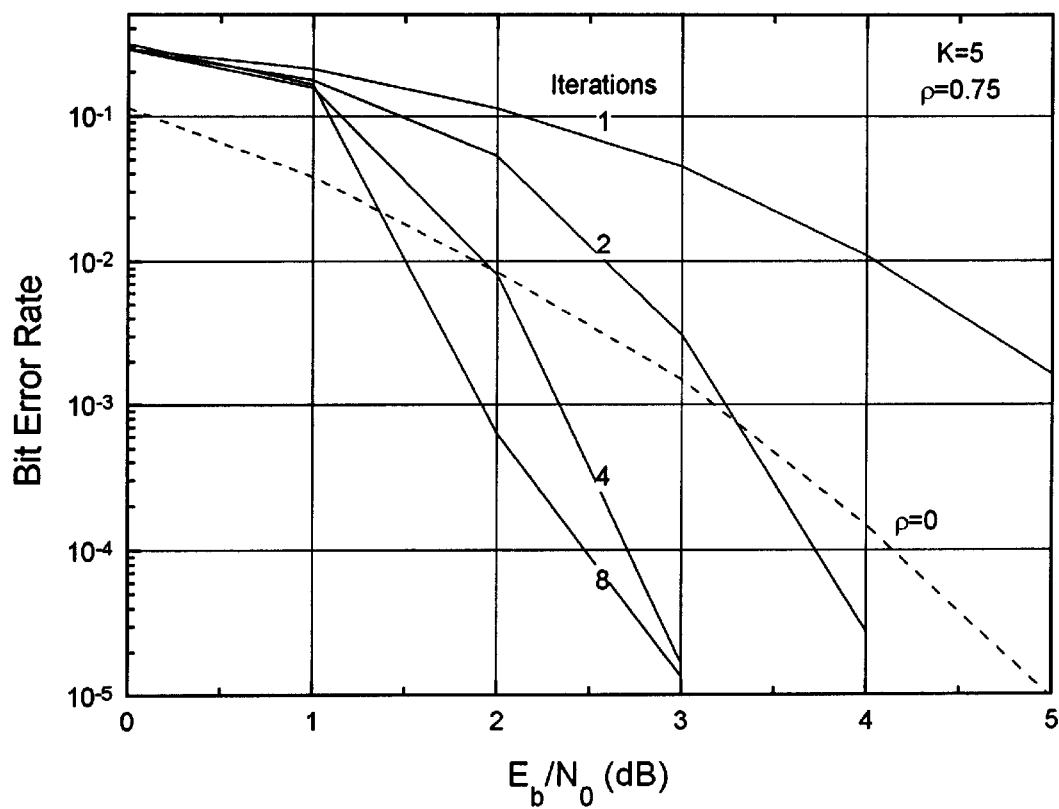
FIG. 62 is a graphical comparison of BER performance of iterative detector with five users and $\rho=0.75$ to ideal single user performance.

Five user results. In FIG. 62, the simulated BER performance with five users and a ρ of 0.75 is shown. Significant diversity gain relative to single user (ρ=0) performance is evident. The theoretical gain in this case is $D_g$=1.95 dB. The gain, relative to a single user that we observe at an error rate of $10^{-5}$ is just slightly less than 2 dB.

Figure 63:
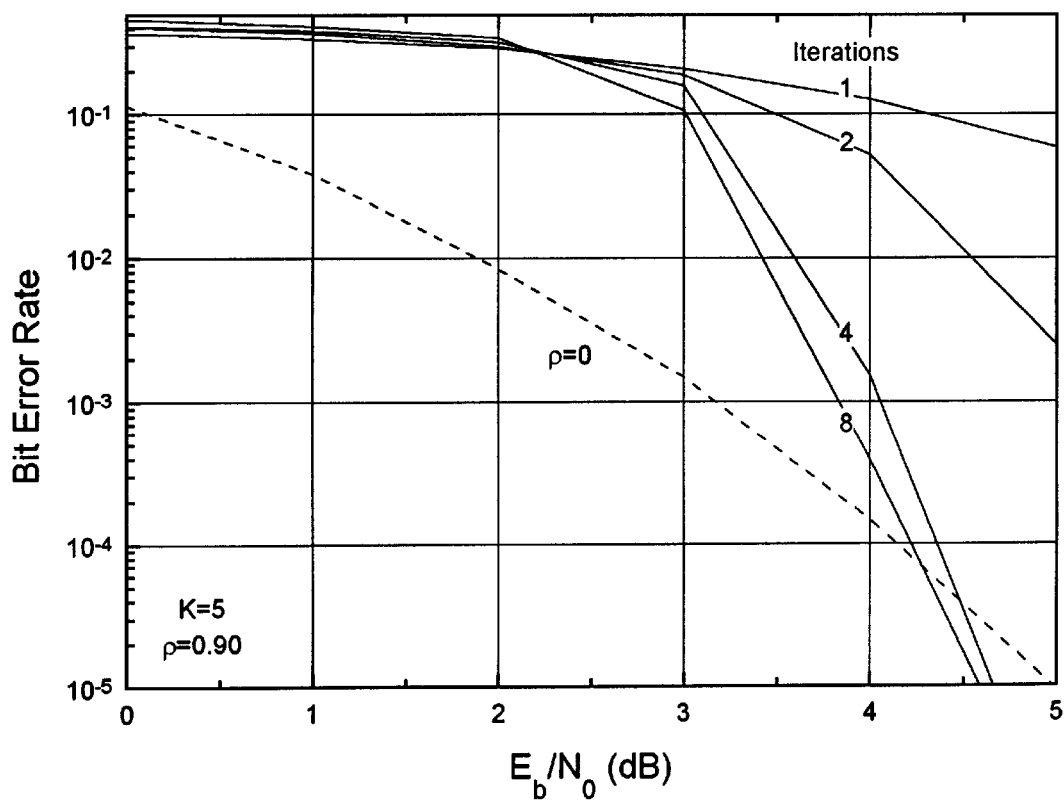
FIG. 63 is a graphical comparison of BER performance of iterative detector with five users and $\rho=0.90$ to ideal single user performance; and, FIG. 64 is a graphical comparison of BER performance of iterative detector with five users and $\rho=1.0$ to ideal single user performance.

In FIG. 63, the simulated BER performance with five users and a ρ of 0.90 is shown. The threshold is at approximately 2.5 dB and above this level performance improves very rapidly. Over the simulated BER range it is not possible to accurately estimate the asymptotic diversity gain relative to single user performance for this case. The theoretical diversity gain is 3.4 dB.

Figure 64:
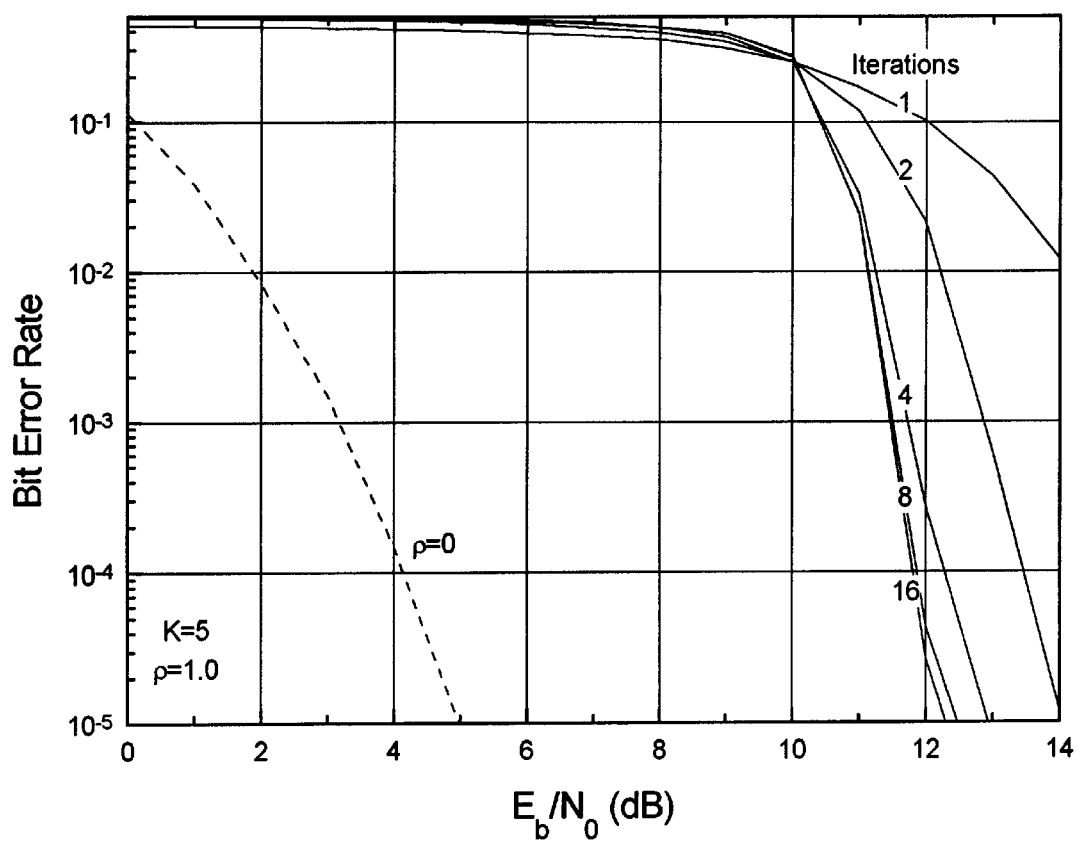

In FIG. 64, the simulated performance with five users and a ρ of 1.0 is shown. This is the theoretical multiple access channel with diversity for five users. The threshold has increased to 10 dB in this case, but above this level performance improves very rapidly.

General observations. In the case of the theoretical multiple access channel (ρ=1), errors of ten occurred in large bursts (10 to 30 errors) at SNRs in the transition region from high bit error rate to low bit error rates. These errors bursts can often be detected by the occurrence of inconsistencies in the BCJR decoding algorithm. An inconsistency or error burst which occurs on one iteration often disappears on subsequent iterations. The bit error rate does not always improve from one iteration to the next; at low bit error rates there may be some oscillation between different values.

The correlation value ρ=1 implies the cross-correlation matrix H is singular. This does not cause a problem in generating the matched filter outputs. However, the detection algorithm assumes H is non-singular and thus modifications are required there. In practice, to avoid these modifications, the detector assumes that the correlation parameter is never greater than 0.99, even though the true correlation parameter could be as large as 1.0.

The results obtained in the example with diversity confirm observed behaviour in the non-diversity case.

Theorem 4.1. Capacity of the K-symmetric channel with diversity. The theoretical capacity of the K-symmetric channel is given by $$C(\gamma) = \frac{K-1}{2}\log_2[1 + D_g(1-\rho)\gamma] + \frac{1}{2}\log_2[1 + D_g(1+(K-1)\rho)\gamma]. \quad (179)$$

As $\rho \to 0$, then $$C(\gamma) \xrightarrow{\rho \to 0} \frac{K}{2}\log_2(1+\gamma) \quad (180)$$

that is, K times the capacity of the single user channel. As $\rho \to 1$, the theoretical capacity approaches $$C(\gamma) \xrightarrow{\rho \to 1} \frac{1}{2}\log_2(1 + K^2\gamma). \quad (181)$$

The factor $K^2$ is due to combination of the K users' power plus a diversity gain of K.

Figure 65:
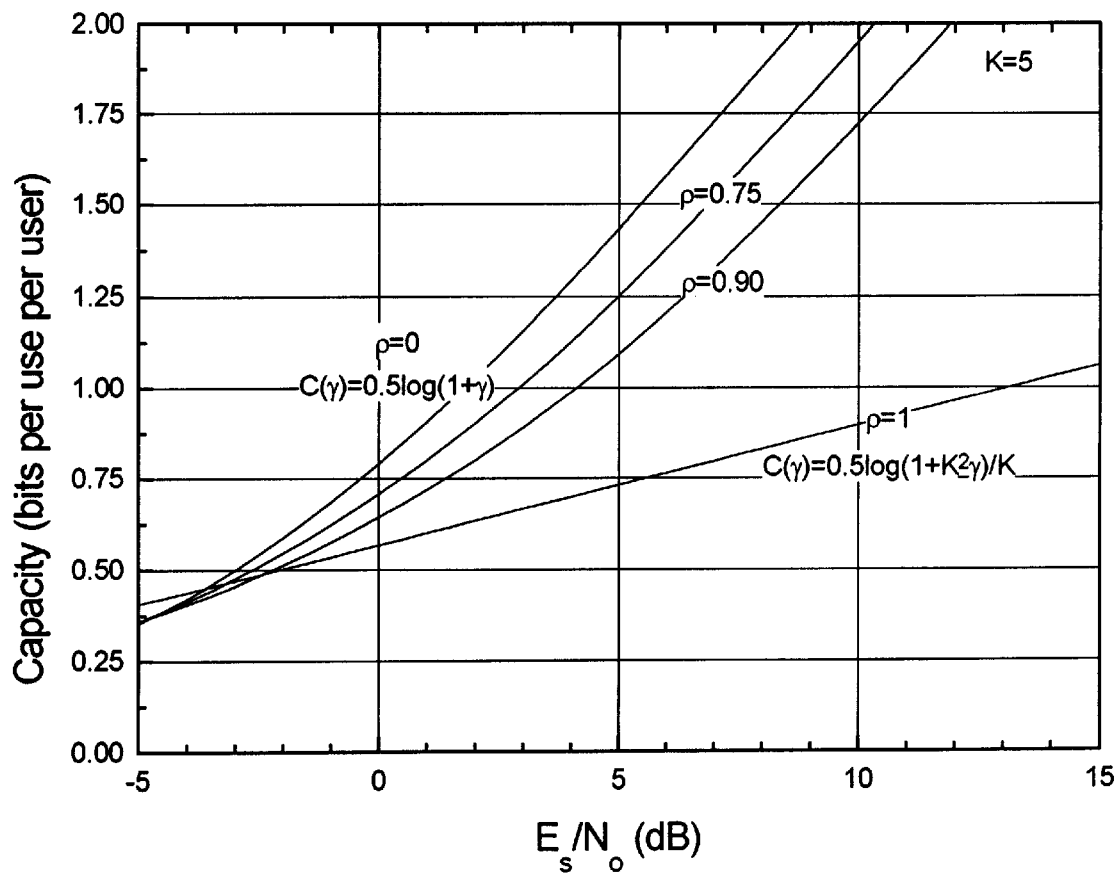
FIG. 65 is a simplified diagram of theoretical capacity of K-symmetric channel with diversity for different correlation values and five users, in bits per channel use per user.

Shown in FIG. 65 is the theoretical capacity of the K-symmetric channel with diversity for five users. As one observes, the capacity decreases as the correlation parameter ($\rho$) increases at least for $E_b/N_0$ ratios above 0 dB. The capacity is clearly much greater than in the non-diversity case.

The decrease in capacity from $\rho=0.90$ to $\rho=1$ is significantly larger than the decrease from $\rho=0$ to $\rho=0.90$. Combine this observation with the observations that i) the threshold SNR increases as the $\rho$ value increases and ii) capacity increases with SNR, supports the conjecture that the threshold is dependent upon capacity considerations.

The diversity performance curves appear as shifted versions of the corresponding non-diversity results. The same is true of the theoretical capacity of the K-symmetric diversity channel relative to the non-diversity channel. However, when there is even a marginal improvement from the first iteration to the second, the algorithm can bootstrap itself and achieve single user performance.

Of course, numerous other embodiments other than those described heretofore may be envisaged, without departing from the spirit and scope of the invention.

What is claimed is:

1. A method of detecting a plurality of digital signals that are forward error correction encoded and mutually interfere comprising the steps of:
    (a) using a detector, detecting the plurality of digital signals and providing detector estimates of a first digital signal and second other digital signal from the plurality of digital signals;
    b) (i) using a processor receiving the detector estimates and calculating a reliability estimate for each data element of first digital signal from the plurality of digital signals, the reliability estimate calculated from detector estimates of those data elements, a model of the interference, and a priori information determined in previous iterations, if any, concerning those data elements;
        (ii) using a processor, calculating a reliability estimate for each data element of a second other digital signal from the plurality of digital signals, the reliability estimate calculated from detector estimates of those data elements, a model of the interference, and a priori information determined in previous iterations, if any, concerning those data elements;
    c) using the processor, calculating a revised reliability estimate for each data element in dependence upon the reliability estimates from the step (b) and the properties of the forward error correction code for the corresponding digital signal; and
    d) repeating the previous two steps, one or more times, using the revised reliability estimates provided by step (c) as a priori information for the step (b).

2. A method as defined claim 1 wherein during the first step (a), the processor uses only a subset of data when calculating the reliability estimates.

3. A method as defined in claim 1 wherein during the second step (b), the processor uses only a subset of the data when calculating the revised reliability estimates.

4. The method as defined in claim 1 wherein the first and second steps (a) and (b) provide reliability estimates for a subset of the K digital signals.

5. A method as defined in claim 1, wherein step (b) comprises the step of using a soft-output decoder, performing soft-output decoding.

6. A method as defined in claim 5 where the step of soft-output decoding is implemented for a plurality of digital signals using a single soft-output decoder.

7. A method as defined in claim 5 wherein the step of soft-output decoding is applied to a subset of K digital signals.

8. A method as defined in claim 5 where the step of soft-output decoding is implemented in parallel for each of a plurality of digital signals.

9. A method as defined in claim 1 comprising the step of:
    receiving a plurality of substantially similar digital signals from a plurality of receivers;
    wherein the detector detects data elements within at least two of the received digital signals and provides the preliminary estimates of those signals; and,
    wherein the steps (a)(i) and (ii) are performed in dependence upon the plurality of substantially similar digital signals from a plurality of receivers.

10. The method as defined in claim 1 including the step of outputting information content of one or more of the digital signals.

11. A method of detecting a plurality of digital signals that are forward error correction encoded and mutually interfere comprising the steps of:
    a) providing preliminary estimates of the plurality of detected digital signals to a processor;
    b) using the processor, calculating a reliability estimate for each data element of each digital signal from preliminary estimates of those data elements, a model of the interference, and a priori information, if any, concerning those data elements;
    c) using the processor, calculating a revised reliability estimate for each data element in dependence upon the reliability estimates from the step (b) and the properties of the forward error correction code for the corresponding digital signal; and,
    d) providing corrected estimates of each of the plurality of digital signals, the corrected estimates corrected from the preliminary estimates based on the calculated and revised reliability estimates.

12. A method of detecting as defined in claim 11 comprising the step of repeating steps (b) and (c) one or more times, using the revised reliability estimates provided by the step (c) as a priori information for step (b).

13. A method as defined in claim 12, wherein step (c) comprises the step of soft-output decoding.

14. The method as defined in claim 12 including the step of using a detector, detecting the plurality of digital signals and providing detector estimates of a first digital signal and second other digital signal from the plurality of digital signals.

15. A system for detecting a plurality of digital signals that are forward error correction encoded and mutually interfere, given preliminary estimates of those signals, comprising:

a processor having an input and an output, the processor comprising:

means for calculating a reliability estimate for each data element of at least two different digital signal from the plurality of digital signals in dependence upon the preliminary estimates of those data elements, a statistical model of the interference, and a priori information, if any, concerning those data elements; and, means for calculating a revised reliability estimate for each data element based on the reliability estimates calculated and the properties of the forward error correction code for the corresponding digital signal; and, means for providing corrected estimates of the data elements of each of the first and second digital signals, the corrected estimates corrected based on the calculated and revised reliability estimates.

16. A system of detecting a plurality of digital signals as defined in claim 15, including a suitably programmed processing means for performing said calculations.

17. A system as defined in claim 16 including feed back means for providing feedback from the output to the input.

18. A system as defined in claim 15 including output means for outputting information content of one or more of the digital signals.

19. A system as defined in claim 15 comprising:

a plurality of transmitters for transmitting data signals via a common communications channel;

a model of mutual interference between signals transmitted from the transmitters from the plurality of transmitters; and, a plurality of detectors for detecting mutually interfering digital data signals and for providing the detector estimates of those signals to the processor.

* * * * *